(12) United States Patent
Vellianitis et al.

(10) Patent No.: US 12,363,970 B2
(45) Date of Patent: Jul. 15, 2025

(54) GERMANIUM TIN OXIDE-CONTAINING SEMICONDUCTOR DEVICE AND METHODS FOR FORMING THE SAME

(71) Applicant: Taiwan Semiconductor Manufacturing Company Limited, Hsinchu (TW)

(72) Inventors: Georgios Vellianitis, Heverlee (BE); Oreste Madia, Hsinchu (TW); Gerben Doornbos, Kessel-Lo (BE); Marcus Johannes Henricus Van Dal, Linden (BE)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 495 days.

(21) Appl. No.: 17/739,795

(22) Filed: May 9, 2022

(65) Prior Publication Data
US 2023/0261060 A1   Aug. 17, 2023

Related U.S. Application Data

(60) Provisional application No. 63/310,291, filed on Feb. 15, 2022.

(51) Int. Cl.
H10D 62/80 (2025.01)
H01L 21/02 (2006.01)
(Continued)

(52) U.S. Cl.
CPC ....... *H10D 62/80* (2025.01); *H01L 21/02565* (2013.01); *H01L 21/02614* (2013.01);
(Continued)

(58) Field of Classification Search
CPC ............. H01L 29/24; H01L 27/1207; H01L 21/02565; H10B 63/10; H10B 61/22;
(Continued)

(56) References Cited

U.S. PATENT DOCUMENTS

2005/0199881 A1   9/2005  Hoffman et al.
2010/0181565 A1   7/2010  Sakata et al.
(Continued)

FOREIGN PATENT DOCUMENTS

JP   2007529118 A   10/2007
JP   2010186994 A   8/2010
(Continued)

OTHER PUBLICATIONS

Yu, Jun, et al., "Design of p-type transparent conducting oxides Sn2GeO4 by an ab initio evolutionary structure search", Journal of Materials Chemistry C, vol. 6, pp. 11202-11208 (Year: 2018).*
(Continued)

*Primary Examiner* — Fernando L Toledo
*Assistant Examiner* — Ryan T. Fortin
(74) *Attorney, Agent, or Firm* — The Marbury Law Group, PLLC

(57) ABSTRACT

A field effect transistor may include an active layer containing an oxide compound material of at least two atomic elements including a first element of tin and a second element selected from Ge, Si, P, S, F, Ti, Cs, and Na and located over a substrate. The field effect transistor may further include a gate dielectric located on the active layer, a gate electrode located on the gate dielectric, and a source contact structure and a drain contact structure contacting a respective portion of the active layer. The oxide compound material may include at least germanium and tin. The oxide compound semiconductor material may be used as a p-type semiconductor material in BEOL structures.

20 Claims, 45 Drawing Sheets

(51) Int. Cl.
*H10B 61/00* (2023.01)
*H10D 30/67* (2025.01)
*H10D 99/00* (2025.01)

(52) U.S. Cl.
CPC ......... *H10B 61/22* (2023.02); *H10D 30/6755* (2025.01); *H10D 99/00* (2025.01)

(58) Field of Classification Search
CPC .. H10N 70/826; H10D 30/6755; H10D 62/80; H10D 84/0167; H10D 87/00; H10D 99/00
See application file for complete search history.

(56) References Cited

U.S. PATENT DOCUMENTS

| | | |
|---|---|---|
| 2011/0057918 A1 | 2/2011 | Kimura et al. |
| 2013/0082263 A1* | 4/2013 | Honda ................. H10D 30/673 257/66 |
| 2013/0200361 A1* | 8/2013 | Tsang ................ H01L 29/78696 257/E29.296 |
| 2016/0204070 A1* | 7/2016 | Wu .................... H10D 86/0212 257/43 |
| 2018/0190683 A1 | 7/2018 | Koo |
| 2019/0043997 A1 | 2/2019 | Lee |
| 2020/0075768 A1 | 3/2020 | Ueda et al. |
| 2020/0185532 A1 | 6/2020 | Lin et al. |
| 2021/0376089 A1 | 12/2021 | Vellianitis et al. |
| 2021/0391003 A1* | 12/2021 | Chiang ............... G11C 11/4097 |
| 2021/0408049 A1* | 12/2021 | Young ................... H10B 53/20 |
| 2022/0115503 A1* | 4/2022 | Cho ........................ H01L 29/24 |

FOREIGN PATENT DOCUMENTS

| | | |
|---|---|---|
| JP | 2011076079 | 1/2011 |
| JP | 2012227525 A | 11/2012 |

OTHER PUBLICATIONS

Yang, Jianwen, et al., "Effects of silicon doping on the performance of tin oxide thin film transistors", Physica Status Solidi A, vol. 213 (4), pp. 1010-1015 (Year: 2016).*

Zhou, Jumei, et al., "Flexible Transparent Junctionless TFTs With Oxygen-Tuned Indium-Zinc-Oxide Channels", IEEE Electronic Device Letters, vol. 34 (7), pp. 888-890 (Year: 2013).*

Lim, Keon-Hee, et al., "UV-Visible Spectroscopic Analysis of Electrical Properties in Alkali Metal-Doped Amorphous Zinc Tin Oxide Thin-Film Transistors", Advanced Materials, vol. 25, pp. 2994-3000 (Year: 2013).*

Jenifer, K., et al., "A Review on the Recent Advancements in Tin Oxide-Based Thin-Film Transistors for Large-Area Electronics", Journal of Electronic Materials, vol. 49, iss. 12, pp. 7098-7111 (Year: 2020).*

Lee, Won-Yong, et al., "Improved negative bias stability of sol-gel processed Ti-doped SnO2 thin-film transistors", Semiconductor Science and Technology, vol. 35, pp. 115023-1-115023-6 (Year: 2020).*

Mude, Narendra Naik, et al., "High Performance of Solution-Processed Amorphous p-Channel Copper-Tin-Sulfur-Gallium Oxide Thin-Film Transistors by UV/O3 Photocuring", ACS Applied Materials and Interfaces, vol. 13, pp. 20277-20287 (Year: 2021).*

Yang, Hui, et al., "Enchancement-mode thin film transistor using amorphous phosphorus-doped Indium-Zinc-Tin-Oxide channel layer", Materials Science in Semiconductor Processing, vol. 137, pp. 106228-1-106228-5 (Year: 2022).*

Taiwan Patent and Trademark Office; Jianq Chyun Intellectual Property Office; TW Application No. 111146734; Office Action mailed Jul. 5, 2023; 6 pages.

Jianq Chyun Intellectual Property Office; JP Application No. 2023-000016; Office Action mailed Mar. 5, 2024; 10 pages.

* cited by examiner

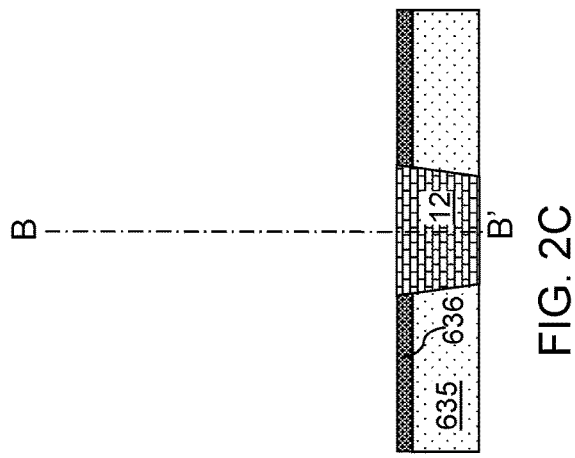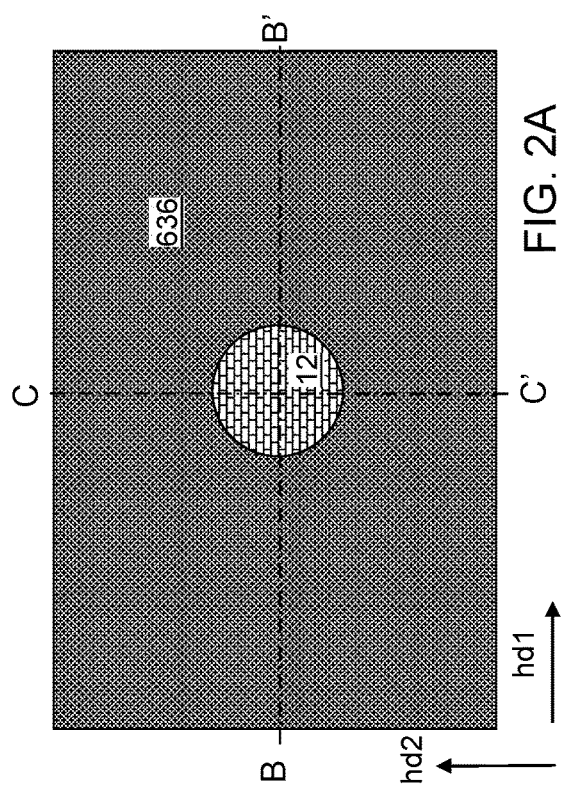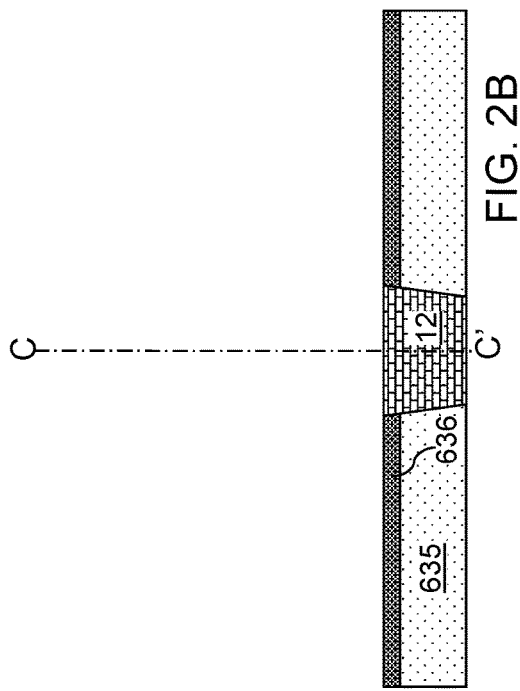

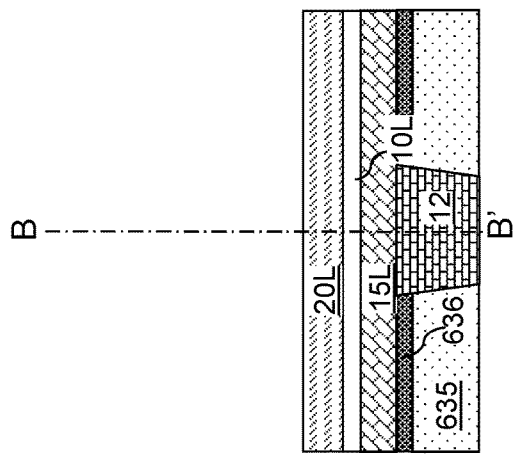
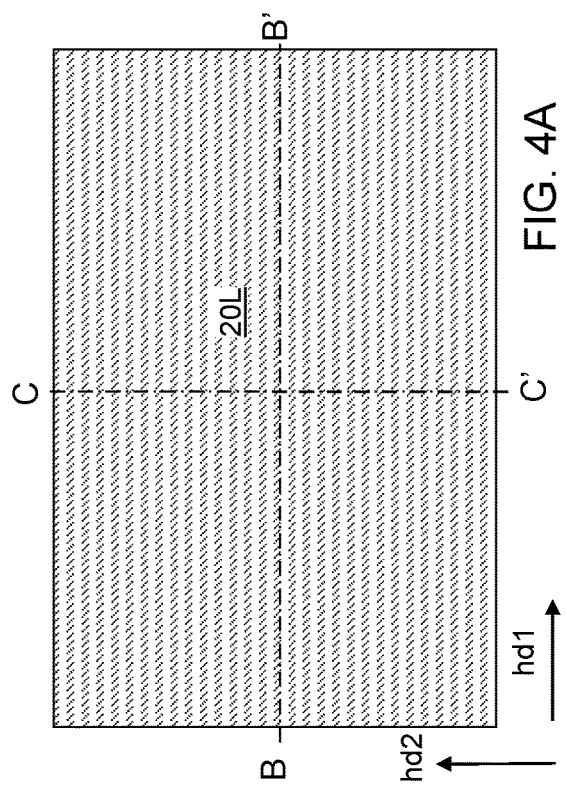
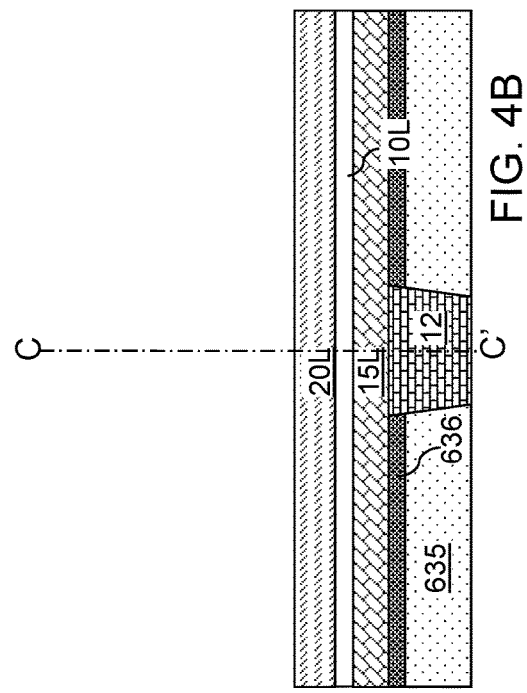
FIG. 4A
FIG. 4B
FIG. 4C

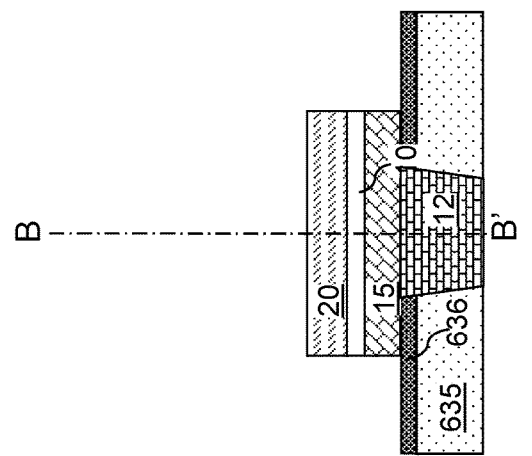
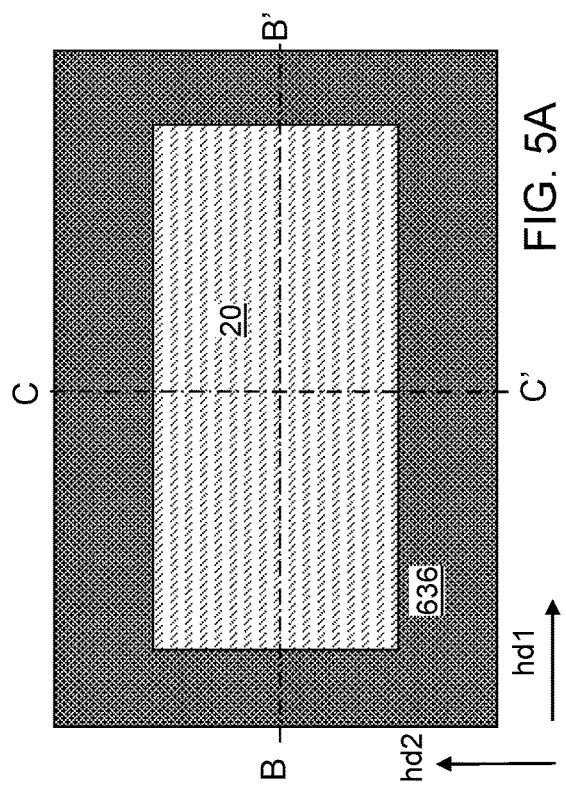
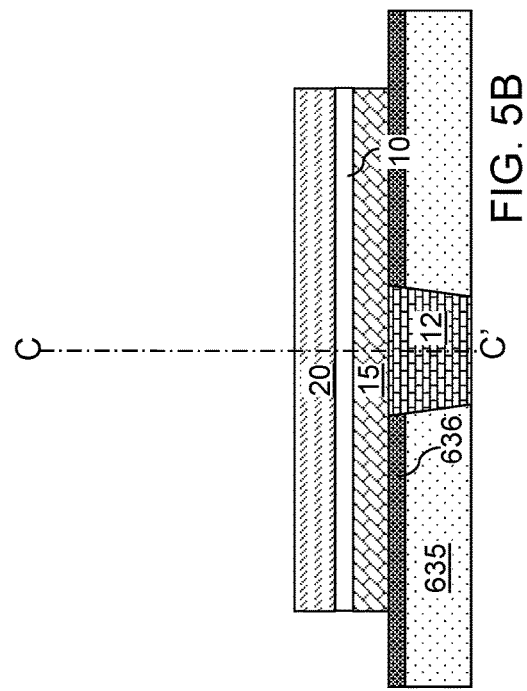
FIG. 5A
FIG. 5B
FIG. 5C

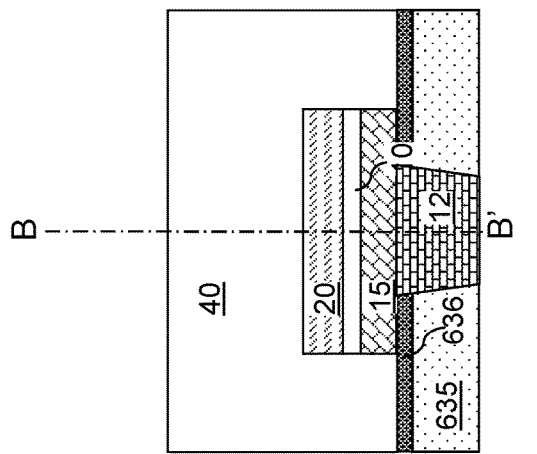
FIG. 8C
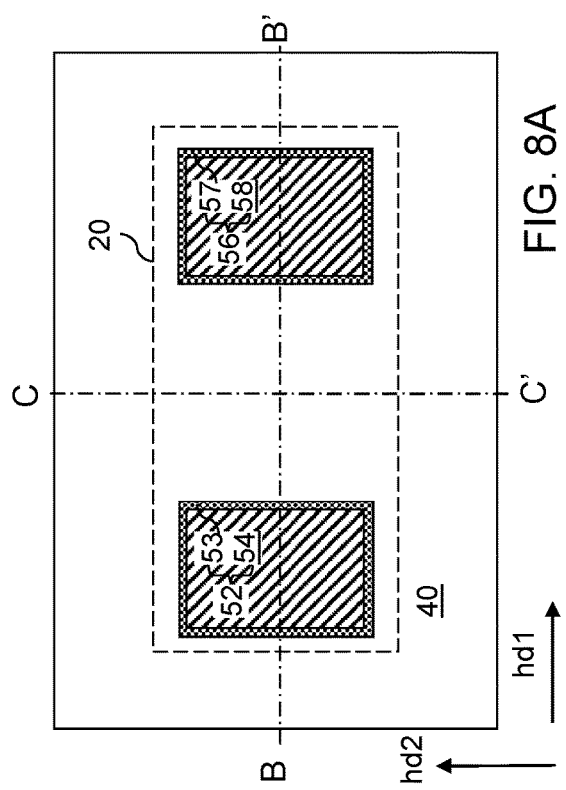
FIG. 8A
FIG. 8B

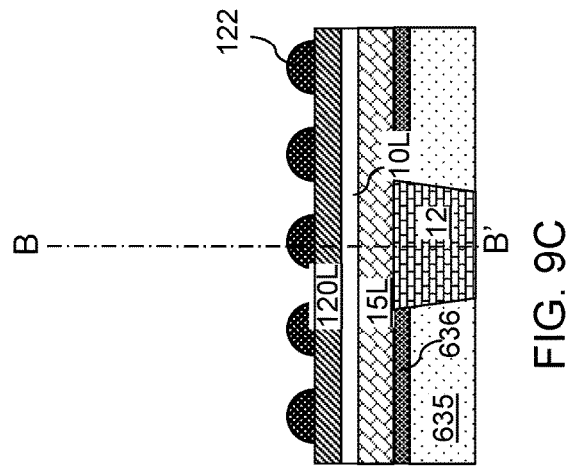
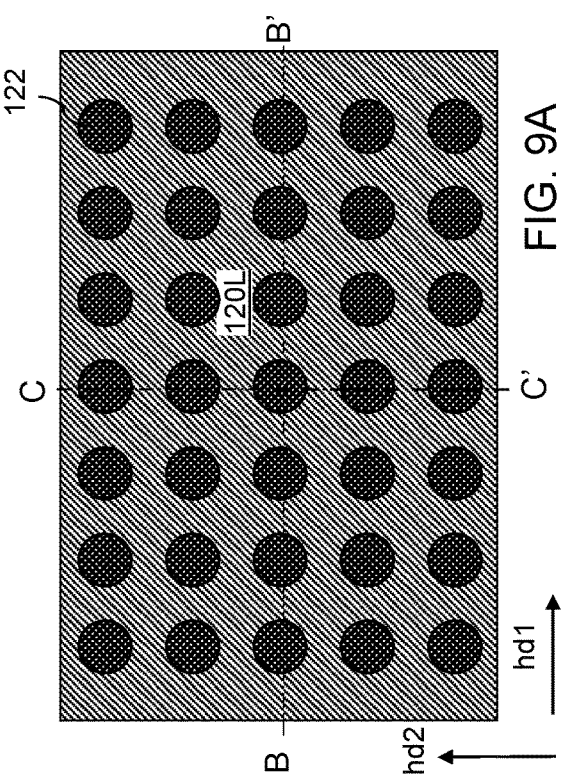
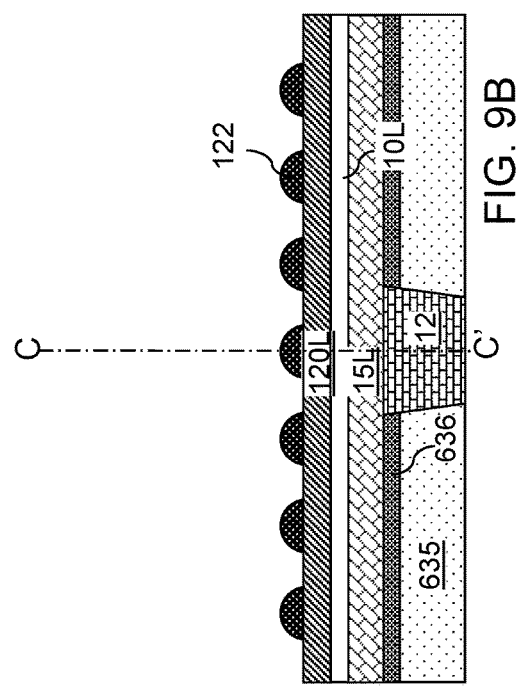
FIG. 9A
FIG. 9B
FIG. 9C

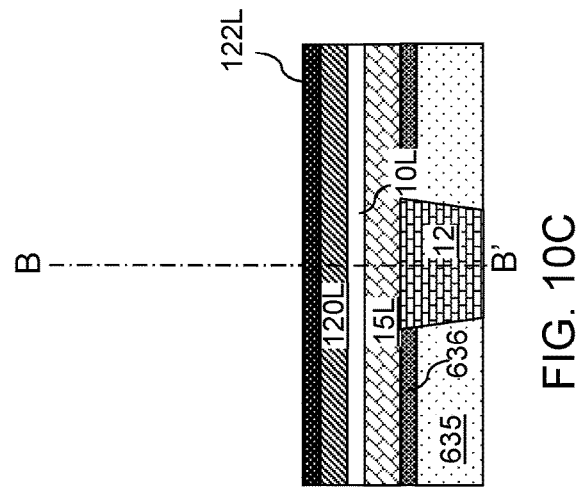
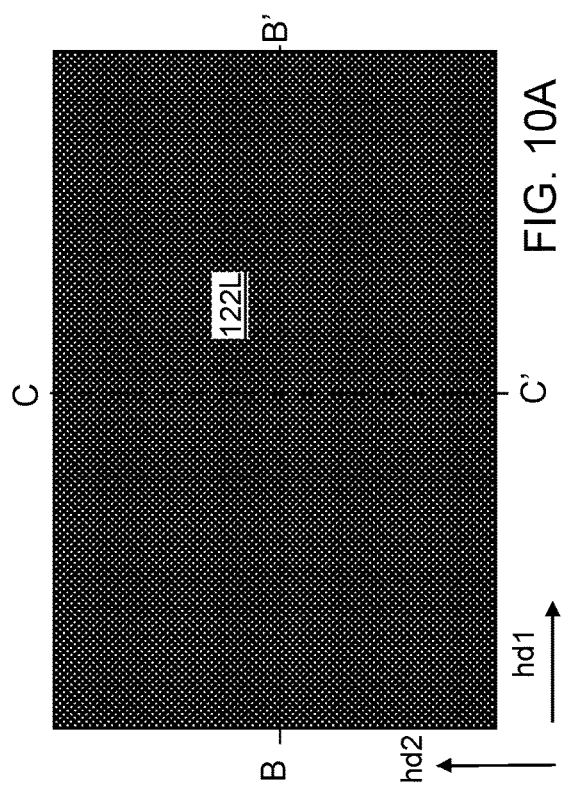
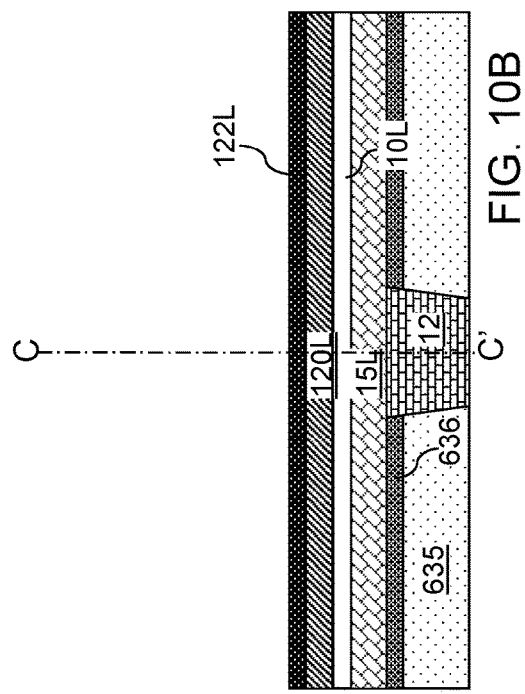
FIG. 10A
FIG. 10B
FIG. 10C

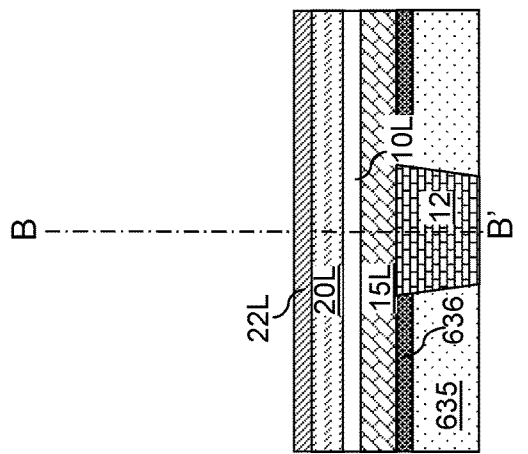
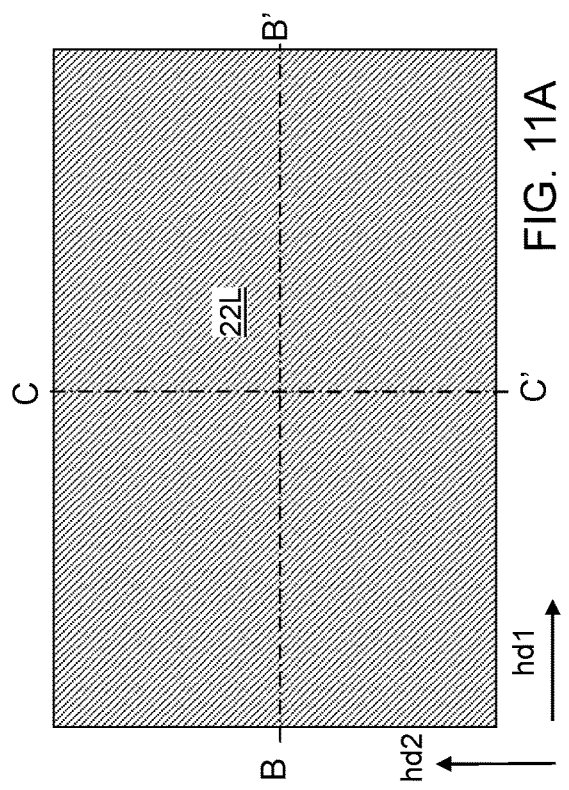
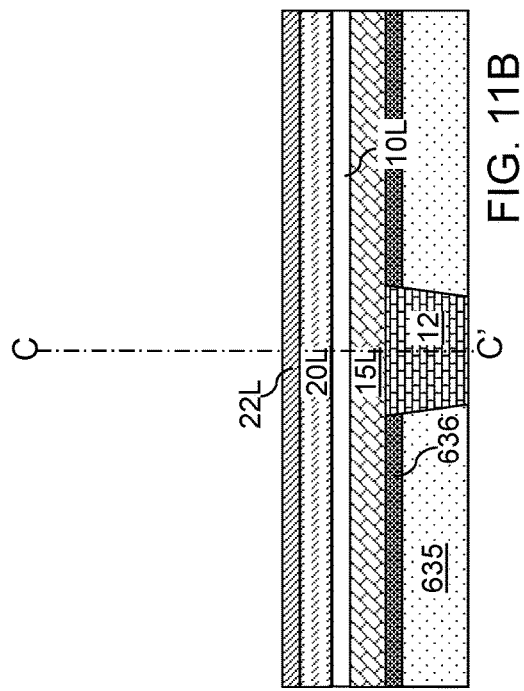
FIG. 11A
FIG. 11B
FIG. 11C

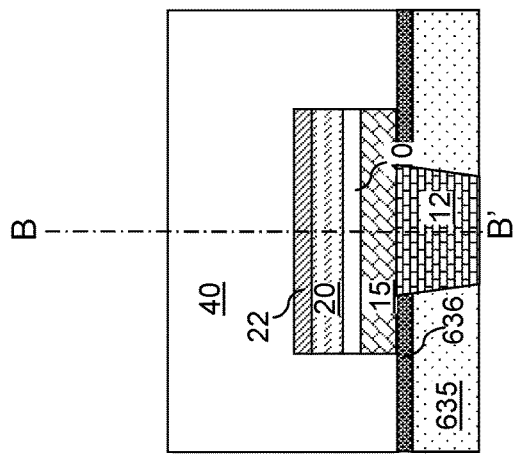
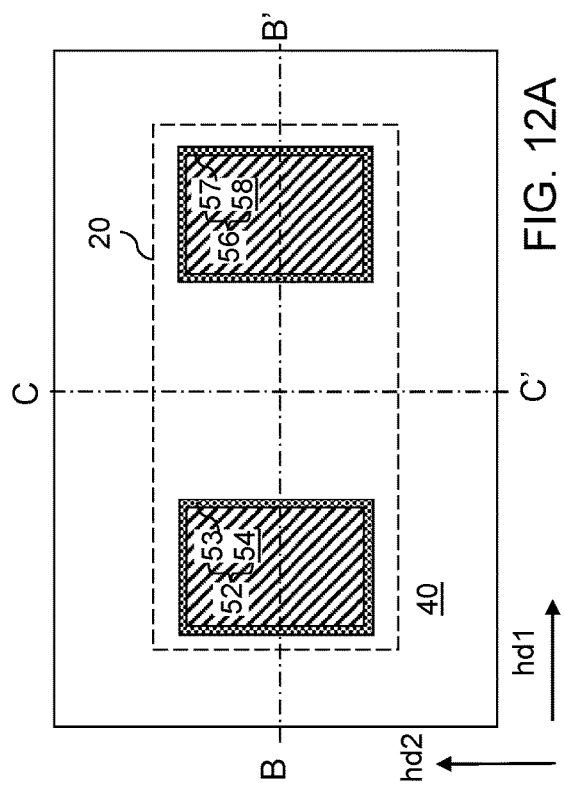
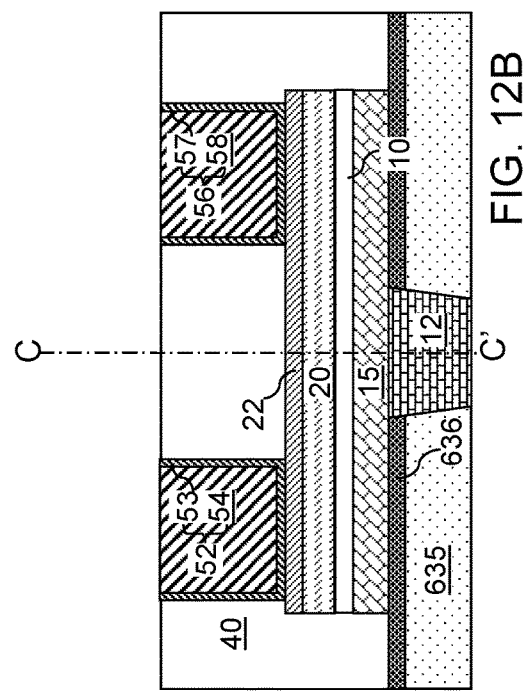
FIG. 12A
FIG. 12B
FIG. 12C

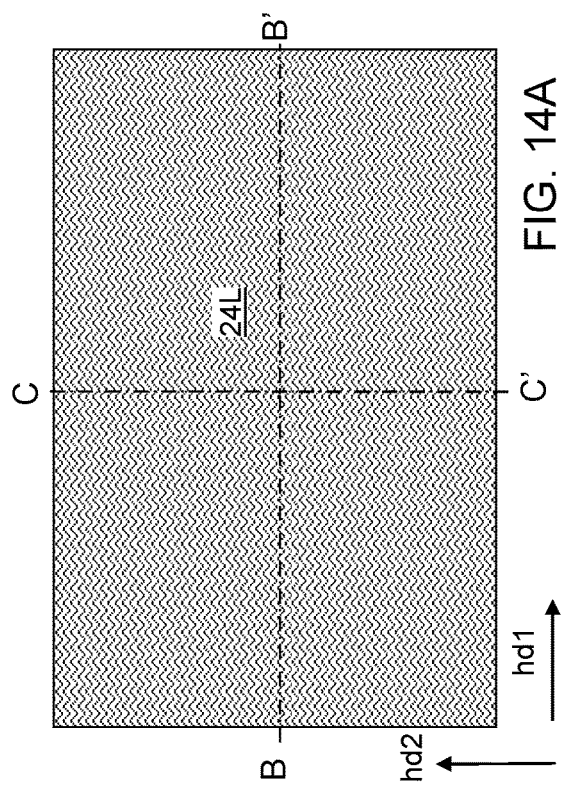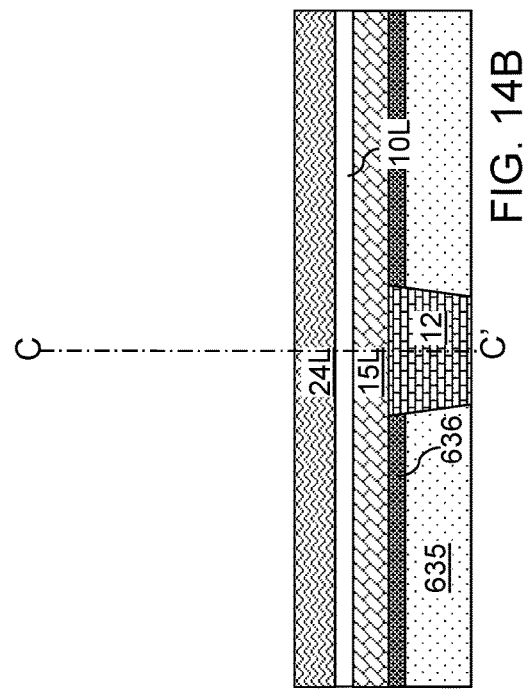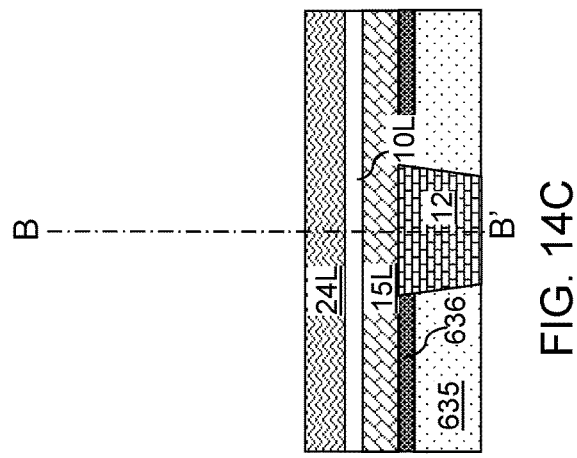

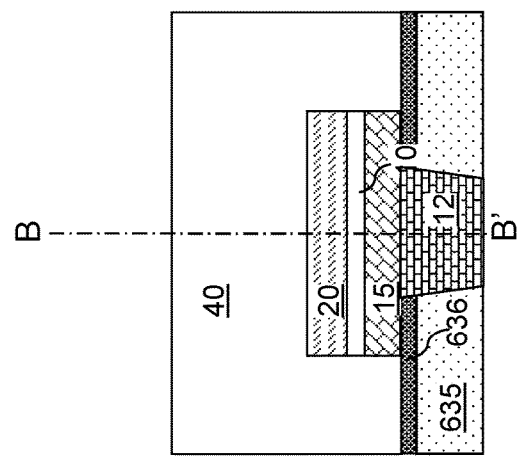
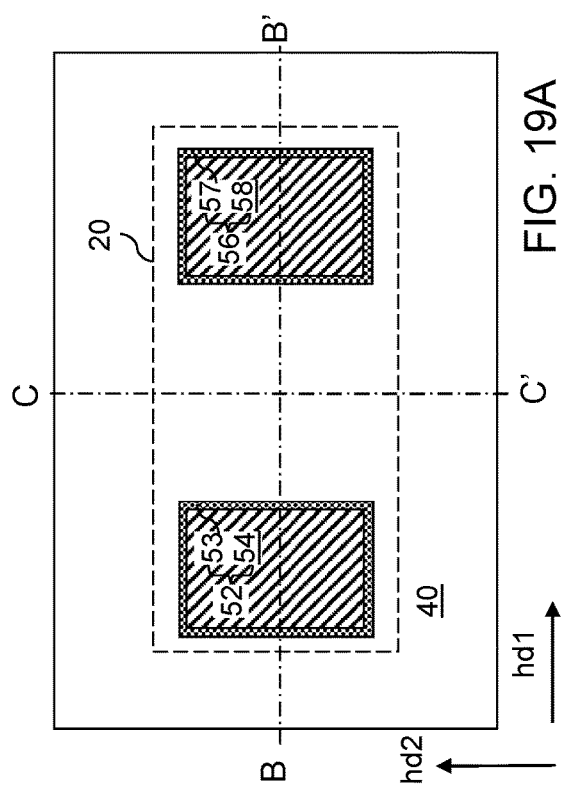
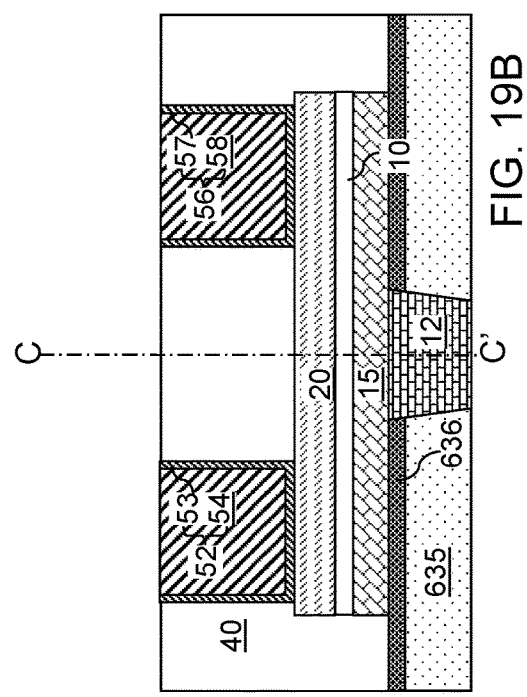

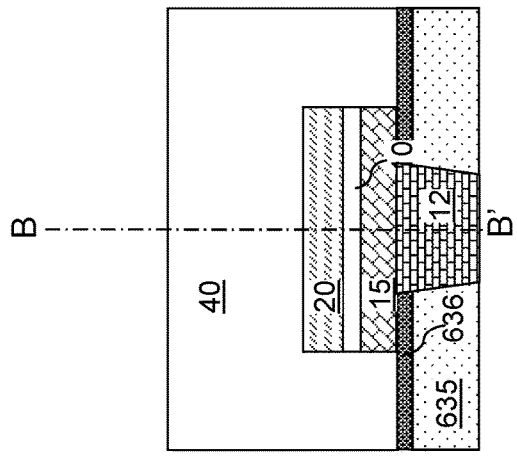
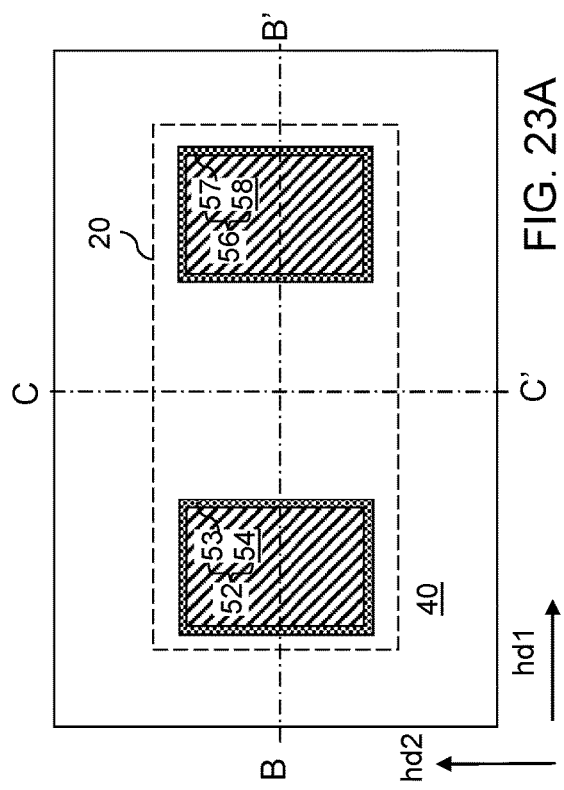
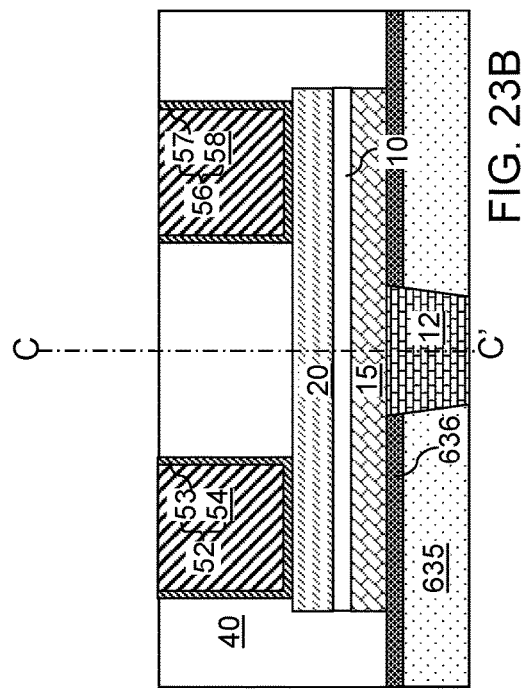
FIG. 23A
FIG. 23B
FIG. 23C

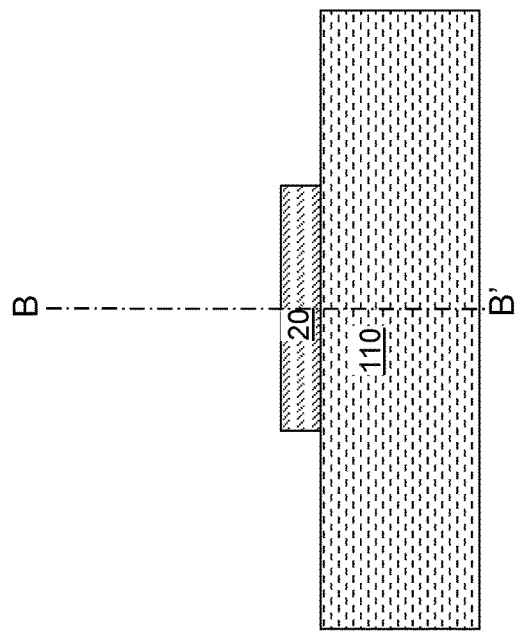
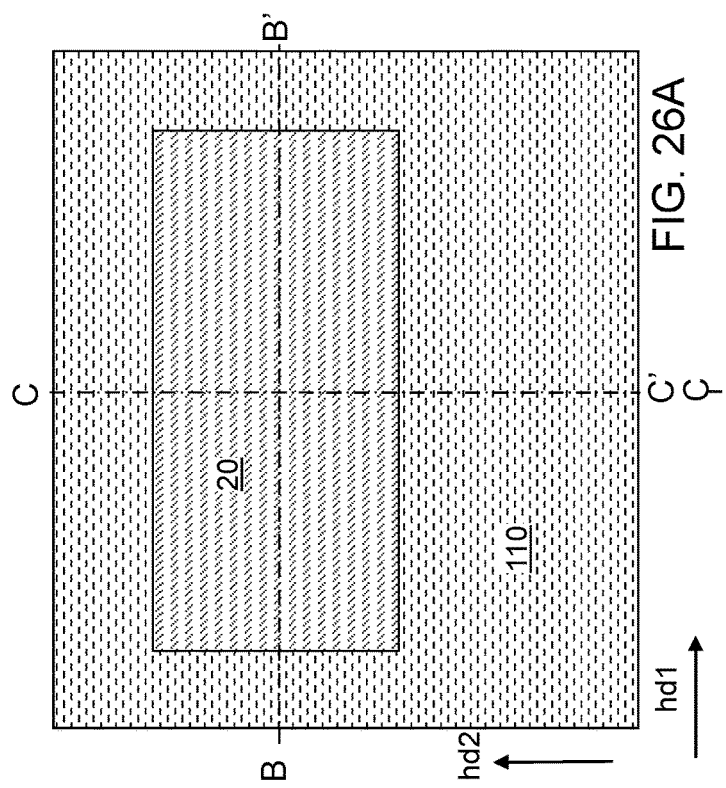
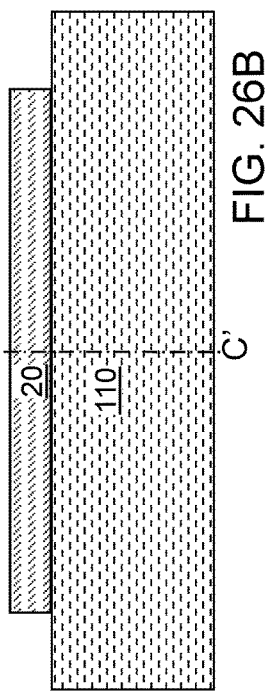

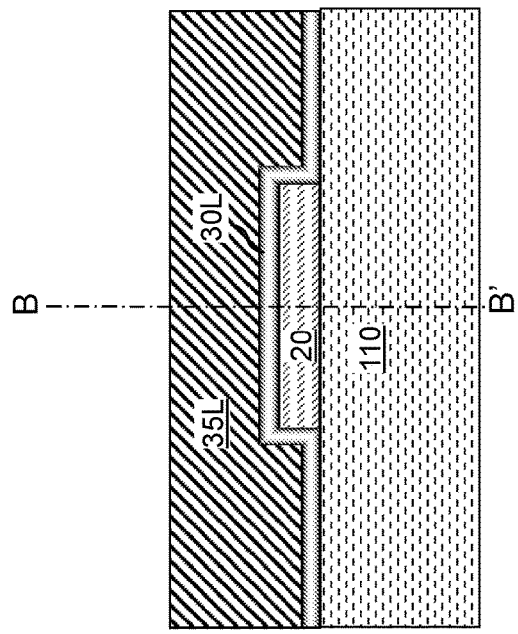
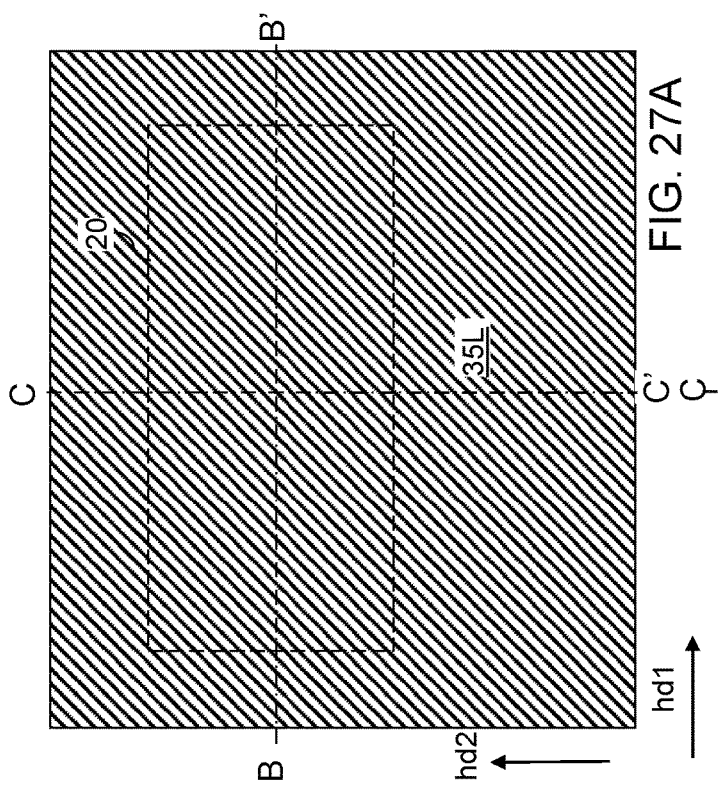
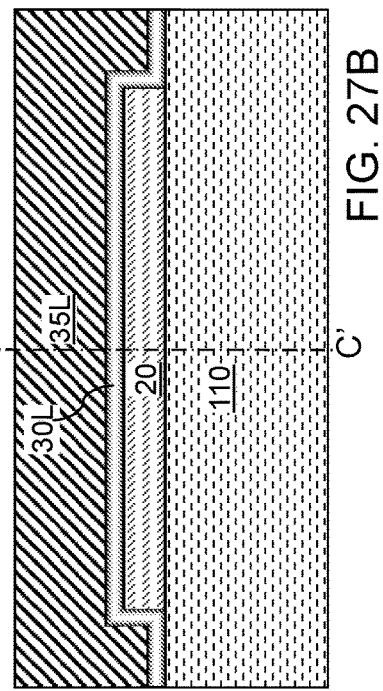
FIG. 27A
FIG. 27B
FIG. 27C

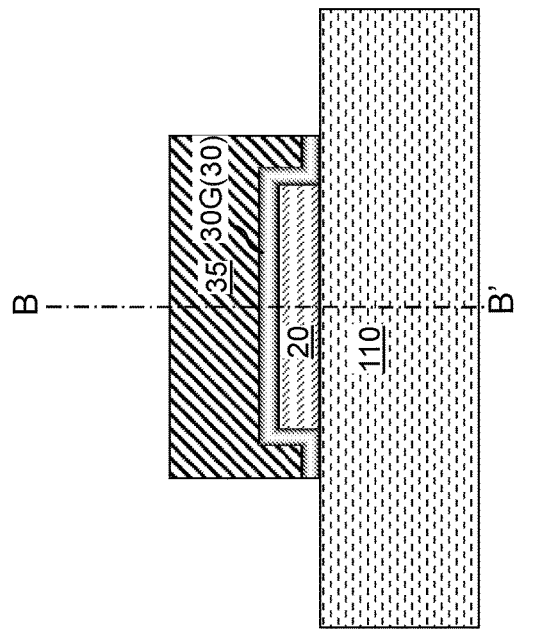
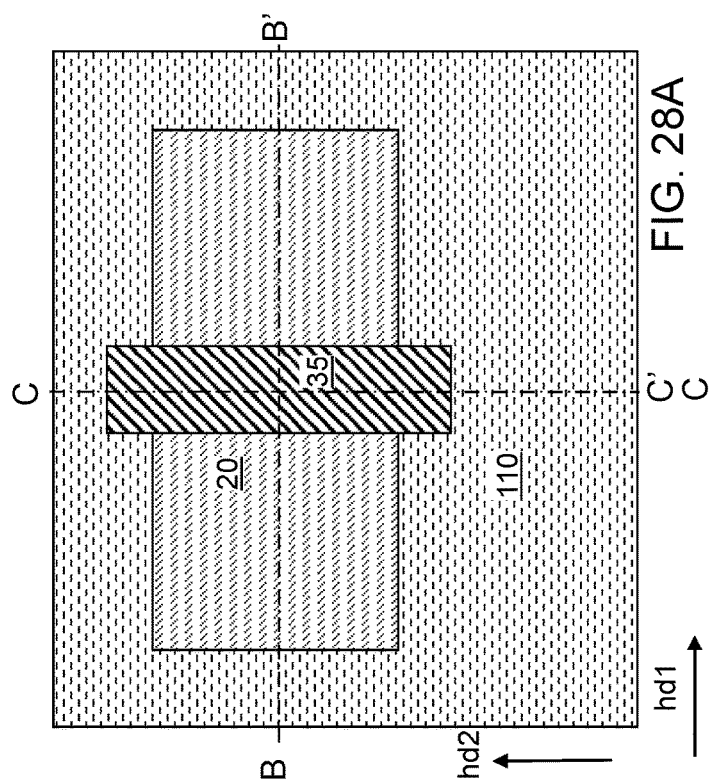
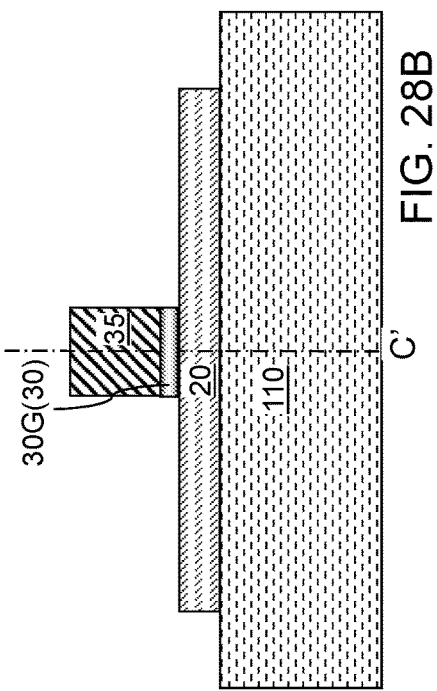
FIG. 28A
FIG. 28B
FIG. 28C

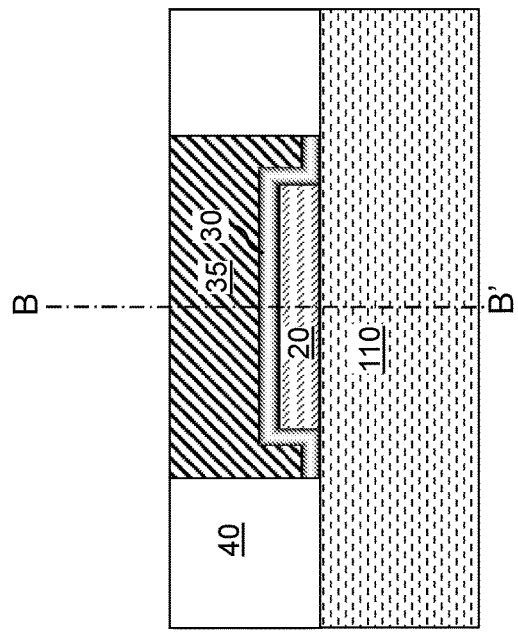
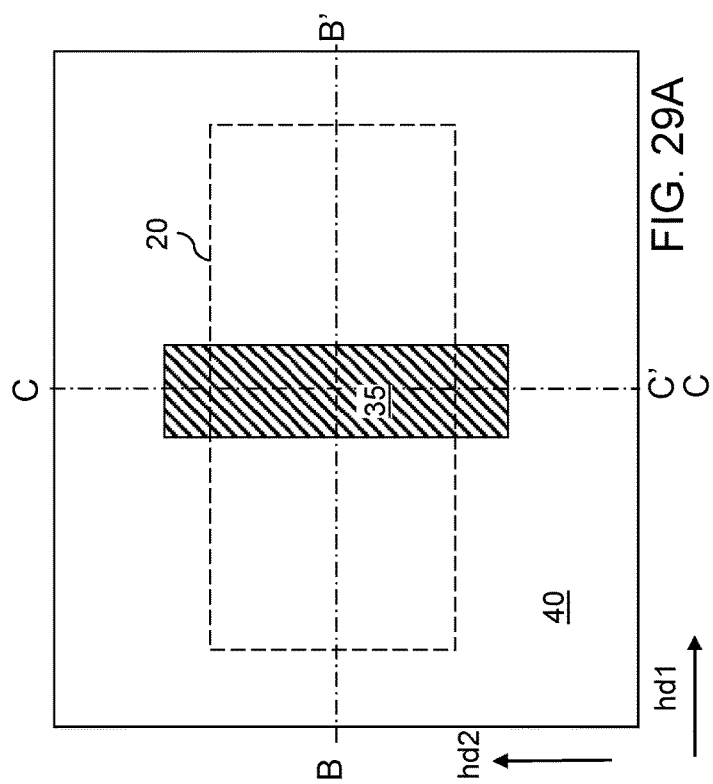
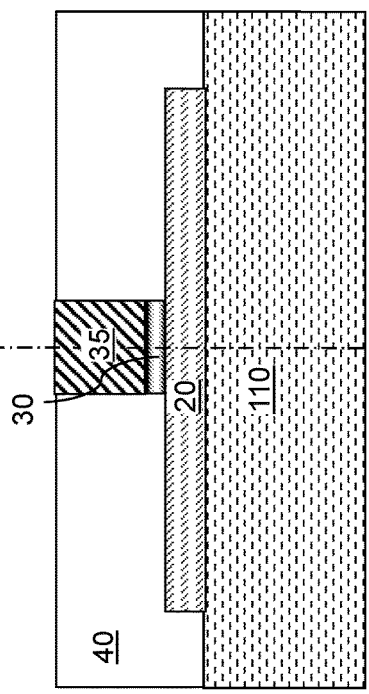
FIG. 29C
FIG. 29A
FIG. 29B

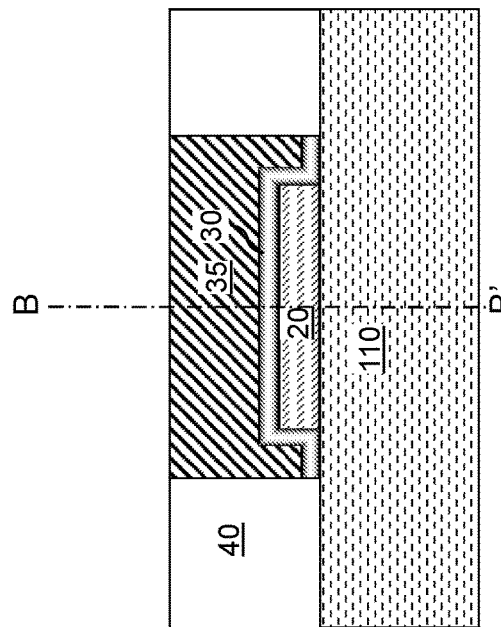
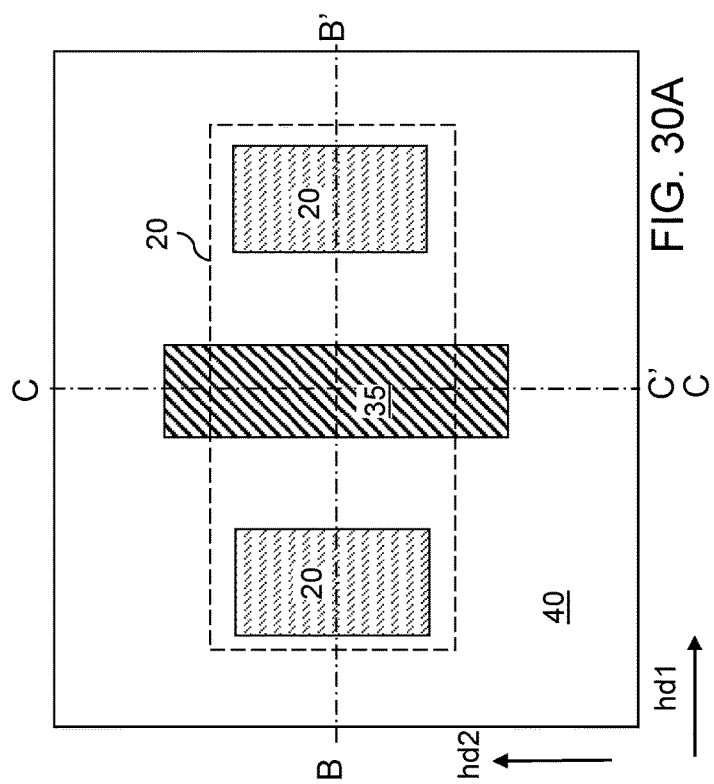
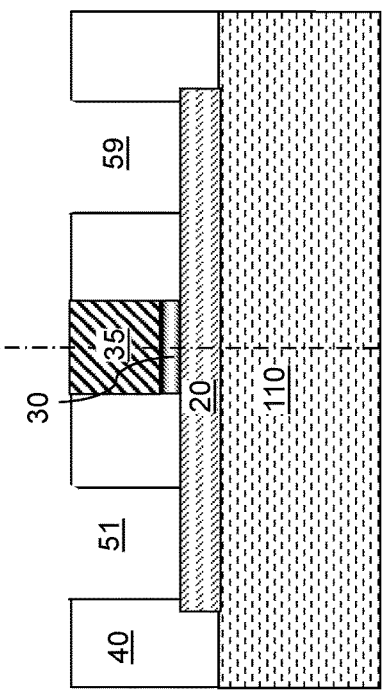
FIG. 30C
FIG. 30A
FIG. 30B

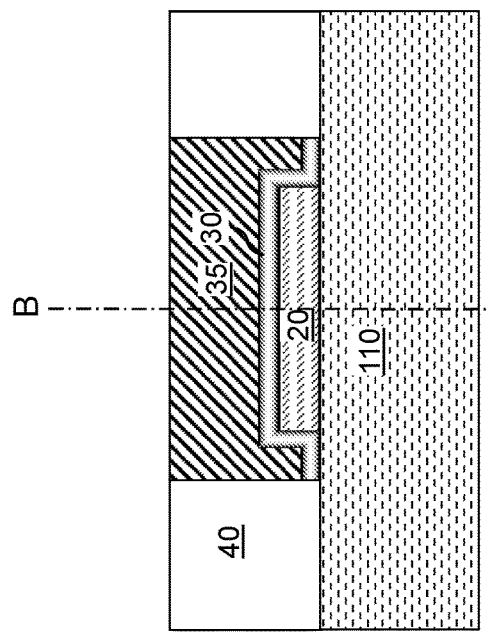
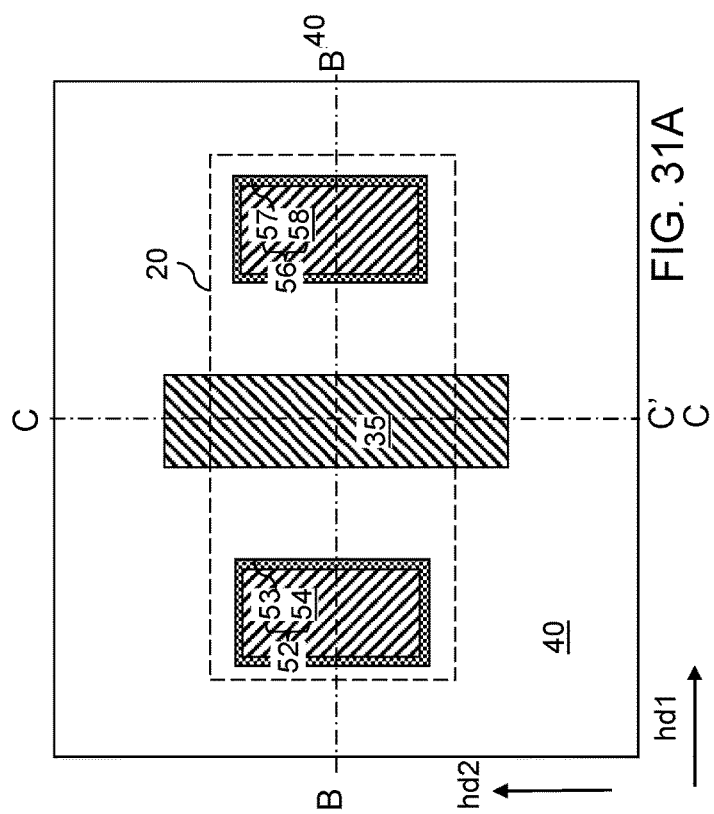
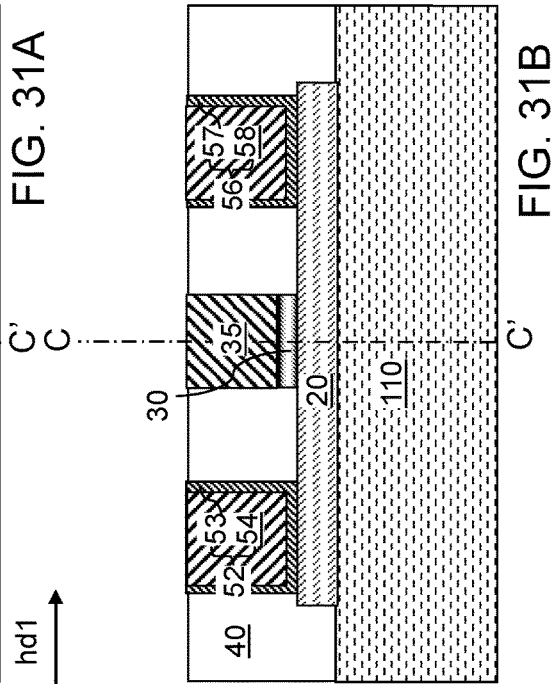

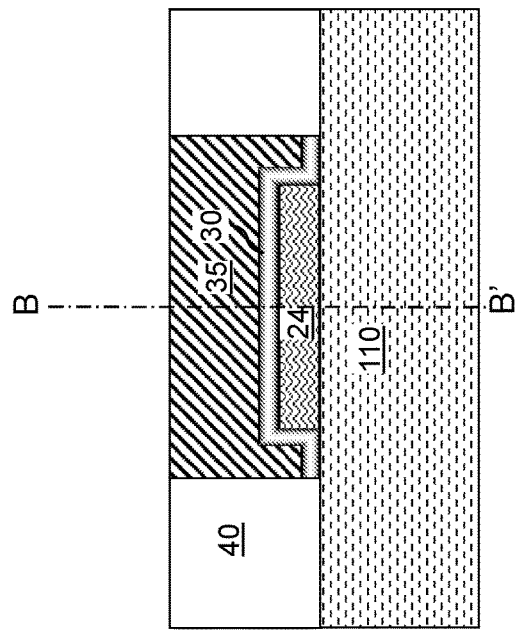
FIG. 33C
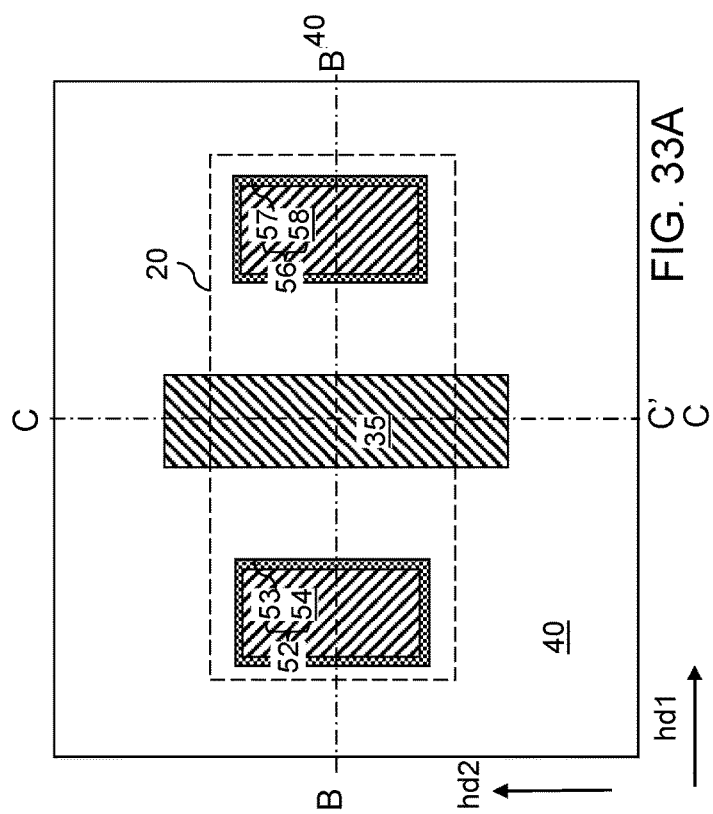
FIG. 33A
FIG. 33B

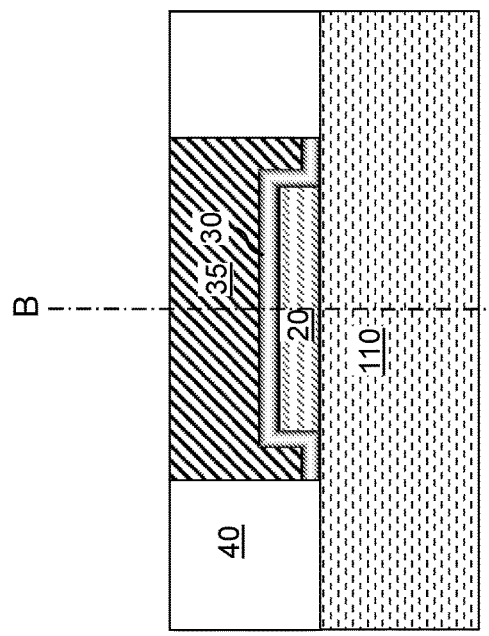
FIG. 35C
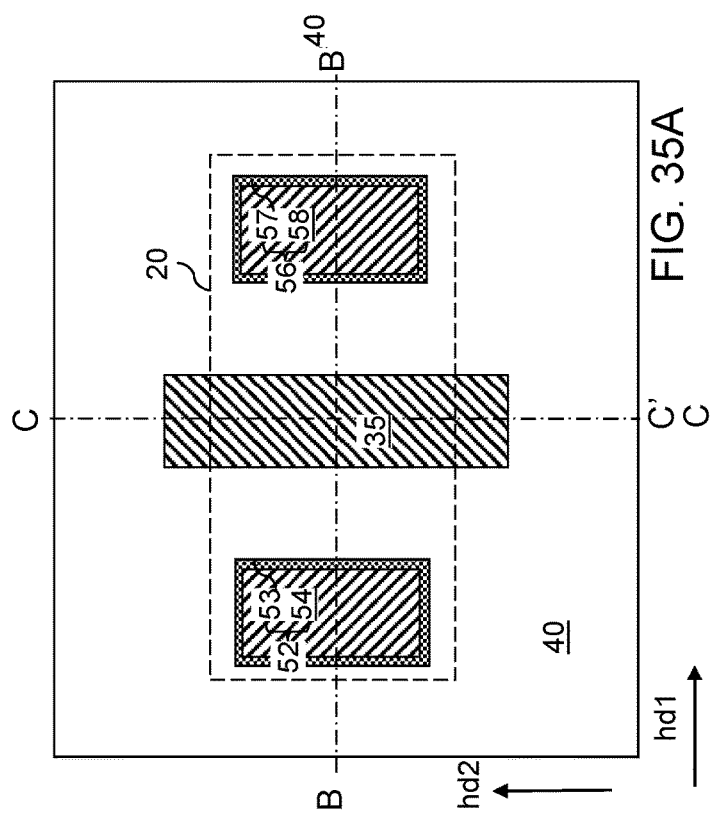
FIG. 35A
FIG. 35B
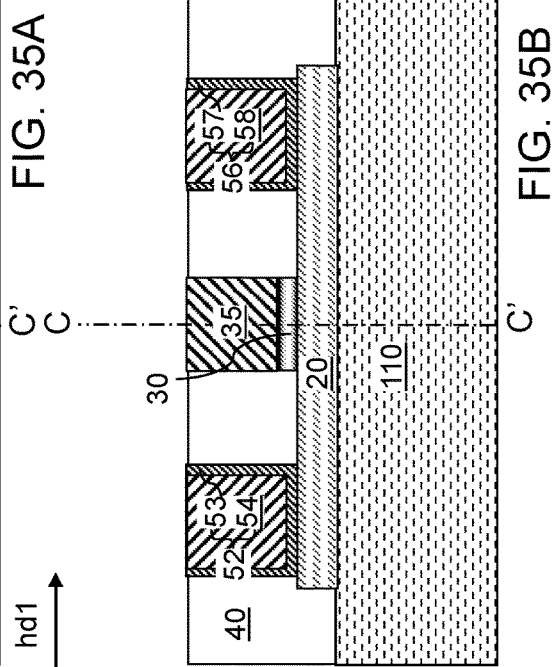

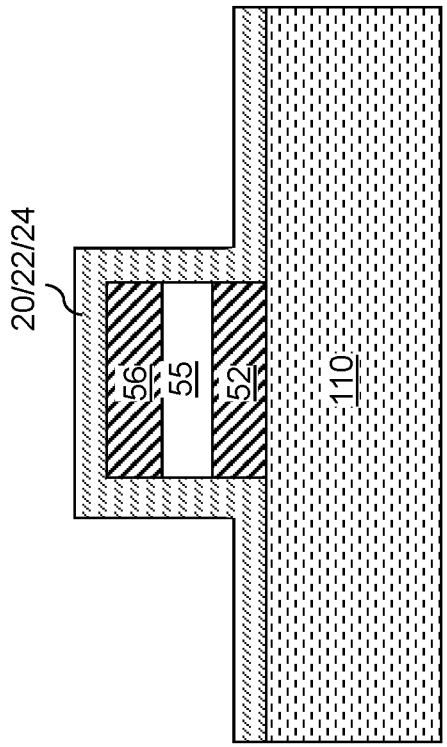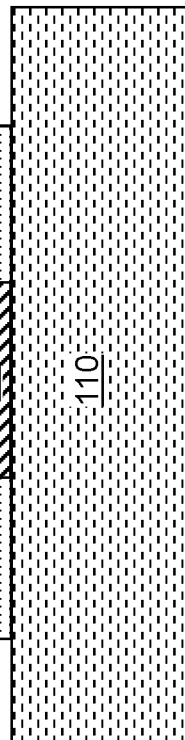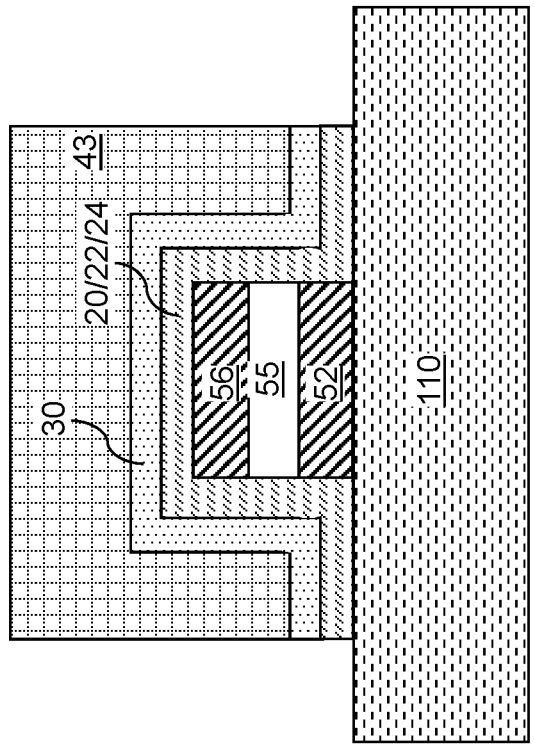

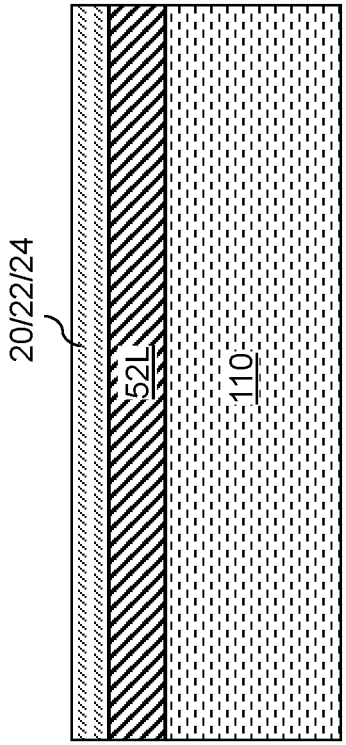
FIG. 37A
FIG. 37B
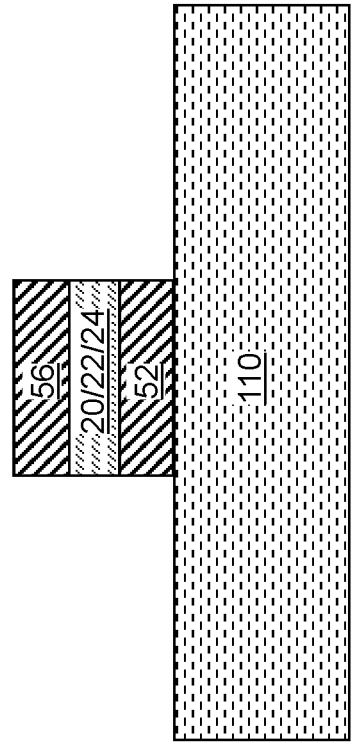
FIG. 37C
FIG. 37D

GERMANIUM TIN OXIDE-CONTAINING SEMICONDUCTOR DEVICE AND METHODS FOR FORMING THE SAME

RELATED APPLICATIONS

This application claims the benefit of priority from a U.S. provisional application Ser. No. 63/310,291 titled "Tin-containing devices and manufacturing method thereof" and filed on Feb. 15, 2022, the entire contents of which are incorporated herein by reference.

BACKGROUND

Transistors made of oxide semiconductors are an attractive option for back-end-of-line (BEOL) integration since they may be processed at low temperatures and thus, will not damage previously fabricated devices. For example, the fabrication conditions and techniques do not damage previously fabricated front-end-of-line (FEOL) and middle end-of-line (MEOL) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2C are various views of a first configuration of a region of the structure after formation of a gate contact via structure according to an embodiment of the present disclosure. FIG. 2A is a top-down view, FIG. 2B is a vertical cross-sectional view along the vertical plane B-B' of FIGS. 2A and 2C, and FIG. 2C is a vertical cross-sectional view along the vertical plane C-C' of FIGS. 2A and 2B.

FIG. 3A is a top-down view, FIG. 3B is a vertical cross-sectional view along the vertical plane B-B' of FIGS. 3A and 3C, and FIG. 3C is a vertical cross-sectional view along the vertical plane C-C' of FIGS. 3A and 3B.

FIGS. 4A-4C are various views of the first configuration of a region of the structure after conversion of the continuous binary metal alloy layer into a continuous ternary-metal oxide layer according to an embodiment of the present disclosure. FIG. 4A is a top-down view, FIG. 4B is a vertical cross-sectional view along the vertical plane B-B' of FIGS. 4A and 4C, and FIG. 4C is a vertical cross-sectional view along the vertical plane C-C' of FIGS. 4A and 4B.

FIGS. 5A-5C are various views of the first configuration of a region of the structure after formation of a gate electrode, a gate dielectric, and an active layer according to an embodiment of the present disclosure. FIG. 5A is a top-down view, FIG. 5B is a vertical cross-sectional view along the vertical plane B-B' of FIGS. 5A and 5C, and FIG. 5C is a vertical cross-sectional view along the vertical plane C-C' of FIGS. 5A and 5B.

FIG. 6A is a top-down view, FIG. 6B is a vertical cross-sectional view along the vertical plane B-B' of FIGS. 6A and 6C, and FIG. 6C is a vertical cross-sectional view along the vertical plane C-C' of FIGS. 6A and 6B.

FIG. 7A is a top-down view, FIG. 7B is a vertical cross-sectional view along the vertical plane B-B' of FIGS. 7A and 7C, and FIG. 7C is a vertical cross-sectional view along the vertical plane C-C' of FIGS. 7A and 7B.

FIGS. 8A-8C are various views of the first configuration of a region of the structure after formation of a source electrode and a drain electrode according to an embodiment of the present disclosure. FIG. 8A is a top-down view, FIG. 8B is a vertical cross-sectional view along the vertical plane B-B' of FIGS. 8A and 8C, and FIG. 8C is a vertical cross-sectional view along the vertical plane C-C' of FIGS. 8A and 8B.

FIGS. 9A-9C are various views of a second configuration of a region of the structure after formation of a continuous gate electrode material layer, a continuous gate dielectric material layer, a continuous binary metal alloy layer, and discrete tin precipitates according to an embodiment of the present disclosure. FIG. 9A is a top-down view, FIG. 9B is a vertical cross-sectional view along the vertical plane B-B' of FIGS. 9A and 9C, and FIG. 9C is a vertical cross-sectional view along the vertical plane C-C' of FIGS. 9A and 9B.

FIGS. 10A-10C are various views of the second configuration of a region of the structure after conversion of the discrete tin precipitates into a tin layer according to an embodiment of the present disclosure. FIG. 10A is a top-down view, FIG. 10B is a vertical cross-sectional view along the vertical plane B-B' of FIGS. 10A and 10C, and FIG. 10C is a vertical cross-sectional view along the vertical plane C-C' of FIGS. 10A and 10B.

FIGS. 11A-11C are various views of the second configuration of a region of the structure after formation of a layer stack including a continuous ternary-metal oxide layer and a continuous tin oxide layer according to an embodiment of the present disclosure. FIG. 11A is a top-down view, FIG. 11B is a vertical cross-sectional view along the vertical plane B-B' of FIGS. 11A and 11C, and FIG. 11C is a vertical cross-sectional view along the vertical plane C-C' of FIGS. 11A and 11B.

FIGS. 12A-12C are various views of the second configuration of a region of the structure after formation of an active layer, a gate dielectric, a gate electrode, a dielectric material layer, a source electrode and a drain electrode according to an embodiment of the present disclosure. FIG. 12A is a top-down view, FIG. 12B is a vertical cross-sectional view along the vertical plane B-B' of FIGS. 12A and 12C, and FIG. 12C is a vertical cross-sectional view along the vertical plane C-C' of FIGS. 12A and 12B.

FIG. 13A is a top-down view, FIG. 13B is a vertical cross-sectional view along the vertical plane B-B' of FIGS. 13A and 13C, and FIG. 13C is a vertical cross-sectional view along the vertical plane C-C' of FIGS. 13A and 13B.

FIGS. 14A-14C are various views of the third configuration of a region of the structure after conversion of the continuous ternary metal alloy layer into a continuous ternary-metal oxide layer according to an embodiment of the present disclosure. FIG. 14A is a top-down view, FIG. 14B is a vertical cross-sectional view along the vertical plane B-B' of FIGS. 14A and 14C, and FIG. 14C is a vertical cross-sectional view along the vertical plane C-C' of FIGS. 14A and 14B.

FIG. 15A is a top-down view, FIG. 15B is a vertical cross-sectional view along the vertical plane B-B' of FIGS. 15A and 15C, and FIG. 15C is a vertical cross-sectional view along the vertical plane C-C' of FIGS. 15A and 15B.

FIG. 16A is a top-down view, FIG. 16B is a vertical cross-sectional view along the vertical plane B-B' of FIGS. 16A and 16C, and FIG. 16C is a vertical cross-sectional view along the vertical plane C-C' of FIGS. 16A and 16B.

FIG. 17A is a top-down view, FIG. 17B is a vertical cross-sectional view along the vertical plane B-B' of FIGS. 17A and 17C, and FIG. 17C is a vertical cross-sectional view along the vertical plane C-C' of FIGS. 17A and 17B.

FIG. 18A is a top-down view, FIG. 18B is a vertical cross-sectional view along the vertical plane B-B' of FIGS. 18A and 18C, and FIG. 18C is a vertical cross-sectional view along the vertical plane C-C' of FIGS. 18A and 18B.

FIGS. 19A-19C are various views of the fourth configuration of a region of the structure after formation of an active layer, a gate dielectric, a gate electrode, a dielectric material layer, a source electrode and a drain electrode according to an embodiment of the present disclosure. FIG. 19A is a top-down view, FIG. 19B is a vertical cross-sectional view along the vertical plane B-B' of FIGS. 19A and 19C, and FIG. 19C is a vertical cross-sectional view along the vertical plane C-C' of FIGS. 19A and 19B.

FIG. 20A is a top-down view, FIG. 20B is a vertical cross-sectional view along the vertical plane B-B' of FIGS. 20A and 20C, and FIG. 20C is a vertical cross-sectional view along the vertical plane C-C' of FIGS. 20A and 20B.

FIG. 21A is a top-down view, FIG. 21B is a vertical cross-sectional view along the vertical plane B-B' of FIGS. 21A and 21C, and FIG. 21C is a vertical cross-sectional view along the vertical plane C-C' of FIGS. 21A and 21B.

FIG. 22A is a top-down view, FIG. 22B is a vertical cross-sectional view along the vertical plane B-B' of FIGS. 22A and 22C, and FIG. 22C is a vertical cross-sectional view along the vertical plane C-C' of FIGS. 22A and 22B.

FIGS. 23A-23C are various views of the fifth configuration of a region of the structure after formation of an active layer, a gate dielectric, a gate electrode, a dielectric material layer, a source electrode and a drain electrode according to an embodiment of the present disclosure. FIG. 23A is a top-down view, FIG. 23B is a vertical cross-sectional view along the vertical plane B-B' of FIGS. 23A and 23C, and FIG. 23C is a vertical cross-sectional view along the vertical plane C-C' of FIGS. 23A and 23B.

FIG. 24A is a top-down view, FIG. 24B is a vertical cross-sectional view along the vertical plane B-B' of FIGS. 24A and 24C, and FIG. 24C is a vertical cross-sectional view along the vertical plane C-C' of FIGS. 24A and 24B.

FIG. 25A is a top-down view, FIG. 25B is a vertical cross-sectional view along the vertical plane B-B' of FIGS. 25A and 25C, and FIG. 25C is a vertical cross-sectional view along the vertical plane C-C' of FIGS. 25A and 25B.

FIGS. 26A-26C are various views of the sixth configuration of a region of the structure after formation of an active layer according to an embodiment of the present disclosure. FIG. 26A is a top-down view, FIG. 26B is a vertical cross-sectional view along the vertical plane B-B' of FIGS. 26A and 26C, and FIG. 26C is a vertical cross-sectional view along the vertical plane C-C' of FIGS. 26A and 26B.

FIGS. 27A-27C are various views of the sixth configuration of a region of the structure after formation of a continuous gate dielectric material layer and a gate electrode material layer according to an embodiment of the present disclosure. FIG. 27A is a top-down view, FIG. 27B is a vertical cross-sectional view along the vertical plane B-B' of FIGS. 27A and 27C, and FIG. 27C is a vertical cross-sectional view along the vertical plane C-C' of FIGS. 27A and 27B.

FIGS. 28A-28C are various views of the sixth configuration of a region of the structure after formation of a gate dielectric and a gate electrode according to an embodiment of the present disclosure. FIG. 28A is a top-down view, FIG. 28B is a vertical cross-sectional view along the vertical plane B-B' of FIGS. 28A and 28C, and FIG. 28C is a vertical cross-sectional view along the vertical plane C-C' of FIGS. 28A and 28B.

FIGS. 29A-29C are various views of the sixth configuration of a region of the structure after formation of a dielectric material layer according to an embodiment of the present disclosure. FIG. 29A is a top-down view, FIG. 29B is a vertical cross-sectional view along the vertical plane B-B' of FIGS. 29A and 29C, and FIG. 29C is a vertical cross-sectional view along the vertical plane C-C' of FIGS. 29A and 29B.

FIGS. 30A-30C are various views of the sixth configuration of a region of the structure after formation of a source cavity and a drain cavity according to an embodiment of the present disclosure. FIG. 30A is a top-down view, FIG. 30B is a vertical cross-sectional view along the vertical plane B-B' of FIGS. 30A and 30C, and FIG. 30C is a vertical cross-sectional view along the vertical plane C-C' of FIGS. 30A and 30B.

FIGS. 31A-31C are various views of the sixth configuration of a region of the structure after formation of a source electrode and a drain electrode according to an embodiment of the present disclosure. FIG. 31A is a top-down view, FIG. 31B is a vertical cross-sectional view along the vertical plane B-B' of FIGS. 31A and 31C, and FIG. 31C is a vertical cross-sectional view along the vertical plane C-C' of FIGS. 31A and 31B.

FIG. 32A is a top-down view, FIG. 32B is a vertical cross-sectional view along the vertical plane B-B' of FIGS. 32A and 32C, and FIG. 32C is a vertical cross-sectional view along the vertical plane C-C' of FIGS. 32A and 32B.

FIGS. 33A-33C are various views of an eighth configuration of a region of the structure after formation of an active layer, a gate dielectric, a gate electrode, a dielectric material layer, a source electrode and a drain electrode according to an embodiment of the present disclosure. FIG. 33A is a top-down view, FIG. 33B is a vertical cross-sectional view along the vertical plane B-B' of FIGS. 33A and 33C, and FIG. 33C is a vertical cross-sectional view along the vertical plane C-C' of FIGS. 33A and 33B.

FIG. 34A is a top-down view, FIG. 34B is a vertical cross-sectional view along the vertical plane B-B' of FIGS. 34A and 34C, and FIG. 34C is a vertical cross-sectional view along the vertical plane C-C' of FIGS. 34A and 34B.

FIGS. 35A-35C are various views of a tenth configuration of a region of the structure after formation of an active layer, a gate dielectric, a gate electrode, a dielectric material layer, a source electrode and a drain electrode according to an embodiment of the present disclosure. FIG. 35A is a top-down view, FIG. 35B is a vertical cross-sectional view along the vertical plane B-B' of FIGS. 35A and 35C, and FIG. 35C is a vertical cross-sectional view along the vertical plane C-C' of FIGS. 35A and 35B.

FIGS. 36A-36H is a vertical cross-sectional view of an eleventh configuration of a region of the structure during formation of a thin film transistor according to an embodiment of the present disclosure.

FIGS. 37A-37G is a vertical cross-sectional view of a twelfth configuration of a region of the structure during formation of a thin film transistor according to an embodiment of the present disclosure.

DETAILED DESCRIPTION

Figure 1:
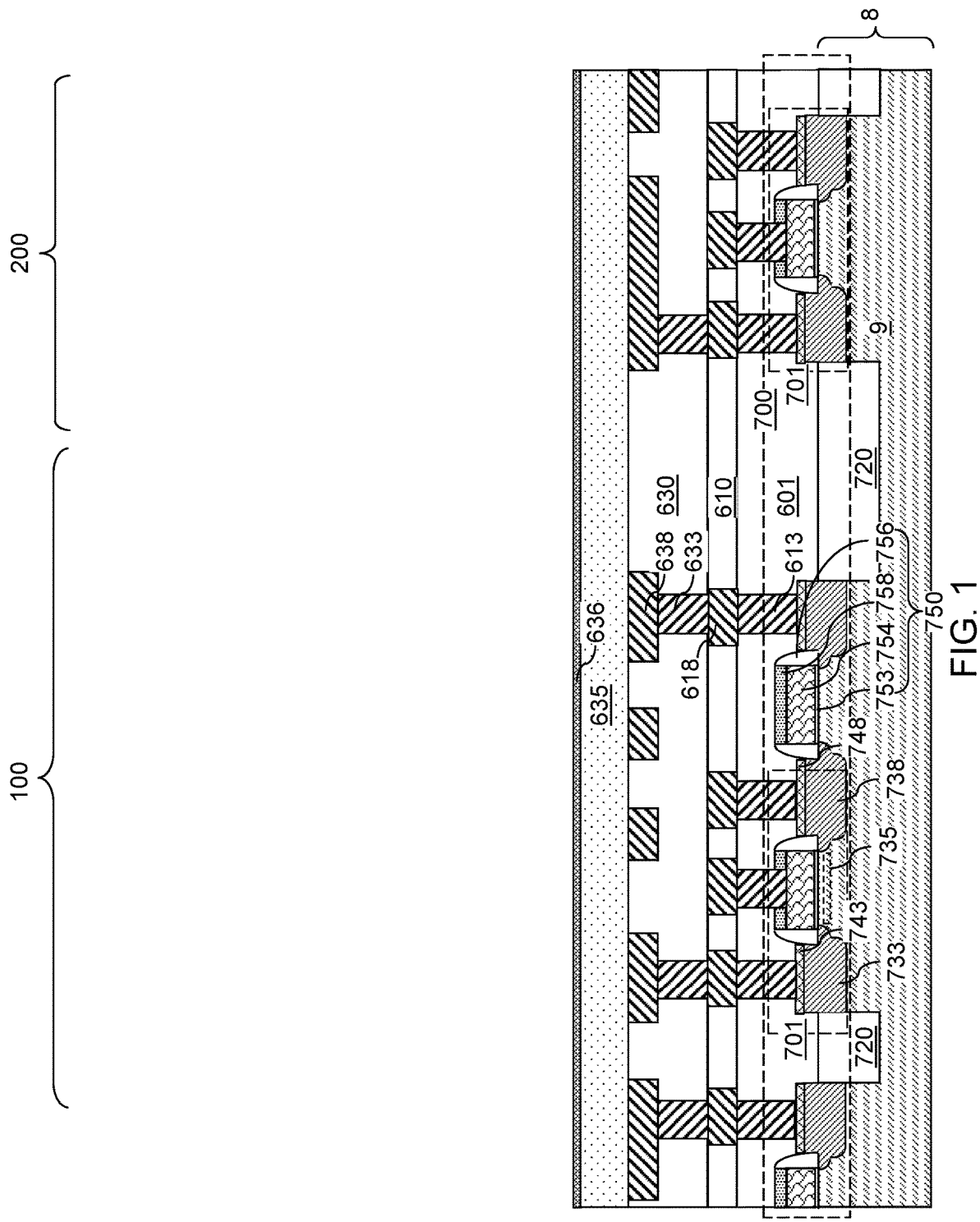
FIG. 1 is a vertical cross-sectional view of a structure after formation of complementary metal-oxide-semiconductor (CMOS) transistors, first metal interconnect structures formed in lower-level dielectric layers, an insulating material layer, and an optional etch stop dielectric layer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Generally, various embodiment structures and embodiment methods disclosed herein may be used to form a semiconductor structure including an active layer that includes an oxide material of at least two atomic elements including germanium and tin. The active layer may be used to form a channel region of a field effect transistor such as a thin film transistor. The field effect transistors of various embodiments may be formed in a bottom gate configuration or in a top gate configuration. The field effect transistors of various embodiments may be integrated with front-end-of-line processes that are used for manufacture of CMOS-based semiconductor devices. The various aspects of embodiments of the present disclosure are described herebelow in detail with reference to accompanying drawings.

Oxide semiconductor materials provide an additional functionality in the back-of-the-line (BEOL) structures because unlike silicon semiconductor channels using in front-end-of-line (FEOL) structures, the oxide semiconductor materials do not need to be fully crystalline to function as a current path. Although some n-type oxide semiconductor materials with good electrical properties (such as indium gallium zinc oxide) are known in the art, a good p-type oxide semiconductor is still not available in the semiconductor industry. Various embodiments disclosed herein provide an oxide compound semiconductor material including at least germanium and tin. The oxide compound semiconductor material of various embodiments of the present disclosure may be used as a p-type semiconductor material in BEOL structures. In some embodiments, the oxide compound semiconductor material including at least germanium and tin may be used in conjunction with n-type oxide semiconductor materials known in the art to provide complementary semiconductor devices in the BEOL structures.

Simulations performed on various embodiments of the present disclosure show that SnO may provide high charge carrier mobility of about 100 cm$^2$/V·s and an energy gap of about 0.7 eV. GeSnO$_3$ may increase the energy gap to about 2 eV, while reducing the charge carrier mobility to about 9 cm$^2$/V·s. Similar effects are predicted for elements such as Si, P, S, F, Ti, Cs, and Na for increasing the energy gap upon incorporation within tin-containing oxide materials.

Referring to FIG. 1, a first structure according to an embodiment of the present disclosure is illustrated. The first structure includes a substrate 8. Generally, the substrate 8 comprises, and/or consists essentially of, at least one material selected from an insulating material, a semiconductor material, and a metallic material. In one embodiment, the substrate 8 may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material. The first structure may include a memory region 100 and a logic region 200.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source electrode 733, a drain electrode 738, a semiconductor channel 735 that includes a surface portion of the substrate 8 extending between the source electrode 733 and the drain electrode 738, and a gate structure 750. The semiconductor channel 735 may include a single crystalline semiconductor material. Each gate structure 750 may include a gate dielectric layer 753, a gate electrode 754, a gate cap dielectric 758, and a dielectric gate spacer 756. A source-side metal-semiconductor alloy region 743 may be formed on each source electrode 733, and a drain-side metal-semiconductor alloy region 748 may be formed on each drain electrode 738.

One or more of the field effect transistors 701 in the CMOS circuitry 700 may include a semiconductor channel 735 that contains a portion of the semiconductor material layer 9 in the substrate 8. In embodiments in which the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel. In one embodiment, a plurality of field effect transistors 701 in the CMOS circuitry 700 may include a respective node that is subsequently electrically connected to a node of a respective ferroelectric memory cell to be subsequently formed. For example, a plurality of field effect transistors 701 in the CMOS circuitry 700 may include a respective source electrode 733 or a respective drain electrode 738 that is subsequently electrically connected to a node of a respective ferroelectric memory cell to be subsequently formed.

In one embodiment, the substrate 8 may include a single crystalline silicon substrate, and the field effect transistors 701 may include a respective portion of the single crystalline silicon substrate as a semiconducting channel. As used herein, a "semiconducting" element may refer to an element having electrical conductivity in the range from $1.0 \times 10^{-6}$ S/cm to $1.0 \times 10^5$ S/cm. As used herein, a "semiconductor material" may refer to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant.

Various metal interconnect structures formed within dielectric layers may be subsequently formed over the substrate 8 and the semiconductor devices thereupon (such as field effect transistors 701). In an illustrative example, the dielectric layers may include, for example, a first dielectric layer 601 that may be a layer that surrounds the contact structure connected to the source and drains (sometimes referred to as a contact-level dielectric layer 601), a first interconnect-level dielectric layer 610, and a second interconnect-level dielectric layer 630. The metal interconnect structures may include device contact via structures 613 formed in the first dielectric layer 601 and contact a respective component of the CMOS circuitry 700, first metal line structures 618 formed in the first interconnect-level dielectric layer 610, first metal via structures 633 formed in a lower portion of the second interconnect-level dielectric layer 630, and second metal line structures 638 formed in an upper portion of the second interconnect-level dielectric layer 630.

Each of the dielectric layers (601, 610, 630) may include a dielectric material such as undoped silicate glass, a doped silicate glass, organosilicate glass, amorphous fluorinated carbon, porous variants thereof, or combinations thereof. Each of the metal interconnect structures (613, 618, 633, 638) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first metal via structures 633 and the second metal line structures 638 may be formed as integrated line and via structures by a dual damascene process. The dielectric layers (601, 610, 630) are herein referred to as lower-level dielectric layers. The metal interconnect structures (613, 618, 633, 638)

formed within in the lower-level dielectric layers are herein referred to as lower-level metal interconnect structures.

While the present disclosure is described using an embodiment wherein transistors, such as thin film transistors, may be formed over the second interconnect-level dielectric layer 630, other embodiments are expressly contemplated herein in which the array of memory cells may be formed at a different metal interconnect level. Further, while the present disclosure is described using an embodiment in which a semiconductor substrate is used as the substrate 8, embodiments are expressly contemplated herein in which an insulating substrate or a conductive substrate is used as the substrate 8.

The set of all dielectric layers that are formed prior to formation of an array of transistors or an array of ferroelectric memory cells is collectively referred to as lower-level dielectric layers (601, 610, 630). The set of all metal interconnect structures that is formed within the lower-level dielectric layers (601, 610, 630) is herein referred to as metal interconnect structures (613, 618, 633, 638). Generally, metal interconnect structures (613, 618, 633, 638) formed within at least one lower-level dielectric layer (601, 610, 630) may be formed over the semiconductor material layer 9 that is located in the substrate 8.

According to an aspect of the present disclosure, a transistor, such as thin film transistors (TFTs) may be subsequently formed in a metal interconnect level that overlies that metal interconnect levels that contain the lower-level dielectric layers (601, 610, 630) and the metal interconnect structures (613, 618, 633, 638). In one embodiment, a planar dielectric layer having a uniform thickness may be formed over the lower-level dielectric layers (601, 610, 630). The planar dielectric layer is herein referred to as an insulating material layer 635. The insulating material layer 635 includes a dielectric material such as undoped silicate glass, a doped silicate glass, organosilicate glass, or a porous dielectric material, and may be deposited by chemical vapor deposition. The thickness of the insulating material layer 635 may be in a range from 30 nm to 300 nm, although lesser and greater thicknesses may also be used.

Generally, interconnect-level dielectric layers (such as the lower-level dielectric layer (601, 610, 630)) containing therein the metal interconnect structures (such as the metal interconnect structures (613, 618, 633, 638)) may be formed over semiconductor devices. The insulating material layer 635 may be formed over the interconnect-level dielectric layers.

In one embodiment, the substrate 8 may include a single crystalline silicon substrate, and lower-level dielectric layers (601, 610, 630) embedding lower-level metal interconnect structures (613, 618, 633, 638) may be located above the single crystalline silicon substrate. Field effect transistors 701 including a respective portion of the single crystalline silicon substrate as a channel may be embedded within the lower-level dielectric layers (601, 610, 630). The field effect transistors may be subsequently electrically connected to at least one of a gate electrode, a source electrode, and a drain electrode of one or more, or each, of transistors, such as thin film transistors, to be subsequently formed.

An etch stop dielectric layer 636 may be optionally formed over the insulating material layer 635. The etch stop dielectric layer 636 includes an etch stop dielectric material providing higher etch resistance to an etch chemistry during a subsequent anisotropic etch process that etches a dielectric material to be subsequently deposited over the etch stop dielectric layer 636. For example, the etch stop dielectric layer 636 may include silicon carbide nitride, silicon nitride, silicon oxynitride, or a dielectric metal oxide such as aluminum oxide. The thickness of the etch stop dielectric layer 636 may be in a range from 3 nm to 40 nm, such as from 4 nm to 30 nm, although lesser and greater thicknesses may also be used.

Referring to FIGS. 2A-2C, a first configuration of a region of the structure for forming a transistor (e.g., thin film transistor) is illustrated after formation of a gate contact via structure 12. For example, a via cavity may be formed through the etch stop dielectric layer 636 and the insulating layer 635 on a respective one of the underlying metal interconnect structures (not illustrated in FIGS. 2A-2C), and at least one metallic material may be deposited in the via cavity. Excess portions of the at least one metallic material may be removed from above the horizontal plane including the top surface of the etch stop dielectric layer 636 by a planarization process such as a chemical mechanical planarization process. A remaining portion of the at least one metallic material constitutes the gate contact via structure 12.

Figure 3A:
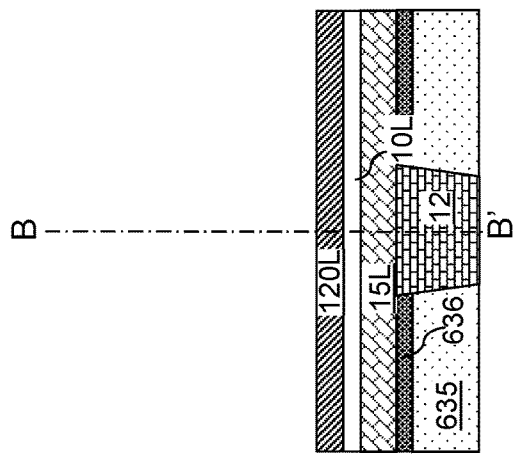
FIGS. 3A-3C are various views of the first configuration of a region of the structure after formation of a continuous gate electrode material layer, a continuous gate dielectric material layer, and a continuous binary metal alloy layer according to an embodiment of the present disclosure.
Figure 3B:
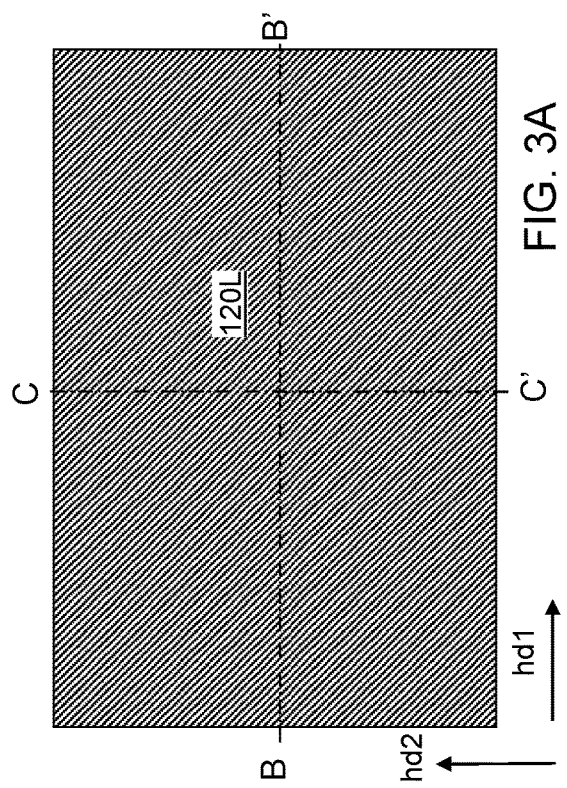
Figure 3C:
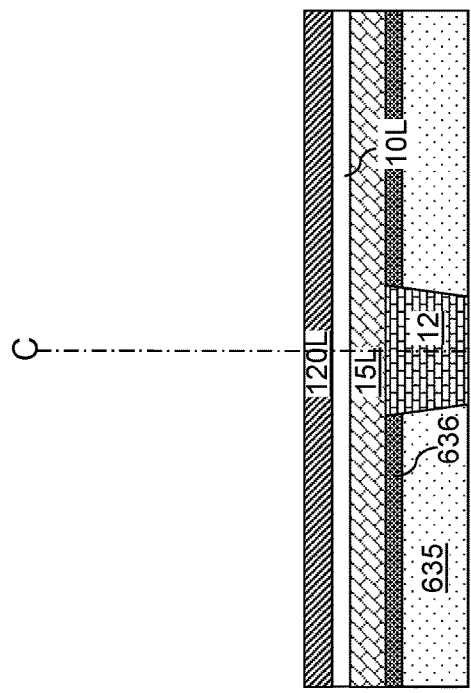

Referring to FIGS. 3A-3C, a continuous gate electrode material layer 15L, a continuous gate dielectric material layer 10L, and a continuous binary metal alloy layer 120L may be sequentially deposited over the etch stop dielectric layer 636.

The continuous gate electrode material layer 15L comprises at least one conductive gate electrode material. The at least one conductive gate electrode material may include, for example, a metallic barrier liner material (such as TiN, TaN, and/or WN) and a metallic fill material (such as Cu, W, Mo, Co, Ru, etc.). The continuous gate electrode material layer 15L may be deposited by chemical vapor deposition or physical vapor deposition. The thickness of the continuous gate electrode material layer 15L may be in a range from 20 nm to 200 nm, although lesser and greater thicknesses may also be used.

The continuous gate dielectric material layer 10L may be formed over the continuous gate electrode material layer 15L. The continuous gate dielectric material layer 10L may include, but is not limited to, silicon oxide, silicon oxynitride, silicon nitride, a dielectric metal oxide (such as aluminum oxide, hafnium oxide, yttrium oxide, zirconium oxide, lanthanum oxide, etc.), or a stack thereof. Other suitable dielectric materials are within the contemplated scope of disclosure. The continuous gate dielectric material layer 10L may be deposited by atomic layer deposition (ALD) or chemical vapor deposition (CVD). The thickness of the continuous gate dielectric material layer 10L may be in a range from 1 nm to 13 nm, such as from 3 nm to 6 nm, although lesser and greater thicknesses may also be used.

The continuous binary metal alloy layer 120L may be a metal alloy layer including two atomic elements. According to an aspect of various embodiments of the present disclosure, the two atomic elements may include a first element of tin and a second element selected from Ge, Si, P, S, F, Ti, Cs, and Na. The atomic ratio between the first element and the second element may be in a range from 1:2 to 50:1, such as from 1:2 to 2:1, although lesser and greater ratios may also be used. The continuous binary metal alloy layer 120L may be deposited by physical vapor deposition or an alternating sequence of chemical vapor deposition processes that alternately deposit layers of the first element and layers of the second element such that interlayer diffusion produces a binary metal alloy. The thickness of the continuous binary metal alloy layer 120L may be in a range from 1 nm to 100 nm, such as from 3 nm to 30 nm, although lesser and greater thicknesses may also be used. In one embodiment, the second element is Ge, and the atomic ratio between the first element and the second element may be in a range from 1:2 to 2:1.

Referring to FIGS. 4A-4C, an oxidation process may be performed to convert the continuous binary metal alloy layer 120L into a continuous binary-metal oxide layer 20L. The continuous binary-metal oxide layer 20L includes an oxide compound material of the two atomic elements. In one embodiment, the oxidation of the continuous binary metal alloy layer 120L into the continuous binary-metal oxide layer 20L may be effected by performing at least one oxidation process selected from a thermal oxidation process in which the continuous binary metal alloy layer 120L may be heated to a temperature greater than 600 degrees Celsius at an oxidizing ambient; a plasma oxidation process; and a chemical oxidation process in which the continuous binary metal alloy layer 120L may be exposed to an oxidizing chemical solution. In one embodiment, the continuous binary metal alloy layer 120L may include a tin-germanium alloy, and the oxide compound material of the continuous binary-metal oxide layer 20L has an average material composition of $GeSn_{1+\alpha}O_{3+\delta}$, in which $\alpha$ is in a range from $-0.5$ to 1.0, and $\delta$ is in a range from $-0.5$ to 1.0.

Referring to FIGS. 5A-5C, a photoresist layer (not shown) may be applied over the continuous binary-metal oxide layer 20L, and may be lithographically patterned to form at least one discrete photoresist material portion, such as a two-dimensional array of discrete photoresist material portions. An anisotropic etch process may be performed to etch unmasked portions of the continuous binary-metal oxide layer 20L, the continuous gate dielectric material layer 10L, and the continuous gate electrode material layer 15L. Each patterned portion of the continuous binary-metal oxide layer 20L comprises a binary-metal oxide active layer 20, which is an active layer including an oxide of a binary metal alloy. Each patterned portion of the continuous gate dielectric material layer 10L comprises a gate dielectric 10. Each patterned portion of the continuous gate electrode material layer 15L comprises a gate electrode 15. Each vertical stack of a gate electrode 15, a gate dielectric 10, and a binary-metal oxide active layer 20 may have vertically coincident sidewalls, i.e., sidewalls that are located within a same vertical plane. Each stack of a gate electrode 15 and a gate dielectric 10 is herein referred to a gate stack (15, 10). The gate dielectric 10 may contact the binary-metal oxide active layer 20 upon formation of the gate dielectric 10 and the binary-metal oxide active layer 20. The photoresist layer may be subsequently removed, for example, by ashing or dissolved by solution.

In one embodiment, the binary-metal oxide active layer 20 and the gate dielectric 10 within a stack of a gate electrode 15, a gate dielectric 10, and an binary-metal oxide active layer 20 may laterally extend horizontally with a respective uniform thickness, and may have a same area in a plan view (such as a see-through top-down view) along a vertical direction that is perpendicular to the interface between the binary-metal oxide active layer 20 and the gate dielectric 10. In one embodiment, the gate electrode 15 laterally extends horizontally with a uniform gate electrode thickness, and has a same area as the binary-metal oxide active layer 20 and the gate dielectric 10 in the plan view. In one embodiment, the oxide compound material is in direct contact with the gate dielectric 10. In one embodiment, the oxide compound material has an average material composition of $GeSn_{1+\alpha}O_{3+\delta}$, $\alpha$ is in a range from $-0.5$ to 1.0, and $\delta$ is in a range from $-0.5$ to 1.0.

Figure 6A:
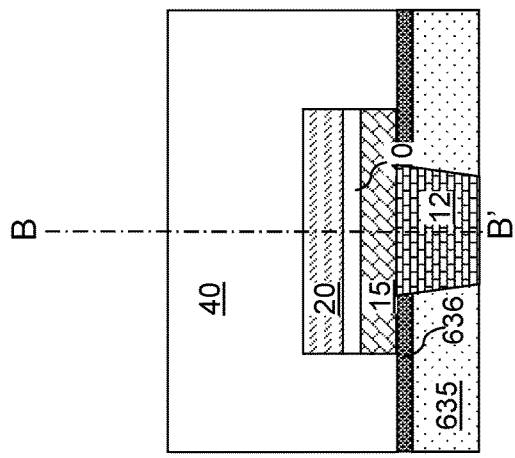
FIGS. 6A-6C are various views of the first configuration of a region of the structure after formation of a dielectric material layer according to an embodiment of the present disclosure.
Figure 6B:
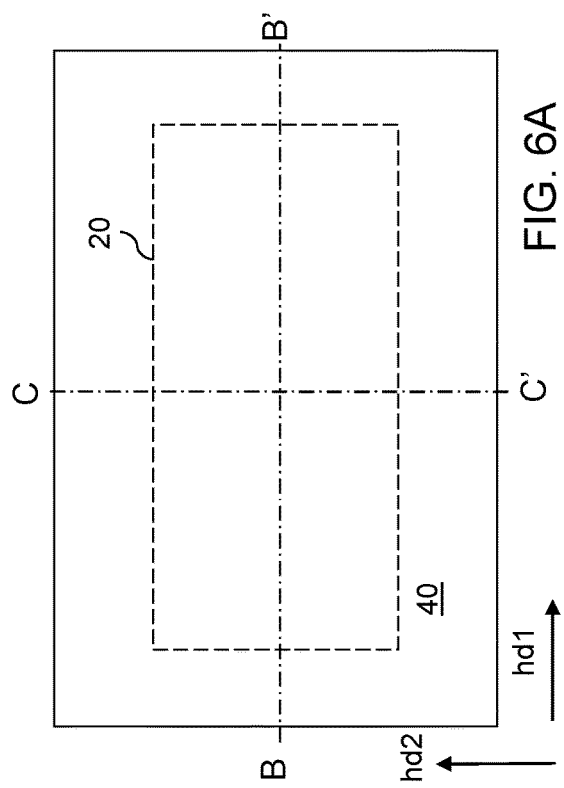
Figure 6C:
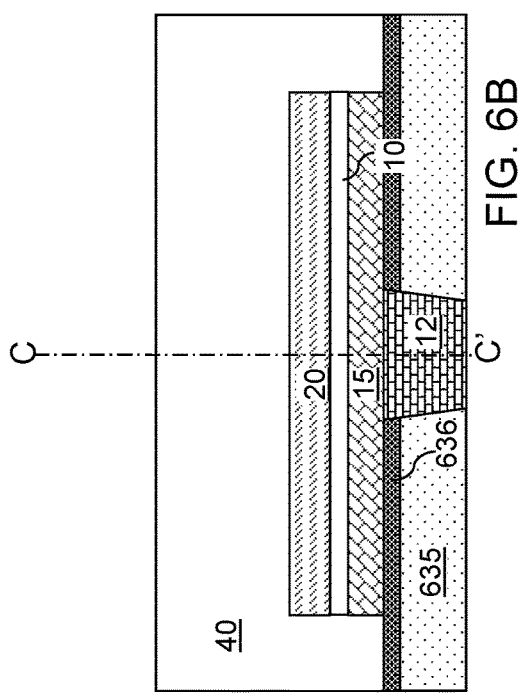

Referring to FIGS. 6A-6C, a dielectric material such as undoped silicate glass, a doped silicate glass, or organosilicate glass may be deposited over each stack of a gate electrode 15, a gate dielectric 10, and an binary-metal oxide active layer 20 to form a dielectric material layer 40. The dielectric material layer 40 may be deposited by a self-planarizing deposition method (such as spin-on coating) or may be planarized after deposition (for example, by performing a chemical mechanical polishing process). The vertical distance between the top surface of each binary-metal oxide active layer 20 and the top surface of the dielectric material layer 40 may be in a range from 20 nm to 200 nm, although lesser and greater thicknesses may also be used.

Figure 7A:
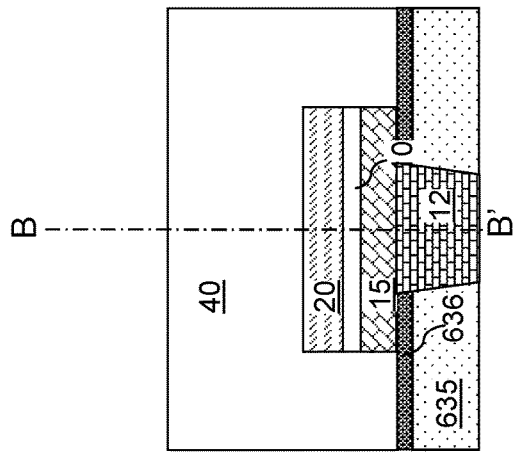
FIGS. 7A-7C are various views of the first configuration of a region of the structure after formation of a source cavity and a drain cavity according to an embodiment of the present disclosure.
Figure 7B:
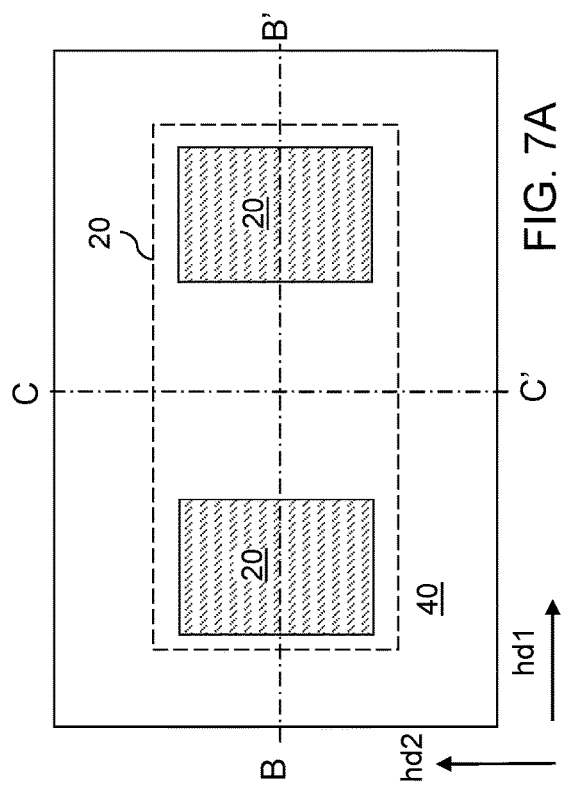
Figure 7C:
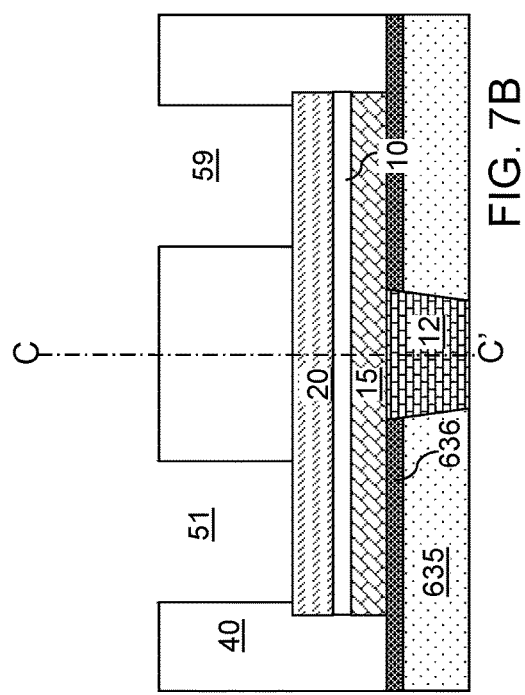

Referring to FIGS. 7A-7C, a photoresist layer (not shown) may be applied over the dielectric material layer 40, and may be lithographically patterned to form discrete openings therein. The pattern of the discrete openings in the photoresist layer may be transferred through the dielectric material layer 40 by an anisotropic etch process to form a source cavity 51 and a drain cavity 59 over each active layer 20. The anisotropic etch process may be selective to the materials of the active layer 20. A top surface of the active layer 20 may be physically exposed at the bottom of the source cavity 51 and at the bottom of the drain cavity 59.

Referring to FIGS. 8A-8C, at least one conductive material may be deposited in the source cavity 51 and drain cavity 59 and over the dielectric material layer 40. The at least one conductive material may include a metallic liner material and a metallic fill material. The metallic liner material may include a conductive metallic nitride or a conductive metallic carbide such as TiN, TaN, WN, TiC, TaC, and/or WC. The metallic fill material may include W, Cu, Al, Co, Ru, Mo, Ta, Ti, alloys thereof, and/or combinations thereof. Other suitable materials within the contemplated scope of disclosure may also be used.

Excess portions of the at least one conductive material may be removed from above the horizontal plane including the top surface of the dielectric material layer 40 by a planarization process, which may use a chemical mechanical polishing (CMP) process and/or a recess etch process. Other suitable planarization processes may be used. Each remaining portion of the at least one conductive material filling a source cavity 51 constitutes a source electrode 52. Each remaining portion of the at least one conductive material filling a drain cavity 59 constitutes a drain electrode 56. In one embodiment, the at least one conductive material may comprise a combination of the metallic liner material and the metallic fill material described above.

In one embodiment, each source electrode 52 may include a source metallic liner 53 that is a remaining portion of the metallic liner material, and a source metallic fill material portion 54 that is a remaining portion of the metallic fill material. Each drain electrode 56 may include a drain metallic liner 57 that is a remaining portion of the metallic liner material, and a drain metallic fill material portion 58 that is a remaining portion of the metallic fill material.

Referring to FIGS. 9A-9C, a second configuration of the structure may be derived from the first configuration of the structure illustrated in FIGS. 2A-2C by forming a continuous gate electrode material layer 15L, a continuous gate dielectric material layer 10L, a continuous binary metal alloy layer 120L, and discrete tin precipitates 122 over the etch stop dielectric layer 636. The continuous gate electrode material layer 15L and the continuous gate dielectric material layer 10L may be the same as in the first configuration of the structure illustrated in FIGS. 3A-3C.

The combination of the continuous binary metal alloy layer 120L and the discrete tin precipitates 122 may be formed by depositing the first element of tin and a second element selected from Ge, Si, P, S, F, Ti, Cs, and Na at an atomic ratio that induces spontaneous precipitation of tin from an alloy including tin and the second element. The first element and the second element may be deposited by physical vapor deposition or an alternating sequence of chemical vapor deposition processes that alternately deposit layers of the first element and layers of the second element. In one embodiment, tin and the second element may be deposited such that the atomic percentage of tin is greater than the solubility limit of tin in the second element. In such embodiments, atoms of tin may spontaneously segregate out of alloy portions to form the discrete tin precipitates 122. Portions of the deposited metallic material that remains as an alloy form the continuous binary metal alloy layer 120L.

The atomic ratio between the first element of tin and the second element within the continuous binary metal alloy layer 120L may be in a range from 1:2 to 50:1, such as from 1:2 to 2:1, although lesser and greater ratios may also be used. The thickness of the continuous binary metal alloy layer 120L may be in a range from 1 nm to 100 nm, such as from 3 nm to 30 nm, although lesser and greater thicknesses may also be used. In one embodiment, the second element is Ge, and the atomic ratio between the first element and the second element may be in a range from 1:2 to 2:1. The total volume of the tin precipitates 122 may be in a range from 5% to 100%, such as from 10% to 30%, of the total volume of the continuous binary metal alloy layer 120L.

In one embodiment, the second element may be germanium. In this embodiment, the continuous binary metal alloy layer 120L may comprise a tin-germanium alloy layer. In one embodiment, the tin-germanium alloy layer may be formed by concurrently depositing germanium and tin over the substrate 8. Discrete precipitates of tin, i.e., the tin precipitates 122, are formed over the continuous binary metal alloy layer 120L.

Referring to FIGS. 10A-10C, an anneal process may be performed to convert the discrete precipitates of tin 122 into a tin layer 122L. The anneal process may be performed at a temperature that provides sufficient surface mobility to the tin atoms such that the tin atoms may freely diffuse over the surface of the continuous binary metal alloy layer 120L. In one embodiment, the anneal process may be performed at an elevated temperature above 331.9 degrees Celsius.

In an alternative embodiment, the first element of tin and the second element selected from Ge, Si, P, S, F, Ti, Cs, and Na may be deposited at an elevated temperature, such as a temperature above 331.9 degrees Celsius, at the processing steps of FIGS. 9A-9C. In this embodiment, the segregated tin atoms may form the tin layer 122L illustrated in FIGS. 10A-10C without formation of the tin precipitates 122.

Referring to FIGS. 11A-11C, an oxidation process may be performed to convert the layer stack of the continuous binary metal alloy layer 120L and the tin layer 122L into a layer stack including a continuous binary-metal oxide layer 20L and a continuous tin oxide layer 22L. The continuous binary-metal oxide layer 20L includes, and/or consists essentially of, an oxide compound material of the at least two atomic elements. The continuous tin oxide layer 22L includes, and/or consists essentially of, tin oxide. In one embodiment, the oxidation of the continuous binary metal alloy layer 120L and the continuous tin layer 122L may be effected by performing at least one oxidation process selected from a thermal oxidation process in which the continuous binary metal alloy layer 120L and the continuous tin layer 122L may be heated to a temperature greater than 600 degrees Celsius at an oxidizing ambient; a plasma oxidation process; and a chemical oxidation process in which the continuous tin layer 122L may be exposed to an oxidizing chemical solution. In one embodiment, the continuous binary metal alloy layer 120L comprises a tin-germanium alloy, and the oxide compound material of the continuous binary-metal oxide layer 20L has an average material composition of $GeSn_{1+\alpha}O_{3+\delta}$, $\alpha$ is in a range from −0.5 to 1.0, and $\delta$ is in a range from −0.5 to 1.0.

Referring to FIGS. 12A-12C, the processing steps of FIGS. 5A-5C may be performed to pattern the continuous binary-metal oxide layer 20L and the continuous tin oxide layer 22L into at least one binary-metal oxide active layer 20 and at least one tin oxide active layer 22. Each vertical stack of a binary-metal oxide active layer 22 and a tin oxide active layer 22 constitutes an active layer (20, 22) of a thin film transistor. The continuous gate dielectric material layer 10L may be patterned into at least one gate dielectric 10, and the continuous gate electrode material layer 15L may be patterned into at least one gate electrode 15. The processing steps of FIGS. 6A-6C may be performed to form a dielectric material layer 40, and the processing steps of FIGS. 7A-7C and FIGS. 8A-8C may be performed to form a source electrode 52 and a drain electrode 56 on each active layer (20, 22).

Figure 13A:
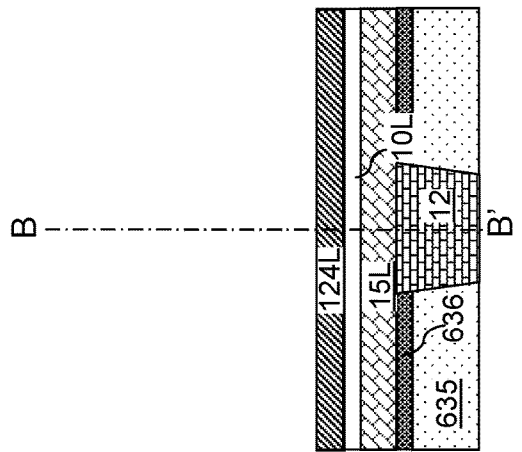
FIGS. 13A-13C are various views of a third configuration of a region of the structure after formation of a continuous gate electrode material layer, a continuous gate dielectric material layer, and a continuous ternary metal alloy layer according to an embodiment of the present disclosure.
Figure 13B:
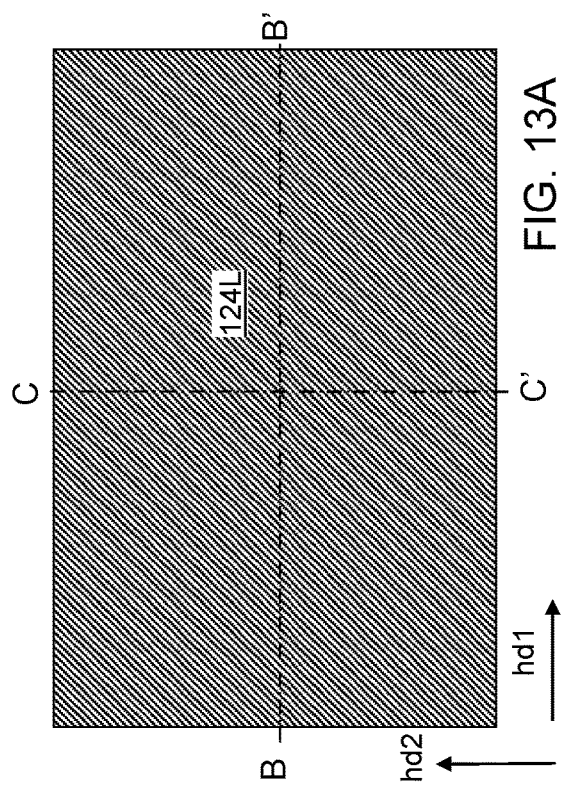
Figure 13C:
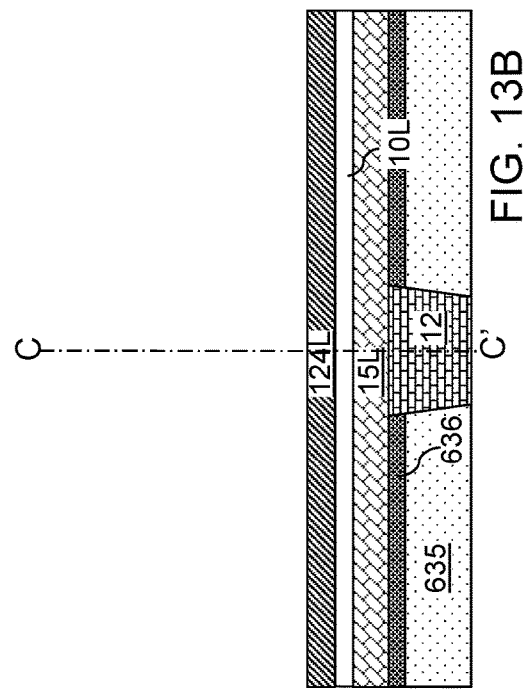

Referring to FIGS. 13A-13C, a third configuration of the structure may be derived from the first configuration of the structure illustrated in FIGS. 2A-2C by forming a continuous gate electrode material layer 15L, a continuous gate dielectric material layer 10L, and a continuous ternary metal alloy layer 124L over the etch stop dielectric layer 636. The continuous gate electrode material layer 15L and the continuous gate dielectric material layer 10L may be the same as in the first configuration of the structure illustrated in FIGS. 3A-3C.

The continuous ternary metal alloy layer 124L may be formed by depositing the first element of tin, and a second element and a third element that may be selected from Ge, Si, P, S, F, Ti, Cs, and Na. The first element, the second element, and the third element may be deposited by physical vapor deposition or a sequence of chemical vapor deposition processes that sequentially deposits the first element, the second element, and the third element singly or in combination in any order such that sufficient mixing of the first element, the second element, and the third element occurs in the deposited material portion.

The atomic ratio between the first element of tin and the combination of the second element and the third element within the continuous ternary metal alloy layer 124L may be in a range from 1:2 to 50:1, such as from 1:2 to 2:1, although lesser and greater ratios may also be used. The thickness of the continuous ternary metal alloy layer 124L may be in a range from 1 nm to 100 nm, such as from 3 nm to 30 nm, although lesser and greater thicknesses may also be used.

In one embodiment, the second element may be Ge, and the third element may be silicon. The atomic ratio between the first element and the combination of the second element and the third element may be in a range from 1:2 to 2:1. The continuous ternary metal alloy layer 124L may be an alloy layer comprising, and/or consisting essentially of, germanium, tin, and silicon. In one embodiment, the continuous ternary metal alloy layer 124L includes an oxide compound material having an average material composition of $Si_{\beta}Ge_{1-\beta}Sn_{1+\alpha}O_{3+\delta}$, in which $\beta$ is in a range from 0.001 to 0.9, and $\alpha$ is in a range from −0.5 to 0.5, and $\delta$ is in a range from −0.5 to 1.0.

Referring to FIGS. 14A-14C, an oxidation process may be performed to convert the continuous ternary metal alloy layer 124L into a continuous ternary-metal oxide layer 24L. The continuous ternary-metal oxide layer 24L includes an oxide compound material of the at least two atomic elements. In one embodiment, the oxidation of the continuous ternary metal alloy layer 124L into the continuous ternary-metal oxide layer 24L may be effected by performing at least one oxidation process selected from a thermal oxidation process in which the continuous ternary metal alloy layer 124L may be heated to a temperature greater than 600 degrees Celsius at an oxidizing ambient; a plasma oxidation process; and a chemical oxidation process in which the continuous ternary metal alloy layer 124L may be exposed to an oxidizing chemical solution. In one embodiment, the continuous ternary metal alloy layer 124L comprises a tin-germanium-silicon alloy, and the oxide compound material of the continuous ternary-metal oxide layer 24L has an average material composition of $Si_\beta Ge_{1-\beta} Sn_{1+\alpha} O_{3+\delta}$, in which $\beta$ is in a range from 0.001 to 0.9, $\alpha$ is in a range from $-0.5$ to 0.5, and $\delta$ is in a range from $-0.5$ to 1.0.

Figure 15A:
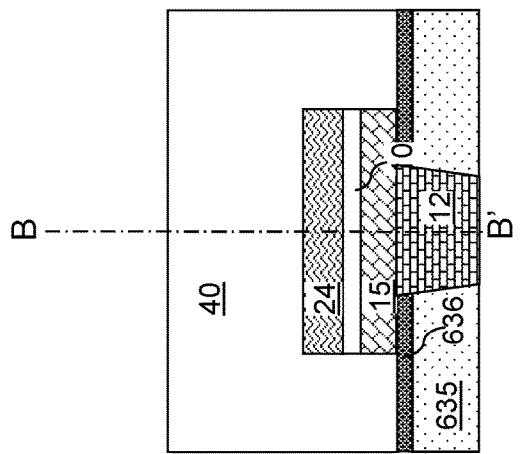
FIGS. 15A-15C are various views of the third configuration of a region of the structure after formation of an active layer, a gate dielectric, a gate electrode, a dielectric material layer, a source electrode and a drain electrode according to an embodiment of the present disclosure.
Figure 15B:
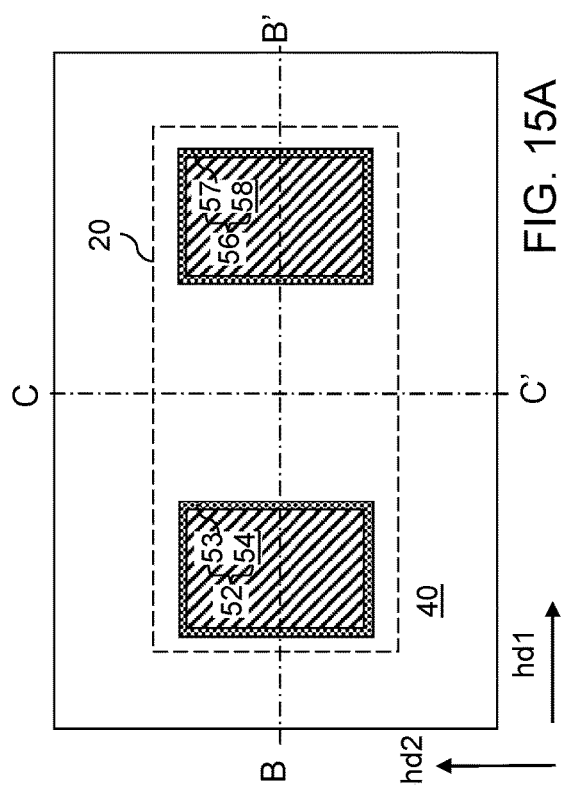
Figure 15C:
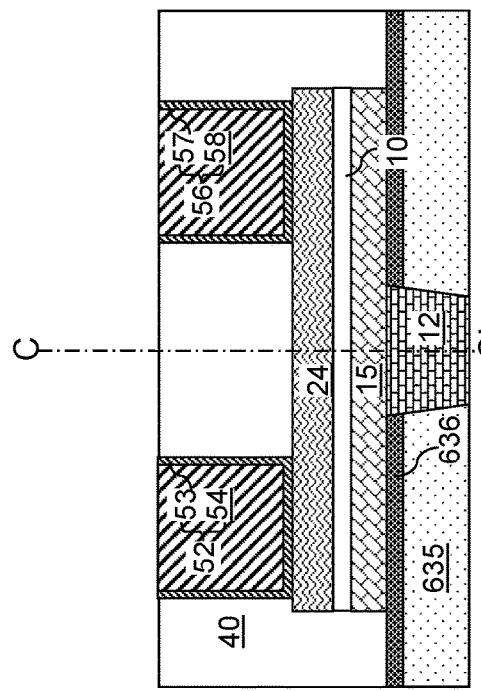

Referring to FIGS. 15A-15C, the processing steps of FIGS. 5A-5C may be performed to pattern the continuous ternary-metal oxide layer 24L into at least one ternary-metal oxide active layer 24, which is an active layer of a thin film transistor. The continuous gate dielectric material layer 10L is patterned into at least one gate dielectric 10, and the continuous gate electrode material layer 15L is patterned into at least one gate electrode 15. The processing steps of FIGS. 6A-6C may be performed to form a dielectric material layer 40, and the processing steps of FIGS. 7A-7C and FIGS. 8A-8C may be performed to form a source electrode 52 and a drain electrode 56 on each active layer 24.

Figure 16A:
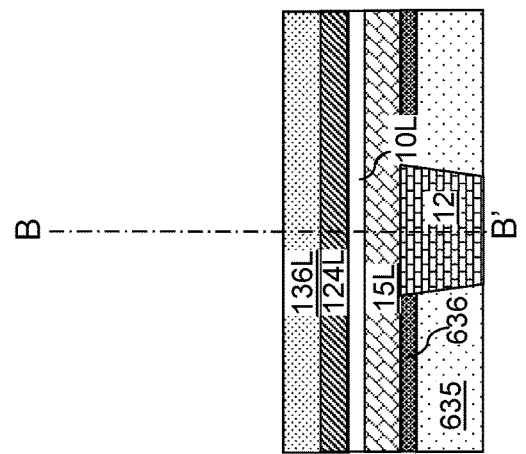
FIGS. 16A-16C are various views of a fourth configuration of a region of the structure after formation of a continuous gate electrode material layer, a continuous gate dielectric material layer, a continuous ternary metal alloy layer, and a continuous silicon oxide layer according to an embodiment of the present disclosure.
Figure 16B:
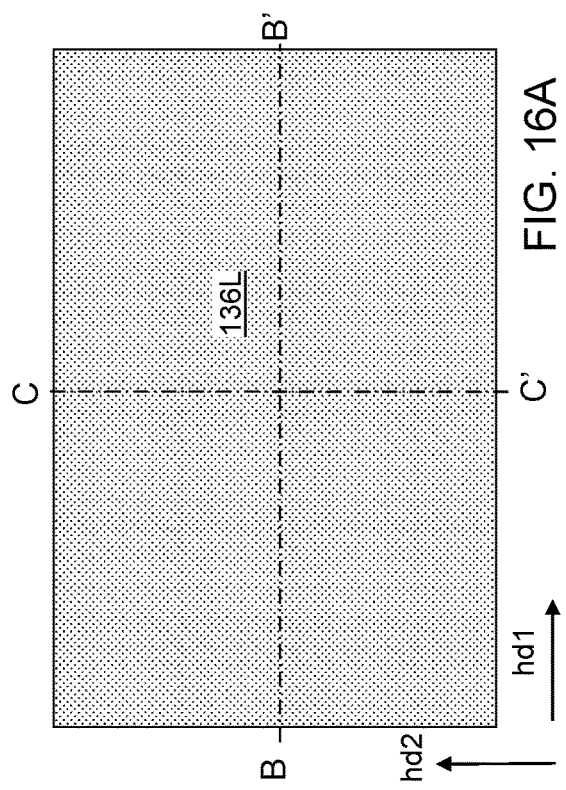
Figure 16C:
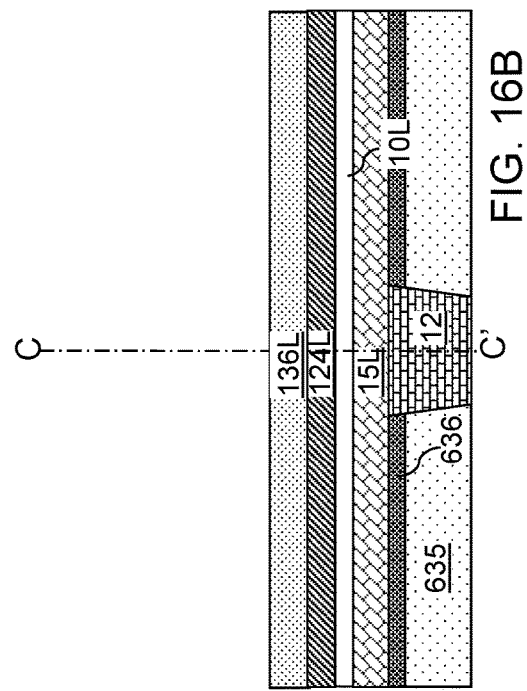

Referring to FIGS. 16A-16C, a fourth configuration of the structure may be derived from the third configuration of the structure illustrated in FIGS. 13A-13C by depositing a continuous silicon oxide layer 136L on a top surface of the continuous ternary metal alloy layer 124L. In the fourth configuration, the continuous ternary-metal oxide layer 24L may include an oxide compound material of a first element of tin, and a second element selected from Ge, P, S, F, Ti, Cs, and Na, and a third element of silicon. In one embodiment, the second element is germanium. The continuous silicon oxide layer 136L may be deposited, for example, by chemical vapor deposition. The thickness of the continuous silicon oxide layer 136L may be in a range from 2 nm to 30 nm, such as from 4 nm to 15 nm, although lesser and greater thicknesses may also be used.

Figure 17A:
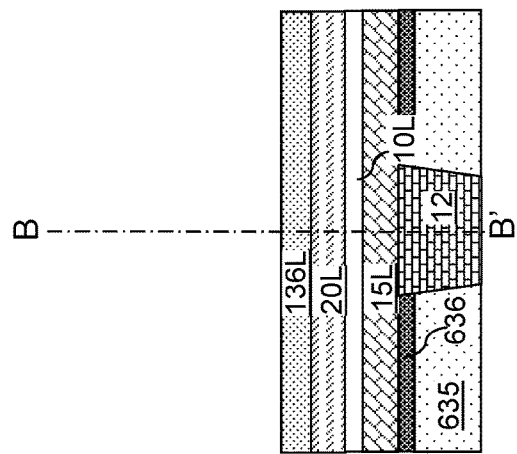
FIGS. 17A-17C are various views of the fourth configuration of a region of the structure after conversion of the continuous ternary metal alloy layer into a continuous ternary-metal oxide layer through preferential oxidation of silicon atoms according to an embodiment of the present disclosure.
Figure 17B:
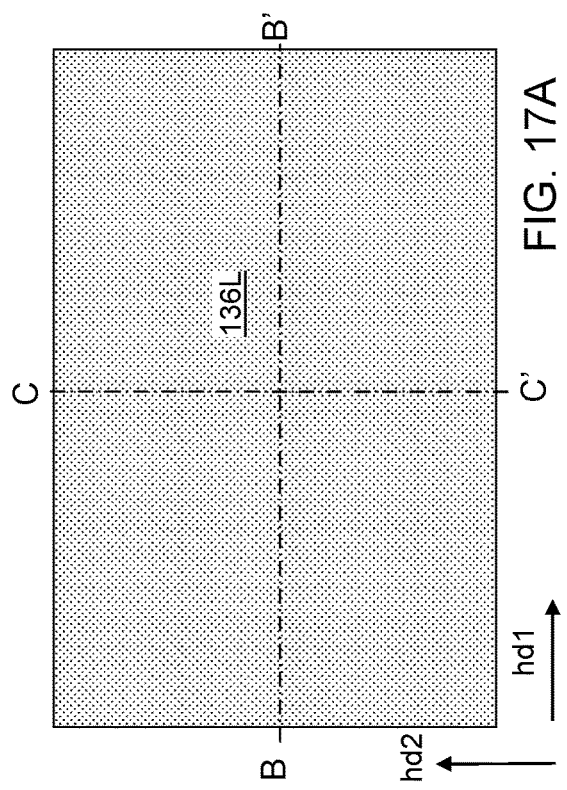
Figure 17C:
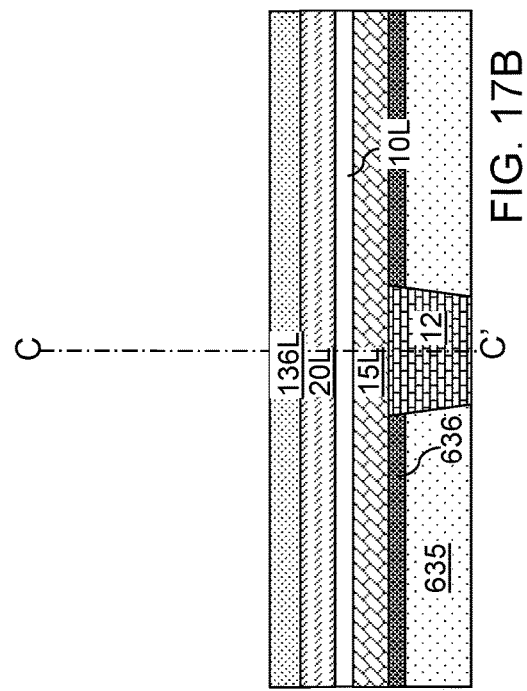

Referring to FIGS. 17A-17C, an oxidation process may be performed to oxidize the continuous ternary metal alloy layer 124L by supplying oxygen atoms into the continuous ternary metal alloy layer 124L through the continuous silicon oxide layer 136L. According to an aspect of various embodiments of the present disclosure, silicon atoms in the continuous ternary metal alloy layer 124L are preferentially incorporated into the continuous silicon oxide layer 136L while the continuous ternary metal alloy layer 124L is oxidized. Thus, the continuous ternary metal alloy layer 124L loses silicon atoms that are oxidized and incorporated into the continuous silicon oxide layer 136L during the oxidation process. The atomic ratio of the second element to silicon within the continuous ternary metal alloy layer 124L increases during conversion of the continuous ternary metal alloy layer 124L into a continuous binary metal-oxide layer 20L, which consists essentially of the first element of tin and the second element. In such an embodiment, the third element of silicon may be present only in trace amount in the continuous binary metal-oxide layer 20L. In one embodiment, the second element is germanium, and the germanium-to-silicon ratio in the continuous ternary metal alloy layer 124L decreases during conversion of the continuous ternary metal alloy layer 124L into the oxide compound material of the continuous binary metal-oxide layer 20L.

In one embodiment, the oxidation of the continuous ternary metal alloy layer 124L into the continuous binary-metal oxide layer 20L may be effected by performing at least one oxidation process selected from a thermal oxidation process in which the continuous ternary metal alloy layer 124L may be heated to a temperature greater than 600 degrees Celsius at an oxidizing ambient; a plasma oxidation process; and a chemical oxidation process in which the continuous silicon oxide layer 136L may be exposed to an oxidizing chemical solution. Generally, oxygen atoms diffuse through the continuous silicon oxide layer 136L during the oxidation process, and converts the continuous ternary metal oxide layer 124L into the continuous binary-metal oxide layer 20L.

In one embodiment, the oxide compound material of the continuous binary-metal oxide layer 20L may be doped with silicon atoms such that an atomic concentration of the silicon atoms increases within the oxide compound material with a vertical distance from the substrate 8. In one embodiment, the oxide compound material has a compositional gradient in which an atomic concentration of oxygen atoms increases within the oxide compound material with a vertical distance from the substrate 8. In one embodiment, the continuous ternary metal alloy layer 124L comprises a tin-germanium alloy, and the oxide compound material of the continuous binary-metal oxide layer 20L has an average material composition of $GeSn_{1+\alpha} Si_\epsilon O_{3+\delta+2\epsilon}$, in which $\alpha$ is in a range from $-0.5$ to 1.0, and $\delta$ is in a range from $-0.5$ to 1.0, and $\epsilon$ is in a range from $1.0 \times 10^{-8}$ to $1.0 \times 10^{-3}$.

Figure 18C:
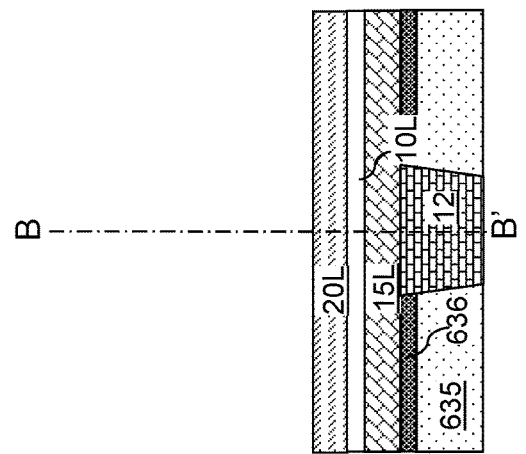
FIGS. 18A-18C are various views of the fourth configuration of a region of the structure after removal of the continuous silicon oxide layer according to an embodiment of the present disclosure.
Figure 18A:
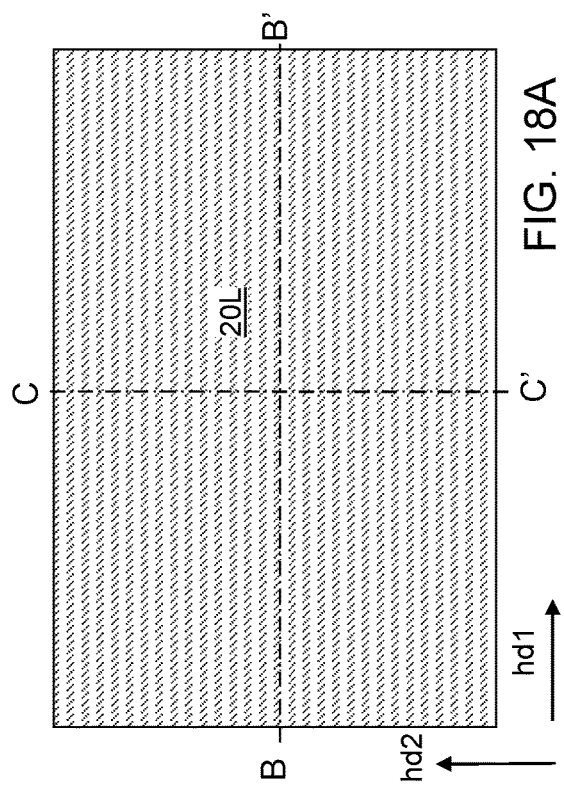
Figure 18B:
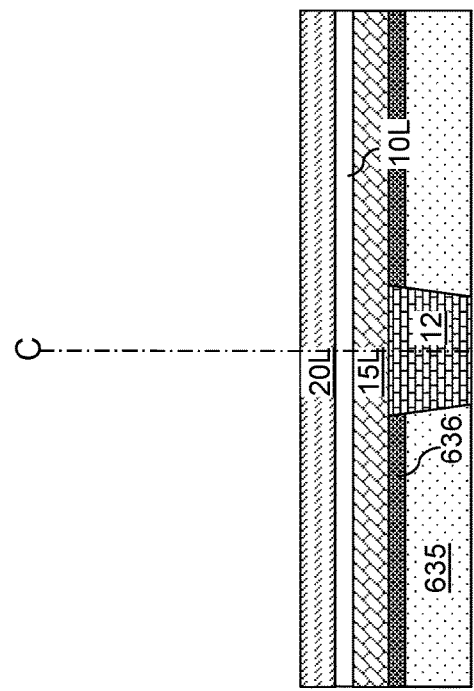

Referring to FIGS. 18A-18C, the continuous silicon oxide layer 136L may be removed selective to the material of the continuous binary metal oxide layer 20L. In one embodiment, a wet etch process using hot trimethyl-2 hydroxyethyl ammonium hydroxide ("hot TMY") or tetramethyl ammonium hydroxide (TMAH) may be performed to remove the continuous silicon oxide layer 136L.

Referring to FIGS. 19A-19C, the processing steps of FIGS. 5A-5C may be performed to pattern the continuous binary-metal oxide layer 20L into at least one binary-metal oxide active layer 20, which is an active layer of a thin film transistor. The continuous gate dielectric material layer 10L may be patterned into at least one gate dielectric 10, and the continuous gate electrode material layer 15L may be patterned into at least one gate electrode 15. The processing steps of FIGS. 6A-6C may be performed to form a dielectric material layer 40, and the processing steps of FIGS. 7A-7C and FIGS. 8A-8C may be performed to form a source electrode 52 and a drain electrode 56 on each active layer 20.

Figure 20A:
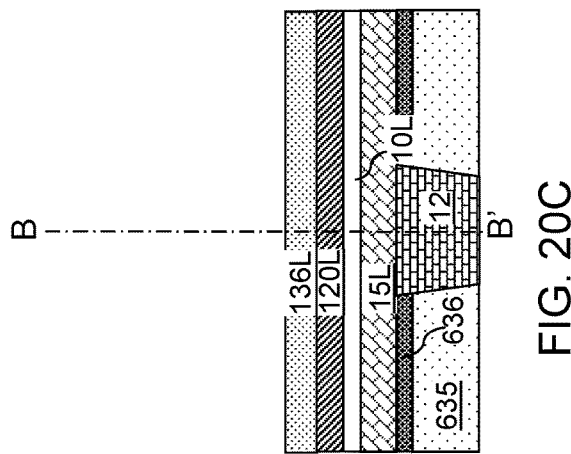
FIGS. 20A-20C are various views of a fifth configuration of a region of the structure after formation of a continuous gate electrode material layer, a continuous gate dielectric material layer, a continuous binary metal alloy layer, and a continuous silicon oxide layer according to an embodiment of the present disclosure.
Figure 20B:
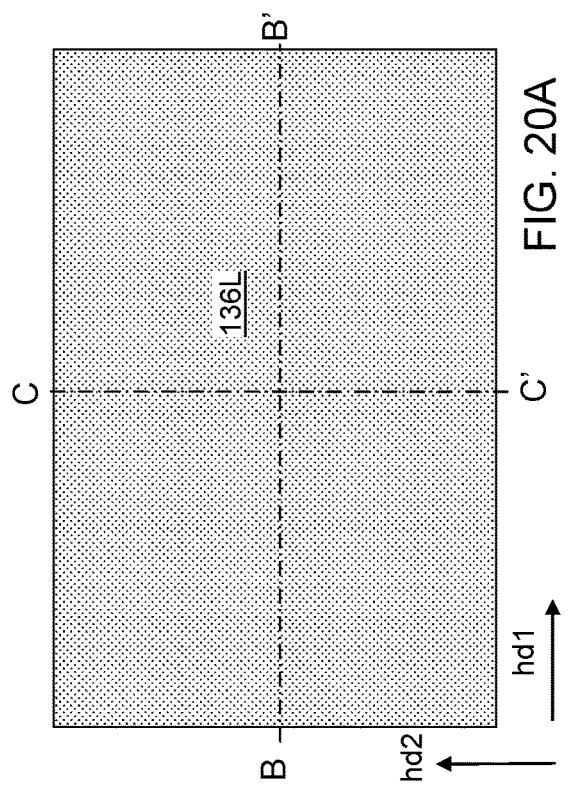
Figure 20C:
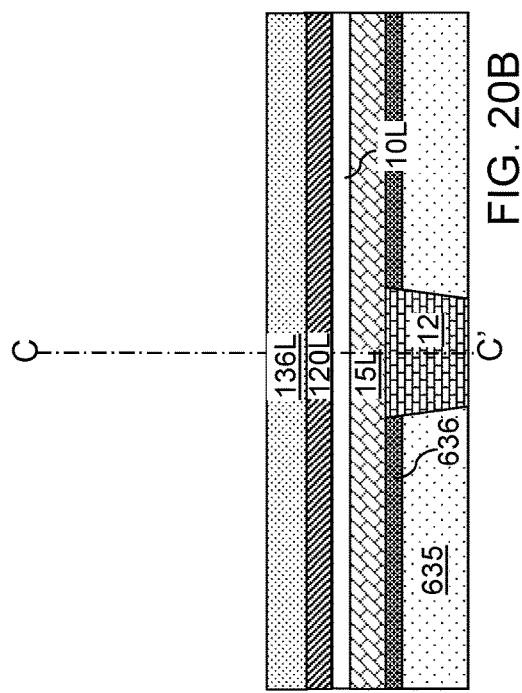

Referring to FIGS. 20A-20C, a fifth configuration of the structure may be derived from the fourth configuration of the structure illustrated in FIGS. 16A-16C by forming a continuous binary metal alloy layer 120L in lieu of the continuous ternary metal alloy layer 124L. The continuous binary metal alloy layer 120L in the fifth configuration may be the same as the continuous binary metal alloy layer in the first configuration.

Figure 21C:
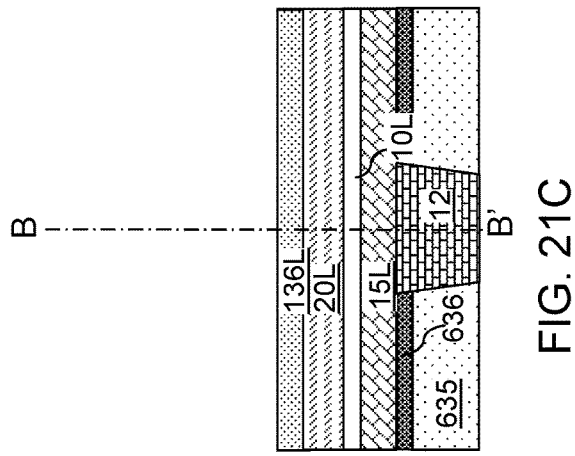
FIGS. 21A-21C are various views of the fifth configuration of a region of the structure after conversion of the continuous binary metal alloy layer into a continuous ternary-metal oxide layer according to an embodiment of the present disclosure.
Figure 21A:
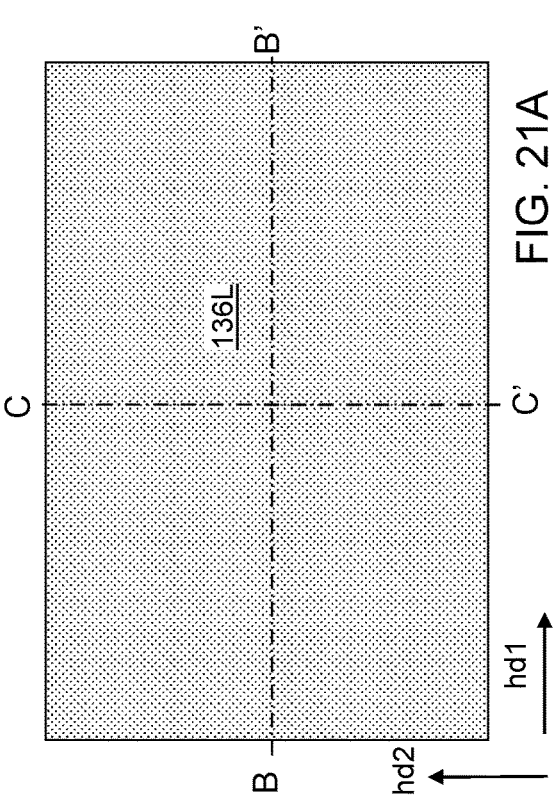
Figure 21B:
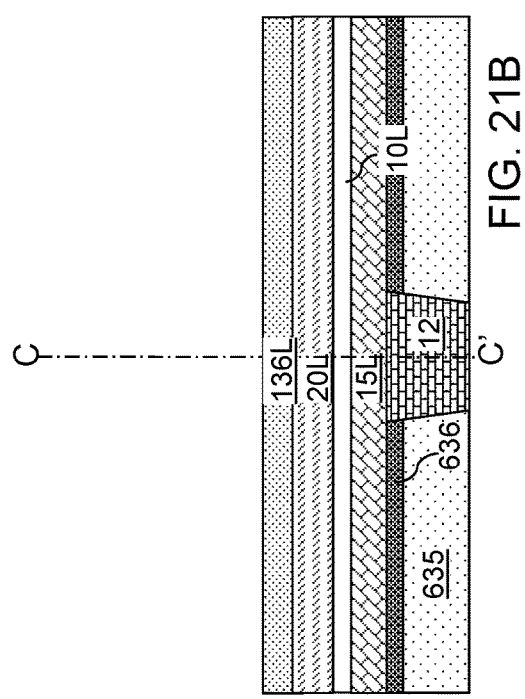

Referring to FIGS. 21A-21C, an oxidation process may be performed to convert the continuous binary metal alloy layer 120L into a continuous binary-metal oxide layer 20L. The continuous binary-metal oxide layer 20L includes an oxide compound material of the two atomic elements. In one embodiment, the oxidation of the continuous binary metal alloy layer 120L into the continuous binary-metal oxide layer 20L may be effected by performing at least one oxidation process selected from a thermal oxidation process in which the continuous binary metal alloy layer 120L may be heated to a temperature greater than 600 degrees Celsius at an oxidizing ambient; a plasma oxidation process; and a chemical oxidation process in which the continuous binary metal alloy layer 120L may be exposed to an oxidizing chemical solution. Oxygen atoms diffuse through the continuous silicon oxide layer 136L into the continuous binary metal alloy layer 120L and converts the continuous binary metal alloy layer 120L into the continuous binary-metal oxide layer 20L during the oxidation process. In one embodiment, the continuous binary metal alloy layer 120L comprises a tin-germanium alloy, and the oxide compound material of the continuous binary-metal oxide layer 20L has an average material composition of $GeSn_{1+\alpha}O_{3+\delta}$, in which $\alpha$ is in a range from −0.5 to 1.0, and $\delta$ is in a range from −0.5 to 1.0.

Figure 22C:
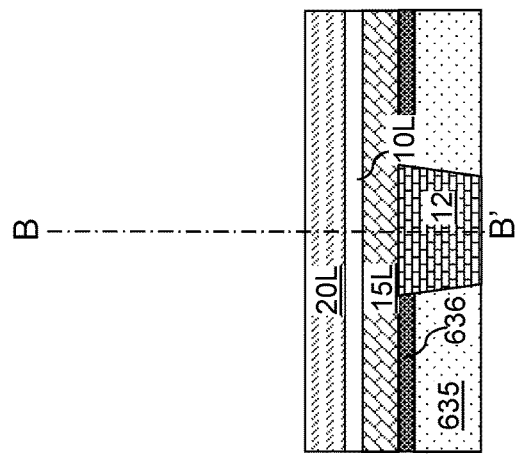
FIGS. 22A-22C are various views of the fifth configuration of a region of the structure after removal of the continuous silicon oxide layer according to an embodiment of the present disclosure.
Figure 22A:
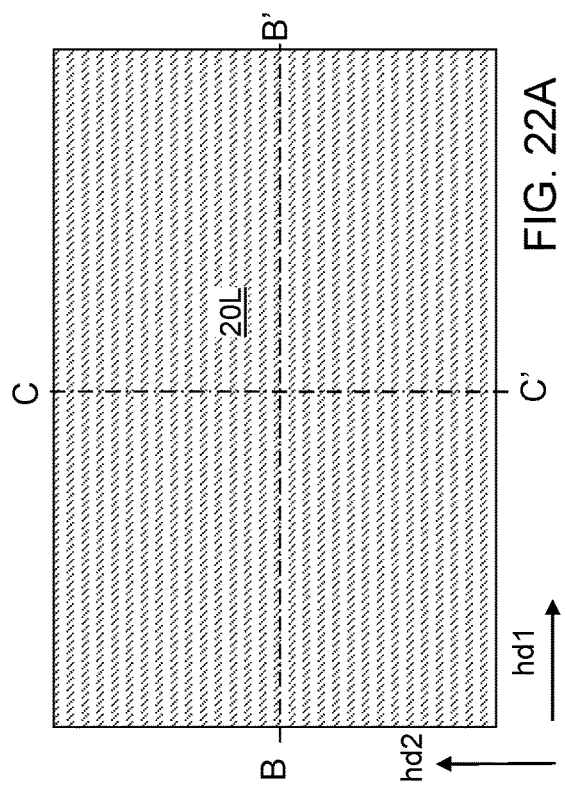
Figure 22B:
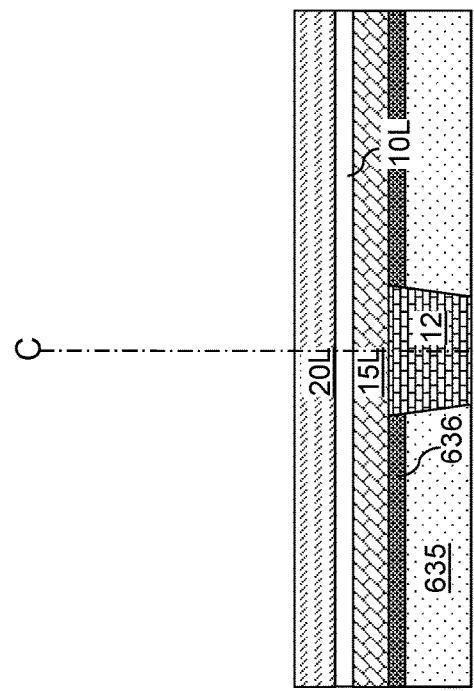

Referring to FIGS. 22A-22C, the continuous silicon oxide layer 136L may be removed selective to the material of the continuous binary-metal oxide layer 20L. In one embodiment, a wet etch process using hot trimethyl-2 hydroxyethyl ammonium hydroxide ("hot TMY") or tetramethyl ammonium hydroxide (TMAH) may be performed to remove the continuous silicon oxide layer 136L.

Referring to FIGS. 23A-23C, the processing steps of FIGS. 5A-5C may be performed to pattern the continuous binary-metal oxide layer 20L into at least one binary-metal oxide active layer 20, which is an active layer of a transistor, such as a thin film transistor. The continuous gate dielectric material layer 10L may be patterned into at least one gate dielectric 10, and the continuous gate electrode material layer 15L may be patterned into at least one gate electrode 15. The processing steps of FIGS. 6A-6C may be performed to form a dielectric material layer 40, and the processing steps of FIGS. 7A-7C and FIGS. 8A-8C may be performed to form a source electrode 52 and a drain electrode 56 on each active layer 20.

Figure 24C:
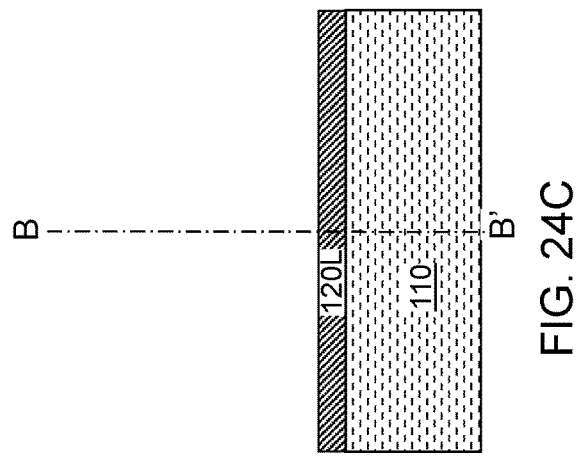
FIGS. 24A-24C are various views of a sixth configuration of a region of the structure after formation of a continuous binary metal alloy layer according to an embodiment of the present disclosure.
Figure 24A:
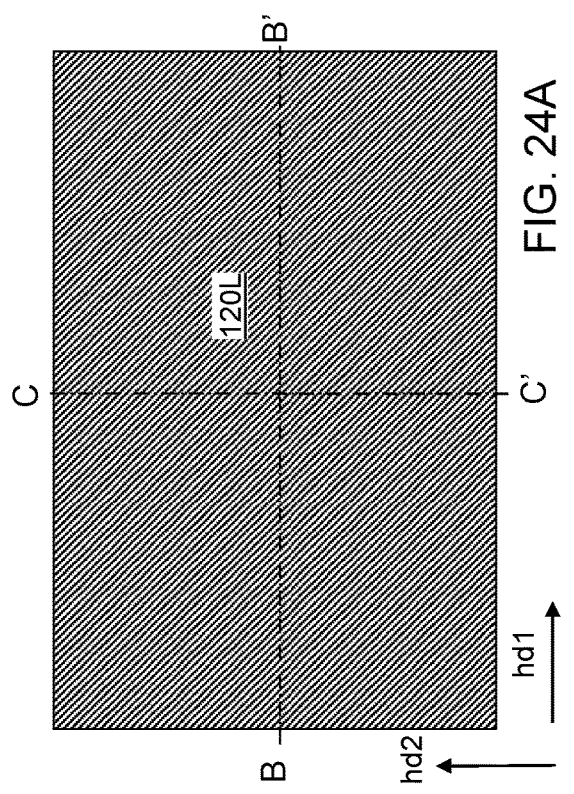
Figure 24B:
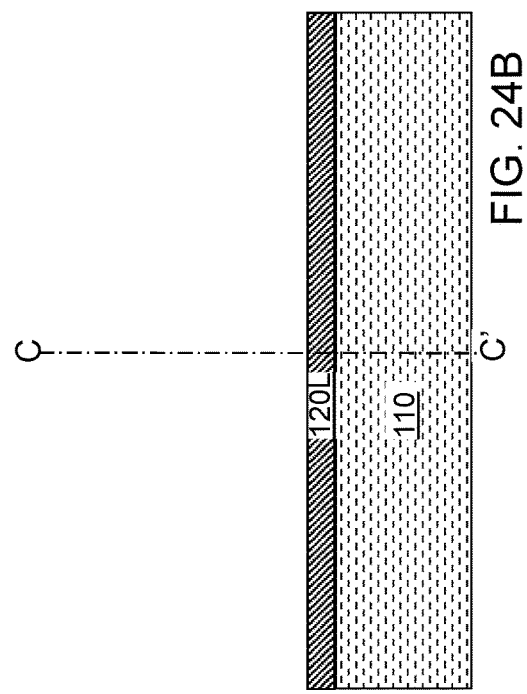

Referring to FIGS. 24A-24C, a sixth configuration of the structure may be provided by forming a continuous binary metal alloy layer 120L over a buffer layer 110. In one embodiment, the buffer layer 110 may be the insulating material layer 635 of the structure illustrated in FIG. 1, or may include an insulating material layer that may be formed over the insulating material layer 635 of the structure illustrated in FIG. 1. For example, the buffer layer 110 may include a silicon oxide layer, a silicon nitride layer, and/or a porous or non-porous organosilicate glass layer. Alternatively, the buffer layer 110 may include an insulating substrate such as a glass substrate or a sapphire substrate (i.e., an aluminum oxide substrate) having a thickness in a range from 60 microns to 1 mm.

A continuous binary-metal oxide layer 120L may be formed over the buffer layer 110. The continuous binary-metal oxide layer 120L in the sixth configuration of the structure may be the same as the continuous binary-metal oxide layer 120L in the first configuration of the structure.

Figure 25C:
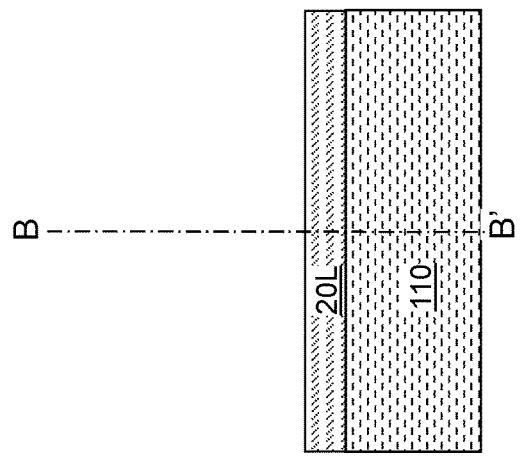
FIGS. 25A-25C are various views of the sixth configuration of a region of the structure after conversion of the continuous binary metal alloy layer into a continuous ternary-metal oxide layer according to an embodiment of the present disclosure.
Figure 25A:
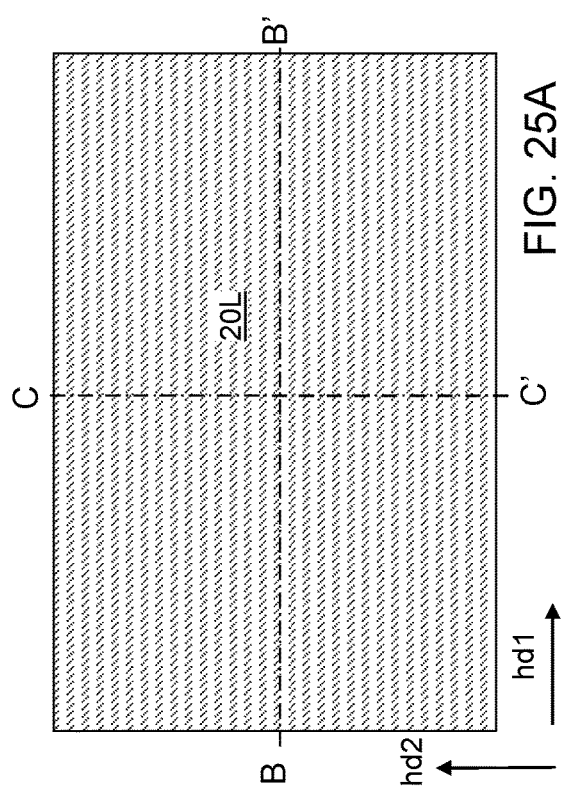
Figure 25B:
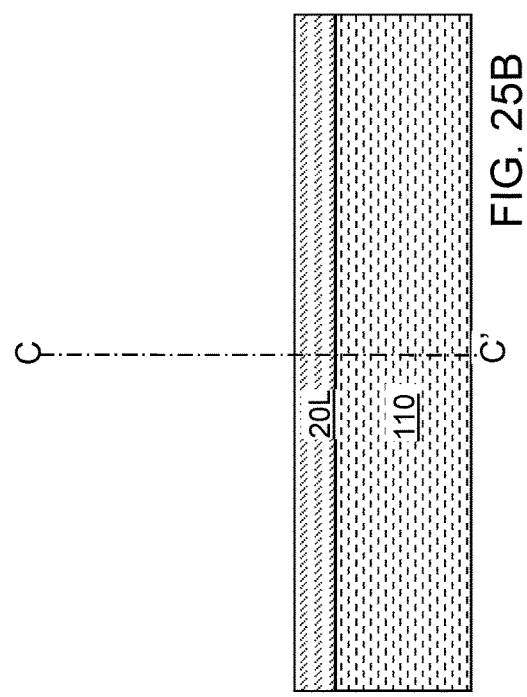

Referring to FIGS. 25A-25C, an oxidation process may be performed to convert the continuous binary metal alloy layer 120L into a continuous binary-metal oxide layer 20L. The processing steps described with reference to FIGS. 4A-4C may be performed. In one embodiment, the continuous binary metal alloy layer 120L comprises a tin-germanium alloy, and the oxide compound material of the continuous binary-metal oxide layer 20L has an average material composition of $GeSn_{1+\alpha}O_{3+\delta}$, in which $\alpha$ is in a range from −0.5 to 1.0, and $\delta$ is in a range from −0.5 to 1.0.

Referring to FIGS. 26A-26C, a photoresist layer (not shown) may be applied over the continuous binary-metal oxide layer 20L, and may be lithographically patterned to form at least one discrete photoresist material portion, such as a two-dimensional array of discrete photoresist material portions. An anisotropic etch process may be performed to etch unmasked portions of the continuous binary-metal oxide layer 20L. Each patterned portion of the continuous binary-metal oxide layer 20L may include a binary-metal oxide active layer 20, which is an active layer including an oxide of a binary metal alloy. The photoresist layer may be subsequently removed, for example, by ashing. In one embodiment, the binary-metal oxide active layer 20 may laterally extend horizontally with a uniform thickness. In one embodiment, the oxide compound material has an average material composition of $GeSn_{1+\alpha}O_{3+\delta}$, $\alpha$ is in a range from −0.5 to 1.0, and $\delta$ is in a range from −0.5 to 1.0.

Referring to FIGS. 27A-27C, a continuous gate dielectric material layer 30L and a continuous gate electrode material layer 35L may be deposited over the binary-metal oxide layer 20. The continuous gate dielectric material layer 30L may have the same material composition and the same thickness range as the continuous gate dielectric material layer 10L described above. The continuous gate electrode material layer 35L may have the same material composition and the same thickness range as the continuous gate electrode material layer 15L described above.

Referring to FIGS. 28A-28C, a photoresist layer (not shown) may be applied over the continuous gate electrode material layer 35L, and may be lithographically patterned into a pattern of at least one gate electrode. An anisotropic etch process may be performed to etch unmasked portions of the continuous gate electrode material layer 35L and the continuous gate dielectric material layer 30L. A patterned portion of the continuous gate electrode material layer 35L comprises a gate electrode 35. A patterned portion of the continuous gate dielectric material layer 30L comprises a gate dielectric 30. The photoresist layer may be subsequently removed, for example, by ashing.

Referring to FIGS. 29A-29C, a dielectric material such as undoped silicate glass, a doped silicate glass, or organosilicate glass may be deposited over each stack of a gate electrode 35, a gate dielectric 30, and a binary-metal oxide active layer 20 to form a dielectric material layer 40. The dielectric material may be planarized (e.g., with a CMP process) such that the top surface of the dielectric material layer 40 is coplanar with a top surface of the gate electrode 35.

Referring to FIGS. 30A-30C, a photoresist layer (not shown) may be applied over the dielectric material layer 40, and may be lithographically patterned to form discrete openings therein. The pattern of the discrete openings in the photoresist layer may be transferred through the dielectric material layer 40 by an anisotropic etch process to form a source cavity 51 and a drain cavity 59 over each active layer 20. The anisotropic etch process may be selective to the materials of the active layer 20. A top surface of the active layer 20 may be physically exposed at the bottom of the source cavity 51 and at the bottom of the drain cavity 59.

Referring to FIGS. 31A-31C, at least one conductive material may be deposited in the cavities (51, 59) and over the dielectric material layer 40. The at least one conductive material may include a metallic liner material and a metallic fill material. The metallic liner material may include a conductive metallic nitride or a conductive metallic carbide such as TiN, TaN, WN, TiC, TaC, and/or WC. The metallic fill material may include W, Cu, Al, Co, Ru, Mo, Ta, Ti, alloys thereof, and/or combinations thereof. Other suitable materials within the contemplated scope of disclosure may also be used.

Excess portions of the at least one conductive material may be removed from above the horizontal plane including the top surface of the dielectric material layer 40 by a planarization process, which may use a CMP process and/or a recess etch process. Other suitable planarization processes may be used. Each remaining portion of the at least one conductive material filling a source cavity 51 constitutes a source electrode 52. Each remaining portion of the at least one conductive material filling a drain cavity 59 constitutes a drain electrode 56. In one embodiment, the at least one conductive material may comprise a combination of the metallic liner material and the metallic fill material described above.

In one embodiment, each source electrode 52 may include a source metallic liner 53 that is a remaining portion of the metallic liner material, and a source metallic fill material portion 54 that is a remaining portion of the metallic fill material. Each drain electrode 56 may include a drain metallic liner 57 that is a remaining portion of the metallic liner material, and a drain metallic fill material portion 58 that is a remaining portion of the metallic fill material.

Figure 32C:
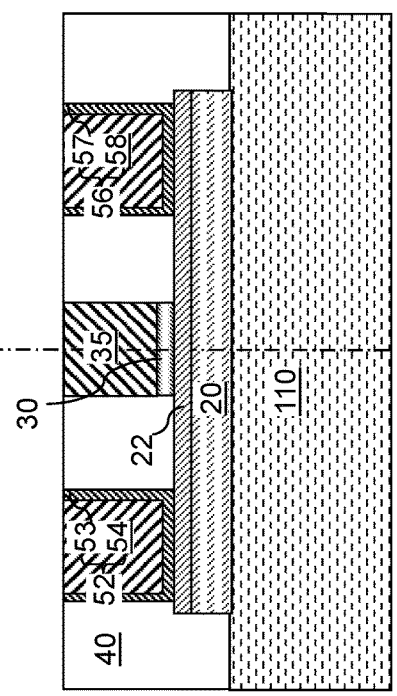
FIGS. 32A-32C are various views of a seventh configuration of a region of the structure after formation of an active layer, a gate dielectric, a gate electrode, a dielectric material layer, a source electrode and a drain electrode according to an embodiment of the present disclosure.
Figure 32A:
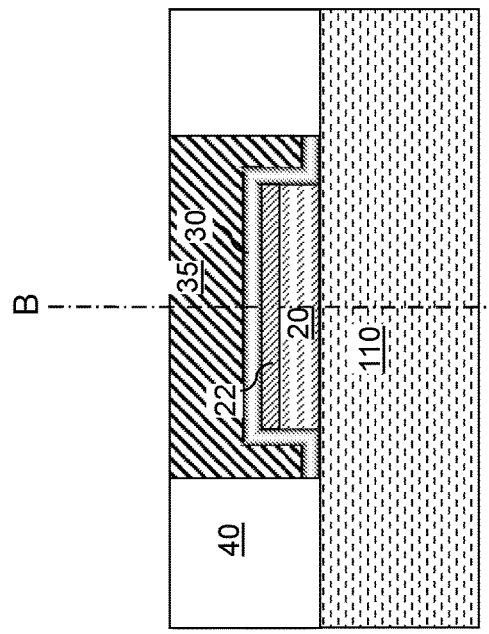
Figure 32B:
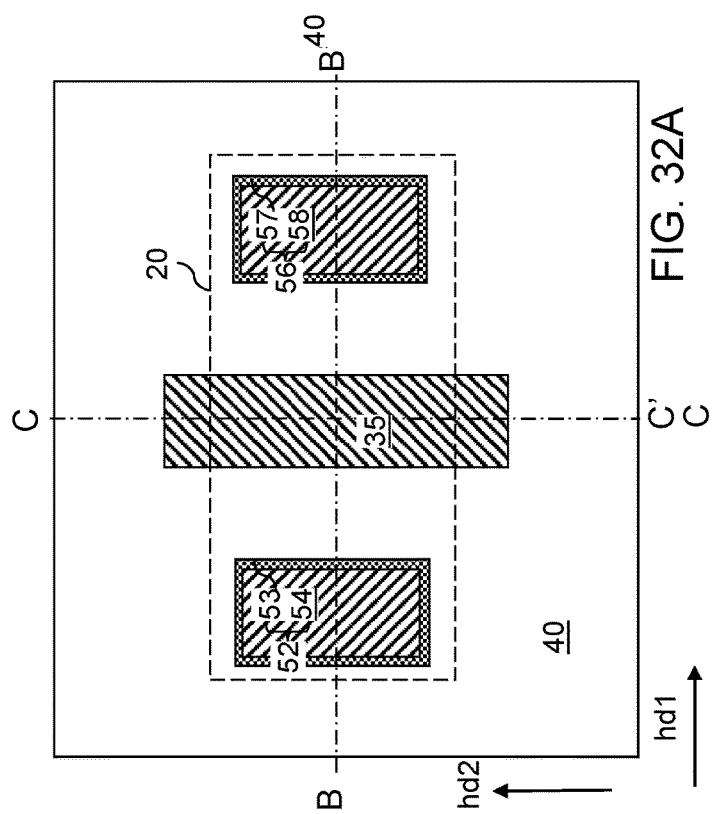

Referring to FIGS. 32A-32C, a seventh configuration of the structure may be derived from the sixth configuration of the structure by forming a combination of a continuous binary metal alloy layer 120L and discrete tin precipitates 122 as described with reference to FIGS. 9A-9C in lieu of the continuous binary metal alloy layer 120L described with reference to FIGS. 24A-24C. The processing steps described with reference to the second configuration of the structure may be performed to form an active layer, which may include a stack of a vertical stack of a binary-metal oxide active layer 20 and a tin oxide active layer 22.

Referring to FIGS. 33A-33C, an eighth configuration of the structure may be derived from the sixth configuration of the structure by forming a continuous ternary metal alloy layer 124L described with reference to FIGS. 13A-13C in lieu of the continuous binary metal alloy layer 120L described with reference to FIGS. 24A-24C. The processing steps described with reference to the third configuration of the structure may be performed to form an active layer, which may include a ternary-metal oxide active layer 24.

Figure 34C:
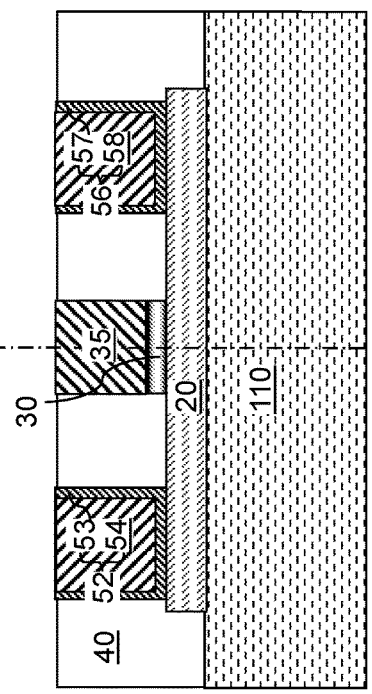
FIGS. 34A-34C are various views of a ninth configuration of a region of the structure after formation of an active layer, a gate dielectric, a gate electrode, a dielectric material layer, a source electrode and a drain electrode according to an embodiment of the present disclosure.
Figure 34A:
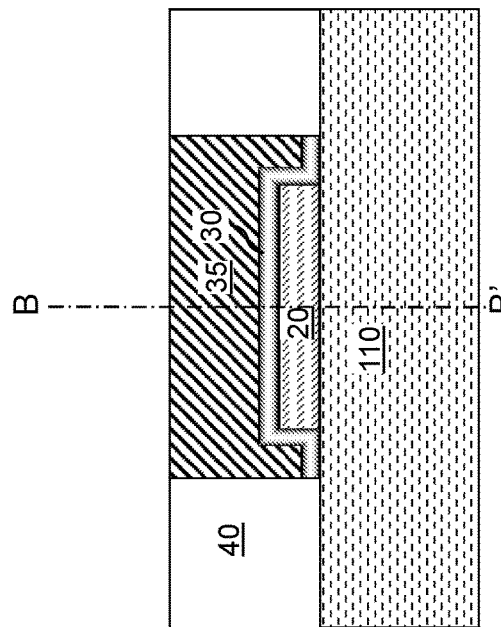
Figure 34B:
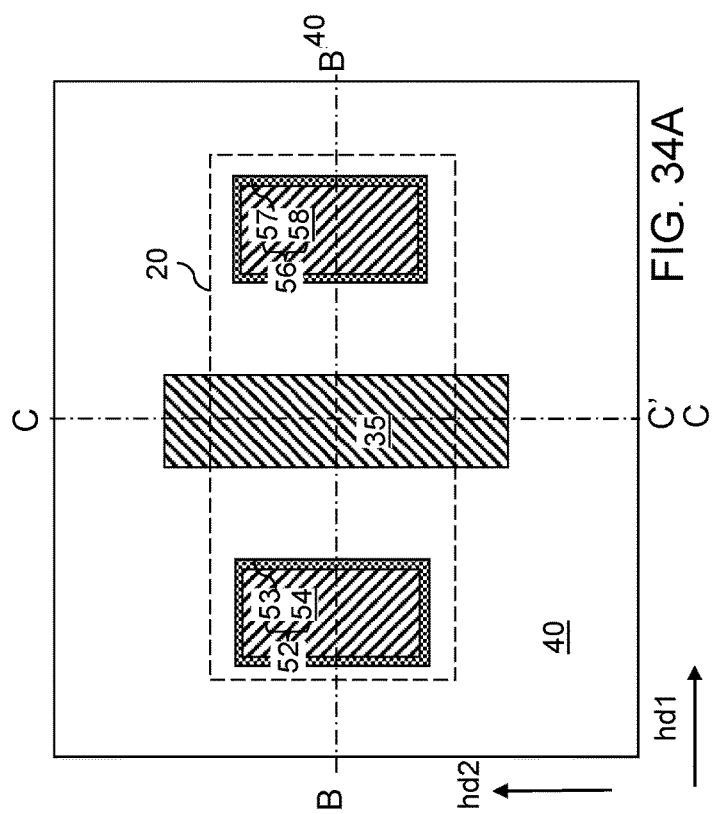

Referring to FIGS. 34A-34C, a ninth configuration of the structure may be derived from the sixth configuration of the structure by forming a vertical stack of a continuous ternary metal alloy layer 124L and a continuous silicon oxide layer 136L described with reference to FIGS. 16A-16C in lieu of the continuous binary metal alloy layer 120L described with reference to FIGS. 24A-24C. The processing steps described with reference to the fourth configuration of the structure may be performed to form an active layer, which may include a binary-metal oxide active layer 20.

Referring to FIGS. 35A-35C, a tenth configuration of the structure may be derived from the sixth configuration of the structure by forming a vertical stack of a continuous binary metal alloy layer 120L and a continuous silicon oxide layer 136L described with reference to FIGS. 20A-20C in lieu of the continuous binary metal alloy layer 120L described with reference to FIGS. 24A-24C. The processing steps described with reference to the fifth configuration of the structure may be performed to form an active layer, which may include a binary-metal oxide active layer 20.

FIGS. 36A-36H is a vertical cross-sectional view of an eleventh configuration of a region of the structure during formation of a thin film transistor according to an embodiment of the present disclosure.

Referring to FIG. 36A, a vertical stack of a source electrode 52, a dielectric spacer plate 55, and a drain electrode 56 may be formed over a buffer layer 110. The buffer layer 110 may be the same as in any of the previously described embodiments. In one embodiment, at least one source-connection metal interconnect structure (not expressly shown) can be provided within the buffer layer 110. The source electrode 52, the dielectric spacer plate 55, and the drain electrode 56 may be formed by sequentially forming a source electrode material layer, a dielectric spacer material layer, and a drain electrode material layer, and patterning the drain electrode material layer, the dielectric spacer material layer, and the source electrode material layer using a same etch mask (such as a patterned photoresist layer). The etch mask may be subsequently removed. The thickness of the dielectric spacer plate 55 may be the same as the channel length of a vertical field effect transistor to be subsequently formed.

Referring to FIG. 36B, any of the previously described processing steps for forming an active layer (20, 22, 24) may be used to form an active layer (20, 22, 24) that covers the top surface and the sidewalls of a pillar structure including a vertical stack of the source electrode 52, the dielectric spacer plate 55, and the drain electrode 56.

Referring to FIG. 36C, a gate dielectric layer 30 and a sacrificial matrix layer 43 may be formed over the active layer (20, 22, 24). The gate dielectric layer 30 may have the same material composition and the same thickness range as the gate dielectric layer 30 of previously described embodiments. The sacrificial matrix layer 43 may include a sacrificial material that may be subsequently removed selective to the material of the gate dielectric layer 30. For example, the sacrificial matrix layer 43 may include a semiconductor material such as amorphous silicon, a carbon-based material such as amorphous carbon, or a self-planarizing dielectric material such as spin-on-glass.

Referring to FIG. 36D, the sacrificial matrix layer 43, the gate dielectric layer 30, and the active layer (20, 22, 24) may be patterned so that each patterned portion of the active layer (20, 22, 24) is disjoined from neighboring patterned portions of the active layer (20, 22, 24). A combination of a lithographic patterning process and an anisotropic etch process may be used to pattern the sacrificial matrix layer 43, the gate dielectric layer 30, and the active layer (20, 22, 24) at this step.

Figure 36E:
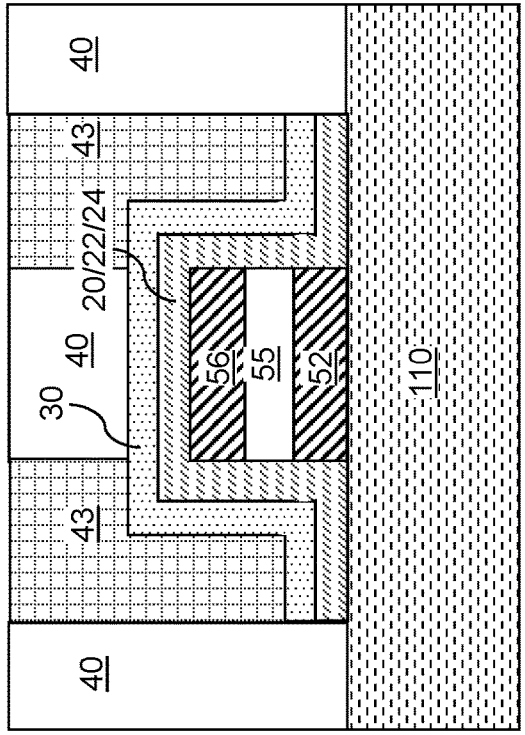

Referring to FIG. 36E, the sacrificial matrix layer 43 may be patterned such that patterned portions of the sacrificial matrix layer 43 remain only in regions in which replacement gate electrodes are to be subsequently formed. A combination of a lithographic patterning process and an anisotropic etch process may be used to pattern the sacrificial matrix layer 43 at this step.

Figure 36F:
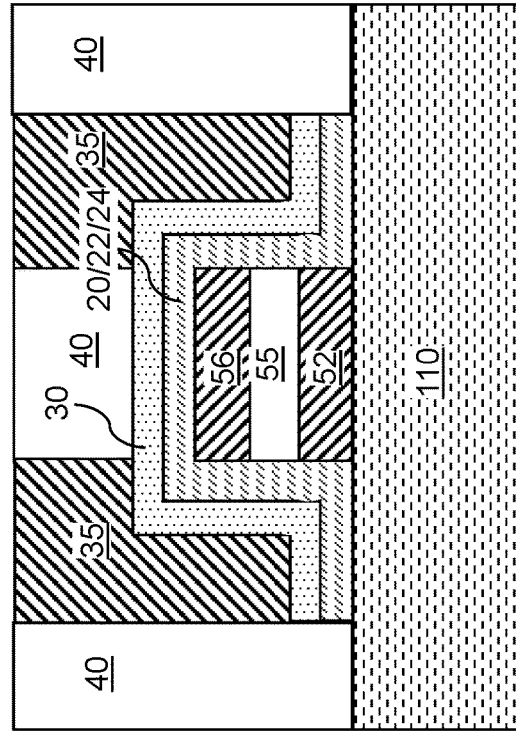

Referring to FIG. 36F, a dielectric fill material such as undoped silicate glass or a doped silicate glass can be deposited between remaining portions of the sacrificial matrix layer 43 to form a dielectric layer 40. The dielectric fill material may be planarized such that the top surface of the dielectric layer 40 is coplanar with the top surface of remaining portions of the sacrificial matrix layer 43.

Figure 36G:
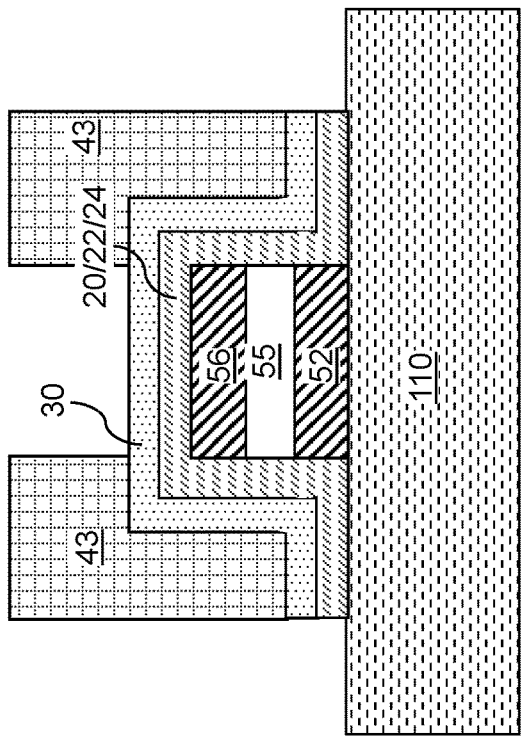

Referring to FIG. 36G, the sacrificial material of the sacrificial matrix layer 43 may be removed selective to the material of the dielectric layer 40 to form a gate cavity that laterally surrounds the pillar structure including a vertical stack of the source electrode 52, the dielectric spacer plate 55, and the drain electrode 56. The gate cavity may have a cylindrical configuration.

Figure 36H:
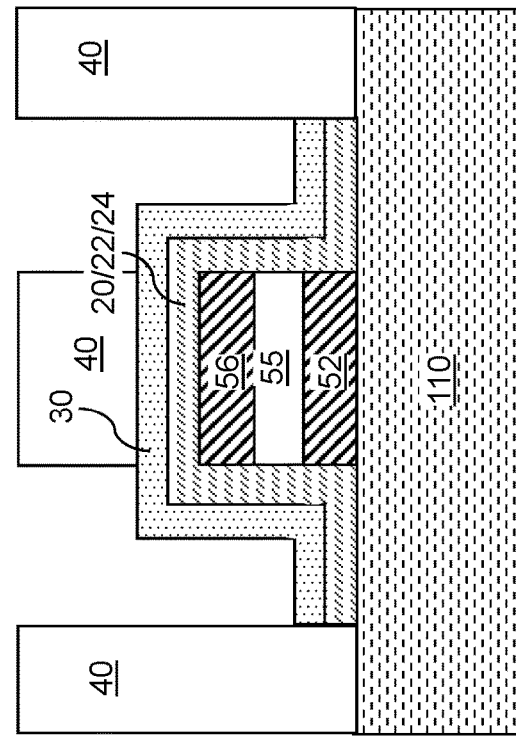

Referring to FIG. 36H, at least one conductive material, such as at least one metallic material, can be deposited in the gate cavity. Excess portions of the at least one conductive material may be removed from above the horizontal plane including the top surface of the dielectric layer 40. A remaining cylindrical portion of the at least one conductive material constitutes a gate electrode 35 having a gate-all-around configuration.

FIGS. 37A-37G is a vertical cross-sectional view of a twelfth configuration of a region of the structure during formation of a thin film transistor according to an embodiment of the present disclosure.

Referring to FIG. 37A, a source electrode material layer 52L may be formed over a buffer layer 110. The buffer layer 110 may be the same as in any of the previously described embodiments. The source electrode material layer 52L may include any material that may be used for any of the source electrodes 52 described above.

Referring to FIG. 37B, any of the previously described processing steps for forming an active layer (20, 22, 24) may be used to form an active layer (20, 22, 24) that covers the top surface of the source electrode material layer 52L.

Referring to FIG. 37C, a drain electrode material layer 56L may be formed over the active layer (20, 22, 24). The drain electrode material layer 56L may include any material that may be used for any of the source electrodes 52 described above.

Referring to FIG. 37D, a photoresist layer (not shown) may be applied over the drain electrode material layer 56L, and may be lithographically patterned to cover at least one discrete area. An anisotropic etch process may be performed to etch unmasked portions of the drain electrode material layer 56L, the active layer (20, 22, 24), and the source electrode material layer 52L. At least one pillar structure is formed, which comprises a vertical stack of a source electrode 52, an active layer (20, 22, 24), and a drain electrode 56. The source electrode 52, the active layer (20, 22, 24), and the drain electrode 56 within a same stack may have a same horizontal cross-sectional shape. The photoresist layer may be subsequently removed, for example, by ashing.

Figure 37E:
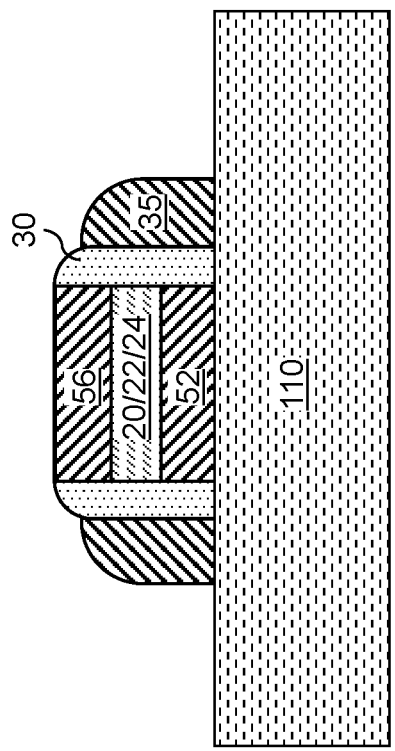

Referring to FIG. 37E, a gate dielectric material may be deposited, and may be optionally anisotropically etched to form a gate dielectric 30. The gate dielectric 30 may have the same material composition and the same thickness range as any of the gate dielectrics 30 described above.

Figure 37F:
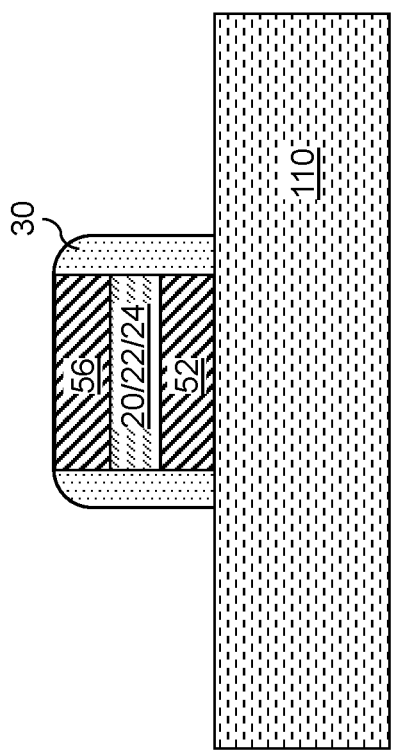

Referring to FIG. 37F, at least one conductive material, such as at least one metallic material, may be deposited over the pillar structure {52, (20, 22, 24), 56} and the gate dielectric 30, and may be anisotropically etched to form a gate electrode 35 having a tubular configuration. The gate electrode 35 may have the same material composition as any of the gate electrodes 35 described above. The thin film transistor has a gate-all-around configuration in which the gate electrode 35 laterally surrounds the active layer (20, 22, 24).

Figure 37G:
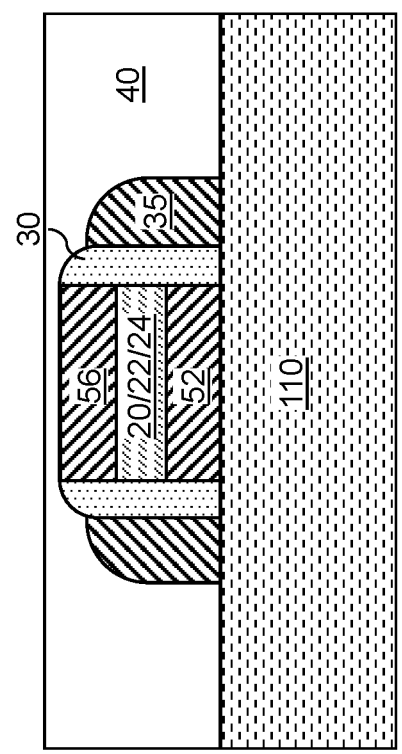

Referring to FIG. 37G, a dielectric material may be deposited and planarized to form a dielectric layer 40. Various contact via structures (not shown) and additional metal interconnect structures (not shown) may be formed as needed.

FIGS. 38A-38E is a vertical cross-sectional view of a thirteenth configuration of a region of the structure during formation of a thin film transistor according to an embodiment of the present disclosure.

Figure 38A:
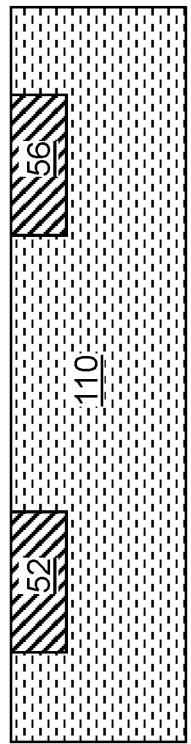
FIGS. 38A-38E is a vertical cross-sectional view of a thirteenth configuration of a region of the structure during formation of a thin film transistor according to an embodiment of the present disclosure.

Referring to FIG. 38A, a source cavity 51 and a drain cavity 59 may be formed in an upper portion of a buffer layer 110. The lateral spacing between the source cavity 51 and the drain cavity 59 may be the same as the channel length of a field effect transistor to be subsequently formed. The depth of the source cavity 51 and the drain cavity 59 may be in a range from 3 nm to 100 nm, although lesser and greater depths may also be used.

Figure 38B:
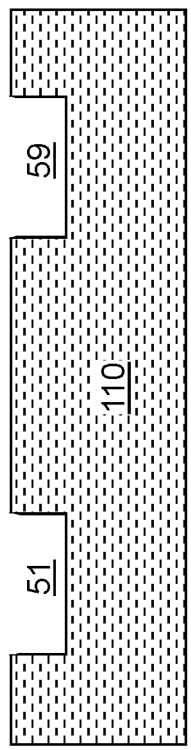

Referring to FIG. 38B, at least one conductive material, such as at least one metallic material, may be deposited in the source cavity 51 and the drain cavity 59. A planarization process such as a chemical mechanical polishing process may be performed to remove the at least one conductive material from above the horizontal plane including the top surface of the buffer layer 110. A remaining portion of the at least one conductive material filling the source cavity 51 constitutes a source electrode 52, and a remaining portion of the at least one conductive material filling the drain cavity 59 constitutes a drain electrode 56.

Figure 38C:
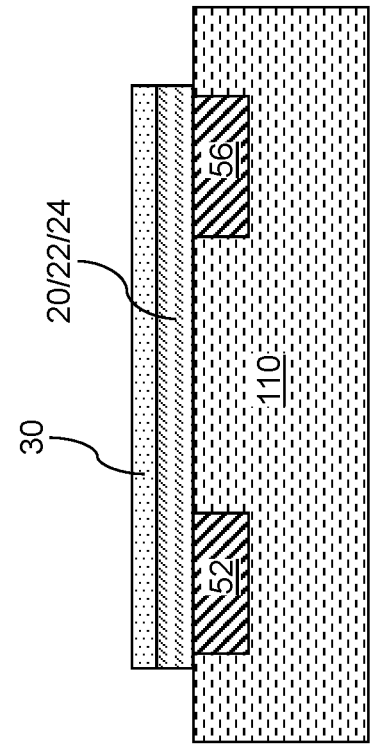

Referring to FIG. 38C, any of the previously described processing steps for forming an active layer (20, 22, 24) may be used to form an active layer (20, 22, 24) over the source electrode 52 and the drain electrode 56.

Figure 38D:
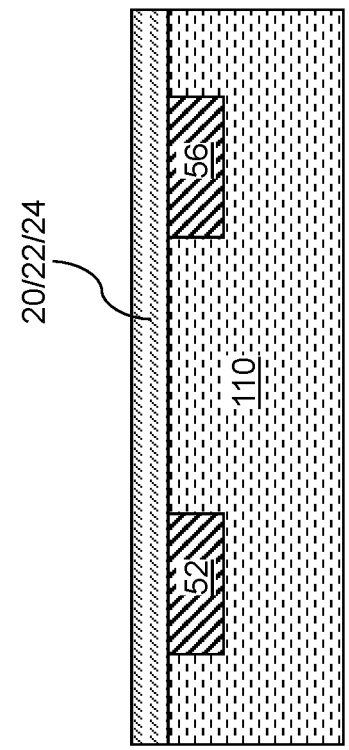

Referring to FIG. 38D, a gate dielectric material may be formed over the active layer (20, 22, 24) to form a gate dielectric 30. The gate dielectric 30 and the active layer (20, 22, 24) may be patterned, for example, by forming a patterned photoresist layer over the gate dielectric 30, and by removing unmasked portions of the gate dielectric 30 and the active layer (20, 22, 24). The photoresist layer may be subsequently removed, for example, by ashing.

Figure 38E:
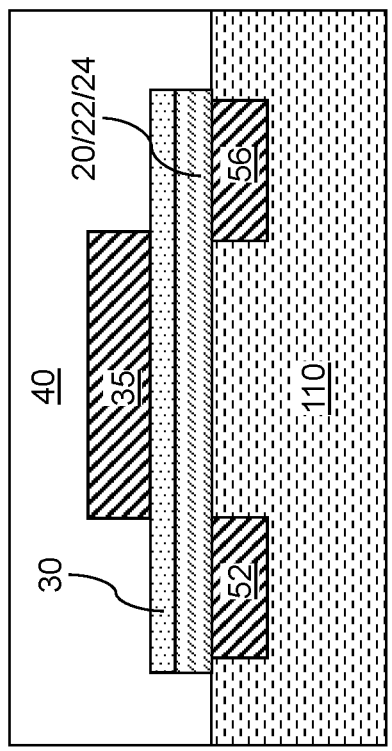

Referring to FIG. 38E, at least one conductive material, such as at least one metallic material, may be deposited over the gate dielectric 30, and may be patterned to form a gate electrode 35. A dielectric layer 40 can be formed around the gate electrode 35. Various contact via structures (not shown) may be formed through the dielectric layer 40 as needed.

FIGS. 39A-39F is a vertical cross-sectional view of a fourteenth configuration of a region of the structure during formation of a thin film transistor according to an embodiment of the present disclosure.

Figure 39A:
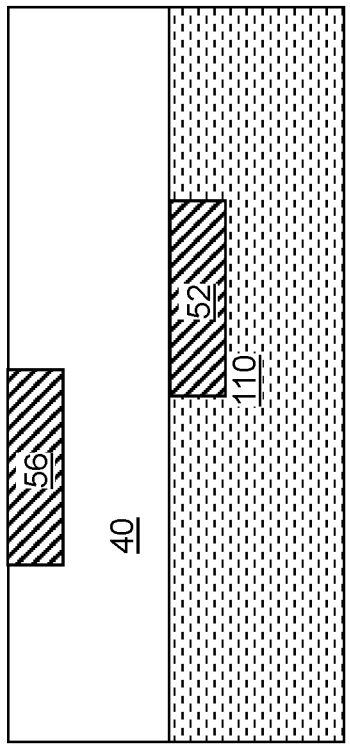
FIGS. 39A-39F is a vertical cross-sectional view of a fourteenth configuration of a region of the structure during formation of a thin film transistor according to an embodiment of the present disclosure.

Referring to FIG. 39A, a source electrode 52 may be formed in an upper portion of a buffer layer 110, for example, by forming a source cavity and by depositing and planarizing at least one conductive material such as at least one metallic material. The top surface of the source electrode 52 may be coplanar with the top surface of the buffer layer 110.

Figure 39B:
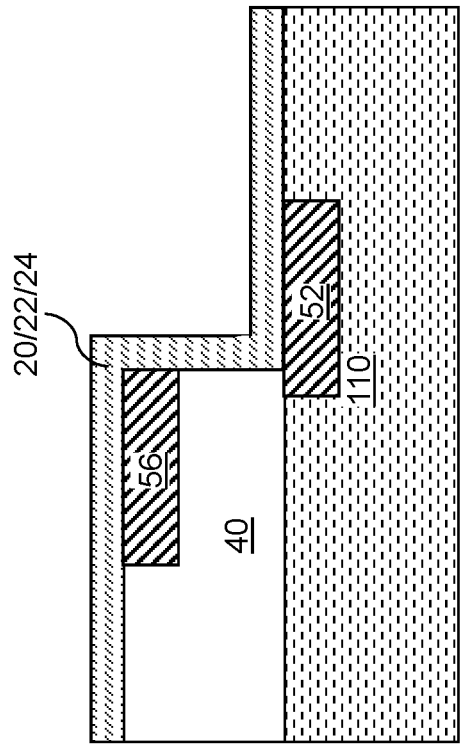

Referring to FIG. 39B, a dielectric layer 40 may be deposited over the source electrode 52 and the buffer layer 110. A drain electrode 56 may be formed in an upper portion of the dielectric layer 40, for example, by forming a drain cavity and by depositing and planarizing at least one conductive material such as at least one metallic material. The top surface of the drain electrode 56 may be coplanar with the top surface of the dielectric layer 40. An edge of the drain electrode 56 may be located within an area of the source electrode 52 in a top-down view such that a fraction of the area of the source electrode 52 does not have an areal overlap with the drain electrode 56.

Figure 39C:
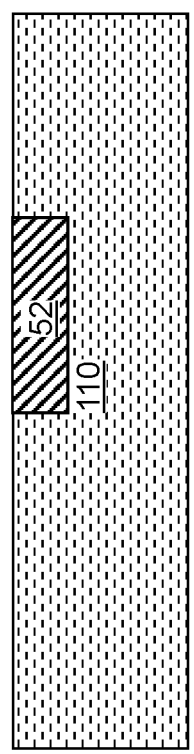

Referring to FIG. 39C, a photoresist layer (not shown) may be applied over the dielectric layer 40 and the drain electrode 56, and may be lithographically patterned to cover a portion of the drain electrode 56 without covering an area of the source electrode 52 that does not have an areal overlap with the drain electrode 56. An anisotropic etch process may be performed to remove portions of the dielectric layer 40 that are not masked by the photoresist layer. The anisotropic etch process may, or may not, be selective to the material of the drain electrode 56. A sidewall of the drain electrode 56 may be physically exposed after the anisotropic etch process. Further, a sidewall of the dielectric layer 40 may vertically extend from a bottom periphery of a sidewall of the drain electrode 56 to a top surface of the source electrode 52, and a portion of the top surface of the source electrode 52 may be physically exposed. The photoresist layer may be subsequently removed.

Figure 39D:
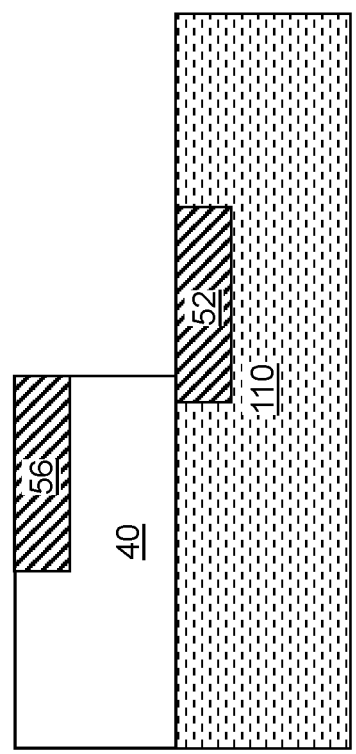

Referring to FIG. 39D, any of the previously described processing steps for forming an active layer (20, 22, 24) may be used to form an active layer (20, 22, 24) over the source electrode 52 and the drain electrode 56. The active layer (20, 22, 24) may include two horizontally-extending portions that are adjoined by a vertically-extending portion.

Figure 39E:
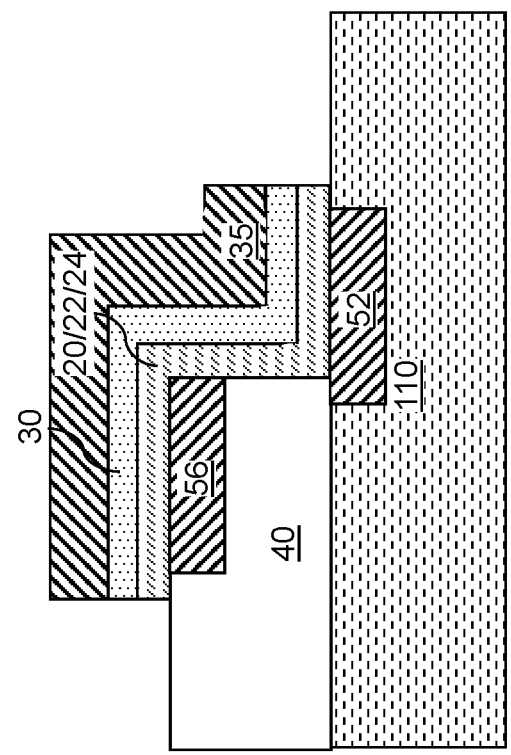

Referring to FIG. 39E, a gate dielectric 30 and a gate electrode material layer 35L may be formed over the active layer (20, 22, 24) by deposition of a gate dielectric material and at least one gate electrode material.

Figure 39F:
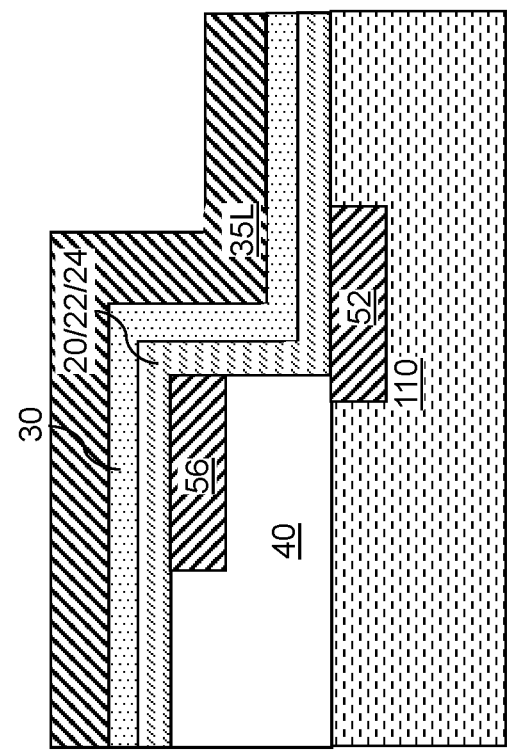

Referring to FIG. 39F, the gate electrode material layer 35L, the gate dielectric 30, and the active layer (20, 22, 24) may can be patterned, for example, by forming a patterned photoresist layer (not shown) over the gate electrode material layer 35L, and by etching portions of the gate electrode material layer 35L, the gate dielectric 40, and the active layer (20, 22, 24) that are not masked by the patterned photoresist layer. A patterned portion of the gate electrode material layer 35L comprises a gate electrode 35. The photoresist layer can be removed, for example, by ashing.

Figure 40:
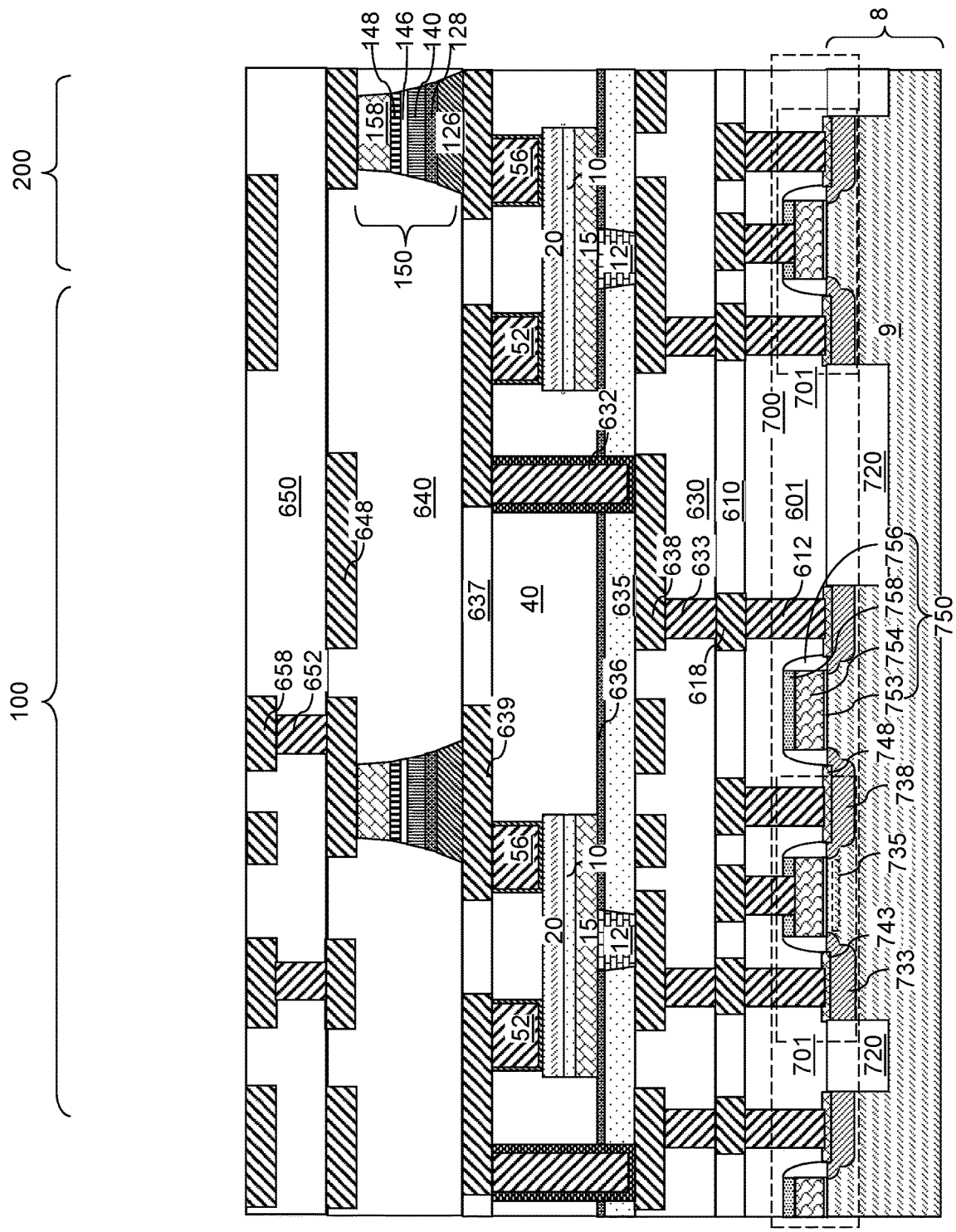
FIG. 40 is a vertical cross-sectional view of a structure after formation of memory cells according to an embodiment of the present disclosure.

Referring to FIG. 40, a structure is illustrated, which may be derived from any of the previously described structures by subsequently forming additional structures thereupon. In some embodiments, structures located underneath the bottom surface of the dielectric layer 40 may be replaced with a buffer layer 110. For example, second metal via structures 632 may be formed through the dielectric material layer 40 and the insulating material layer 635 on a respective one of the third metal line structures 639 concurrently with, before, or after, formation of the source electrodes 52, the drain electrodes 56, and the optional top gate electrodes 35.

A dielectric layer, which is herein referred to as a third line-level dielectric layer 637, may be deposited over the dielectric material layer 40. Third metal line structures 639 may be formed in the third line-level dielectric layer 637 on a respective one of the metallic structures (52, 56, 632) embedded within the dielectric material layer 40.

Additional metal interconnect structures embedded in additional dielectric layers may be subsequently formed over the transistors, such as thin film transistors, and the third line-level dielectric layer 637. In an illustrative example, the dielectric layers may include, for example, a fourth interconnect-level dielectric layer 640, a fifth interconnect-level dielectric layer 650, etc. The additional metal interconnect structures may include third metal via structures (not illustrated) and fourth metal lines 648 embedded in the fourth interconnect-level dielectric layer 640, fourth metal via structures 652 and fifth metal line structures 658 embedded in the fifth interconnect-level dielectric layer 650, etc.

Optionally, memory cells 150 may be formed below, above, or at the same level as, the transistors. In embodiments in which the transistors are formed as a two-dimensional periodic array, the memory cells 150 may be formed as a two-dimensional periodic array of memory cells 150. Each memory cell 150 may include a magnetic tunnel junction, a ferroelectric tunnel junction, a phase change memory material, or a vacancy-modulated conductive oxide material portion. Further, each memory cell 150 may include a first electrode 126 including a metallic material, and a second electrode 158 including a metallic material and protecting an underlying data-storing portion of the memory cell 150. A memory element is provided between the first electrode 126 (i.e., the bottom electrode) and the second electrode 158 (i.e., the top electrode).

In an illustrative example, in embodiments in which the memory cell 150 includes a magnetic tunnel junction, the memory cell 150 may include a layer stack including, from bottom to top, a first electrode 126, a metallic seed layer 128 that facilitates crystalline growth of overlying material layers, a synthetic antiferromagnet (SAF) structure 140, a tunneling barrier layer 146, a free magnetization layer 148, and a second electrode 158. While the present disclosure is described using an embodiment in which the transistors, such as thin film transistors, are used as access transistors for memory cells 150, embodiments are expressly contemplated herein in which the transistors are used as logic devices, as components of a peripheral circuit for a memory array, or for any other semiconductor circuitry.

In one embodiment, the substrate 8 may include a single crystalline silicon substrate. Lower-level dielectric layers (601, 610, 630) embedding lower-level metal interconnect structures (613, 618, 633, 638) may be located between the single crystalline silicon substrate and the insulating layer 635. Field effect transistors 701 including a respective portion of the single crystalline silicon substrate as a channel may be embedded within the lower-level dielectric layers (601, 610, 630), and may be electrically connected to at least one of the gate electrodes (15, 35), the source electrodes 52, and the drain electrodes 56.

Figure 41:
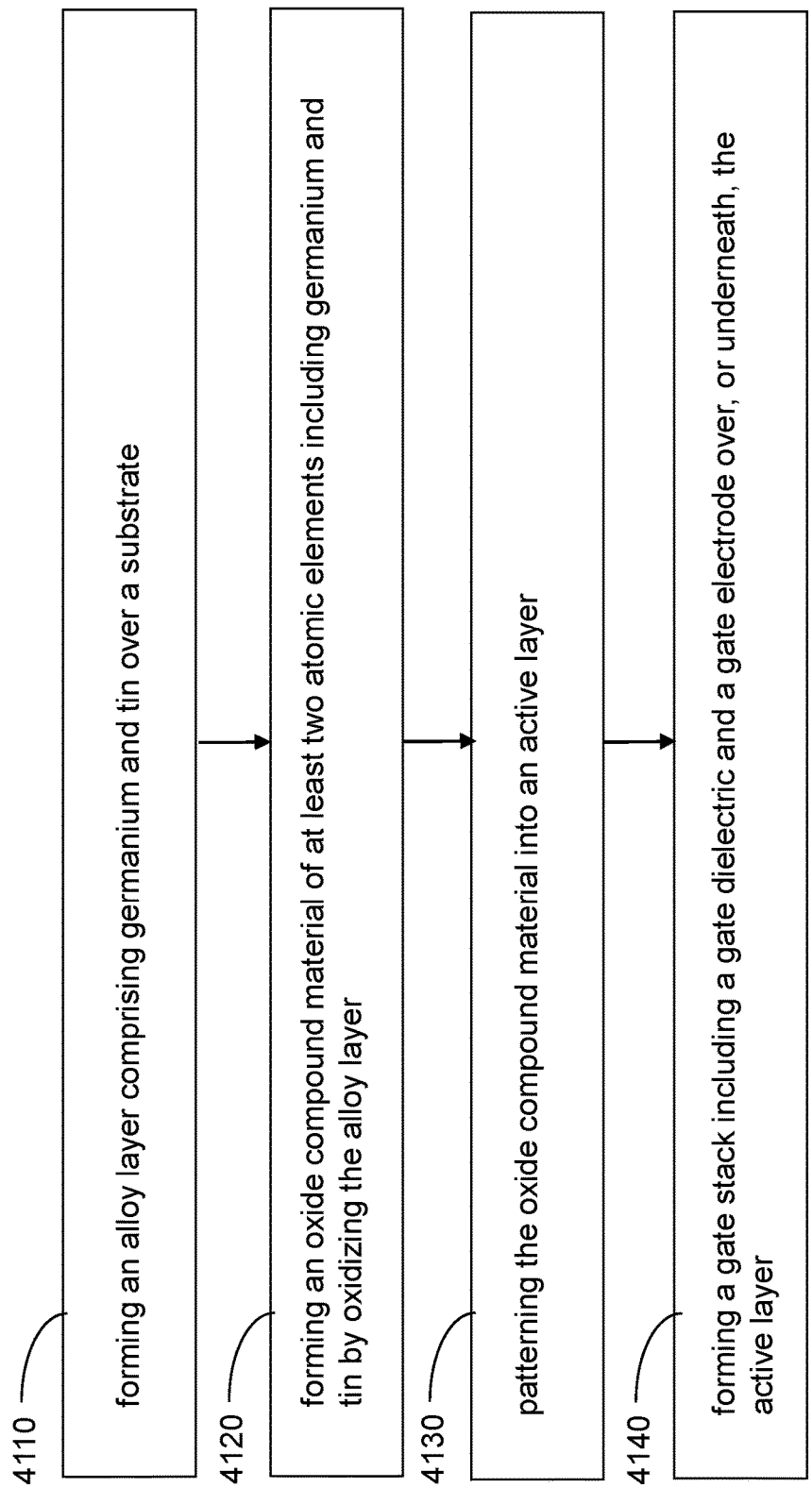
FIG. 41 is a flowchart that illustrates the general processing steps for manufacturing the semiconductor devices of the present disclosure.

Referring to FIG. 41, a flowchart illustrates the general processing steps for manufacturing the semiconductor devices of the present disclosure.

Referring to step 4110 and FIGS. 2A-3C, 9A-9C, 13A-13C, 16A-16C, 20A-20C, 24A-24C, 32A-35C, 36A and 36B, 37A and 37B, 38A-38C, and 39A-39D, an alloy layer (120L, 124L) comprising at least two atomic elements including a first element of tin and a second element selected from Ge, Si, P, S, F, Ti, Cs, and Na may be formed over a substrate 8.

Referring to step 4120 and FIGS. 4A-4C, 10A-11C, 14A-14C, 17A-17C, 21A-21C, 25A-25C, 32A-35C, 36A and 36B, 37A and 37B, 38A-38C, and 39A-39D, an oxide compound material of the at least two atomic elements may be formed by oxidizing the alloy layer (120L, 124L).

Referring to step 4130 and FIGS. 5A-5C, 12A-12C, 15A-15C, 18A-19C, 22A-23C, 26A-26C, 32A-35C, 36A and 36B, 37A and 37B, 38A-38C, and 39A-39D, the oxide compound material is patterned into an active layer (20, 22, 24).

Referring to step 4140 and FIGS. 6A-8C, 12A-12C, 15A-15C, 19A-19C, 23A-23C, 27A-35C, 36C—36H, 37C—37G, 38D and 38E, and 39E and 39F, a gate stack including a gate dielectric (10, 30) and a gate electrode (15, 35) may be formed over, or underneath, the active layer (20, 22, 24). The gate dielectric (10, 30) contacts the active layer (20, 22, 24) upon formation of the gate dielectric (10, 30) and the active layer (20, 22, 24).

Referring to all drawings and according to various embodiments of the present disclosure, a semiconductor structure including a first field effect transistor is provided. The first field effect transistor may include: a layer {20, 22, 24} comprising an oxide compound material of at least two atomic elements including a first element of tin and a second element selected from Ge, Si, P, S, F, Ti, Cs, and Na and located over a substrate 8; a gate dielectric (10, 30) located on the active layer {20, 22, 24}; a gate electrode (15, 35) located on the gate dielectric (10, 30); and a source electrode 52 and a drain electrode 56 contacting a respective portion of the active layer {20, 22, 24}.

In one embodiment, the layer comprising an oxide compound material is an active layer {20, 22, 24} and wherein the active layer and the gate dielectric (10, 30) laterally extend horizontally with a respective substantially uniform thickness, and have a substantially same area in a plan view; and the gate electrode (15, 35) laterally extends horizontally with a uniform gate electrode thickness, and has an area that is equal to an areas of the active layer {20, 22, 24} and the gate dielectric (10, 30) in the plan view. In one embodiment, the oxide compound material is in direct contact with the gate dielectric.

In one embodiment, the second element is Ge. In one embodiment, the oxide compound material has an average material composition of $GeSn_{1+\alpha}O_{3+\delta}$, $\alpha$ is in a range from −0.5 to 1.0, and $\delta$ is in a range from −0.5 to 1.0.

In one embodiment, the active layer further includes a tin oxide layer 22 contacting the oxide compound material.

In one embodiment, the oxide compound material has an average material composition of $Si_{\beta}Ge_{1-\beta}Sn_{1+\alpha}O_{3+\delta}$, $\beta$ is in a range from 0.001 to 0.9, a is in a range from −0.5 to 0.5, and $\delta$ is in a range from −0.5 to 1.0.

In one embodiment, the oxide compound material is doped with silicon atoms such that an atomic concentration of the silicon atoms increases within the oxide compound material with a vertical distance from the substrate 8.

In one embodiment, the oxide compound material has a compositional gradient in which an atomic concentration of oxygen atoms increases within the oxide compound material with a vertical distance from the substrate 8.

In one embodiment, the semiconductor structure comprises: a field effect transistor located on the substrate 8 and comprising a single crystalline semiconductor channel composed primarily of silicon; and metal interconnect structures (612, 618, 633, 638, 632, 639) connected to the field effect transistor and surrounded by insulating dielectric material layers (601, 610, 630, 635, 40), wherein at least one of the gate electrode (15, 35), the source electrode 52 and a drain electrode 56 of the first field effect transistor is electrically connected to the metal interconnect structures (612, 618, 633, 638, 632, 638).

According to an aspect of the present disclosure, a semiconductor structure comprising a first field effect transistor is provided. The first field effect transistor comprises: a gate electrode (15, 35) located over a substrate 8; a gate dielectric (10, 30) located on a top surface or a bottom surface of the gate electrode (15, 35); an active layer {20, 22, 24} comprising an oxide compound material of at least two atomic elements including a first element of tin and a second element selected from Ge, Si, P, S, F, Ti, Cs, and Na and in contact with the gate dielectric (10, 30); and a source electrode 52 and a drain electrode 56 contacting a respective portion of the active layer {20, 22, 24}.

In one embodiment, the substrate 8 comprises a material selected from an insulating material, a semiconductor material, and a metallic material.

In one embodiment, the oxide compound material has a compositional gradient in which an atomic concentration of oxygen atoms increases within the oxide compound material with a vertical distance from the substrate.

The various embodiments of the present disclosure may be used to provide a semiconductor device including an oxide compound material of at least two atomic elements including a first element of tin and a second element selected from Ge, Si, P, S, F, Ti, Cs, and Na. In some embodiments, the oxide compound material may be a p-type oxide compound semiconductor material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure including a first field effect transistor, the first field effect transistor comprising:
   an active layer comprising a layer of an oxide compound material of at least two atomic elements including a first element of tin and a second element selected from Ge, P, S, F, Ti, Cs, and Na and located over a substrate, wherein the oxide compound material is doped with silicon atoms such that an atomic concentration of the silicon atoms increases within the oxide compound material with an increase in a vertical distance from the substrate;
   a gate dielectric located on the active layer;
   a gate electrode located on the gate dielectric; and
   a source electrode and a drain electrode contacting a respective portion of the active layer.

2. The semiconductor structure of claim 1, wherein:
   the layer comprising the oxide compound material is an active layer, and wherein the active layer and the gate dielectric laterally extend horizontally with a respective substantially uniform thickness, and have a substantially same area in a plan view; and
   the gate electrode laterally extends horizontally with a substantially uniform gate electrode thickness, and has an area equal to the area of the active layer and the gate dielectric in the plan view.

3. The semiconductor structure of claim 1, wherein the oxide compound material is in direct contact with the gate dielectric.

4. The semiconductor structure of claim 1, wherein the second element is Ge.

5. The semiconductor structure of claim 4, wherein the active layer further comprises a tin oxide layer contacting the oxide compound material.

6. The semiconductor structure of claim 4, wherein the oxide compound material has an average material composition of $Si_{\beta}Ge_{1-\beta}Sn_{1+\alpha}O_{3+\delta}$, $\beta$ is in a range from 0.001 to 0.9, $\alpha$ is in a range from −0.5 to 0.5, and $\delta$ is in a range from −0.5 to 1.0.

7. The semiconductor structure of claim 4, wherein the oxide compound material has a compositional gradient in which an atomic concentration of oxygen atoms increases within the oxide compound material with the increase in the vertical distance from the substrate.

8. The semiconductor structure of claim 4, wherein a germanium-to-silicon ratio increases within the oxide compound material with the vertical distance from the substrate.

9. The semiconductor structure of claim 1, further comprising:

a second field effect transistor located on the substrate and comprising a single crystalline semiconductor channel composed primarily of silicon; and metal interconnect structures connected to the second field effect transistor and surrounded by dielectric material layers, wherein at least one of the gate electrode, the source electrode, and the drain electrode of the first field effect transistor is electrically connected to the metal interconnect structures.

10. A semiconductor structure comprising a first field effect transistor, the first field effect transistor comprising:

a gate electrode located over a substrate;

a gate dielectric located on a top surface or a bottom surface of the gate electrode;

an active layer comprising a layer of an oxide compound material of at least two atomic elements including a first element of tin and a second element selected from Ge, P, S, F, Ti, Cs, and Na and in contact with the gate dielectric, wherein the oxide compound material is doped with silicon atoms such that an atomic concentration of the silicon atoms increases within the oxide compound material with an increase in a vertical distance from the substrate; and a source electrode and a drain electrode contacting a respective portion of the active layer.

11. The semiconductor structure of claim 10, wherein the substrate comprises a material selected from an insulating material, a semiconductor material, and a metallic material.

12. The semiconductor structure of claim 10, wherein the oxide compound material has a compositional gradient in which an atomic concentration of oxygen atoms increases within the oxide compound material with the increase in the vertical distance from the substrate.

13. The semiconductor structure of claim 10, wherein the active layer further comprises a tin oxide layer contacting the oxide compound material.

14. A semiconductor structure including a first field effect transistor, the first field effect transistor comprising:

a vertical stack of a source electrode, a dielectric spacer plate, and a drain electrode;

an active layer comprising a layer of an oxide compound material of at least two atomic elements comprising a first element of tin, a second element, and a third element of silicon and located over a substrate, wherein the oxide compound material is doped with silicon atoms such that an atomic concentration of the silicon atoms increases within the oxide compound material with an increase in a distance from the dielectric spacer plate;

a gate dielectric located on the active layer; and a gate electrode located on the gate dielectric.

15. The semiconductor structure of claim 14, wherein the second element is selected from Ge, P, S, F, Ti, Cs, and Na.

16. The semiconductor structure of claim 15, wherein the second element is Ge.

17. The semiconductor structure of claim 16, wherein a germanium-to-silicon ratio increases within the oxide compound material with the vertical distance from the substrate.

18. The semiconductor structure of claim 14, wherein the active layer further comprises a tin oxide layer in contact with the layer of the oxide compound material.

19. The semiconductor structure of claim 14, wherein the layer of the oxide compound material has an average material composition of $Si_\beta Ge_{1-\beta} Sn_{1+\alpha} O_{3+\delta}$, in which $\beta$ is in a range from 0.001 to 0.9, and $\alpha$ is in a range from −0.5 to 0.5.

20. The semiconductor structure of claim 14, wherein the active layer contacts an entirety of a top surface of the drain electrode.

* * * * *